(12) United States Patent
Chai et al.

(10) Patent No.: US 11,424,288 B2
(45) Date of Patent: Aug. 23, 2022

(54) DISPLAY DEVICE HAVING IMPROVED ALIGNMENT

(71) Applicant: Samsung Display Co., Ltd., Yongin-si (KR)

(72) Inventors: Chong Chul Chai, Yongin-si (KR); Kyung Bae Kim, Yongin-si (KR); Mee Hye Jung, Yongin-si (KR); Jin Oh Kwag, Yongin-si (KR); Min Jae Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 55 days.

(21) Appl. No.: 16/784,935

(22) Filed: Feb. 7, 2020

(65) Prior Publication Data

US 2020/0258938 A1    Aug. 13, 2020

(30) Foreign Application Priority Data

Feb. 8, 2019    (KR) .................. 10-2019-0015172

(51) Int. Cl.
*G09G 3/32* (2016.01)
*H01L 33/62* (2010.01)
(Continued)

(52) U.S. Cl.
CPC .......... *H01L 27/156* (2013.01); *H01L 23/552* (2013.01); *H01L 27/1244* (2013.01); *H01L 27/1255* (2013.01); *H01L 28/60* (2013.01); *H01L 33/62* (2013.01); *G09G 3/32* (2013.01); *G09G 2300/0426* (2013.01);
(Continued)

(58) Field of Classification Search
CPC ............... G09G 2300/0809; G09G 2300/0439
See application file for complete search history.

(56) References Cited

U.S. PATENT DOCUMENTS 7,973,483 B2 *    7/2011    Shin ..................... G09G 3/3258
                                                        315/76
10,008,645 B2    6/2018    Bonar et al.
(Continued)

FOREIGN PATENT DOCUMENTS

| KR | 10-2016-0016266 A | 2/2016 |
| KR | 10-2017-0084139 A | 7/2017 |
| KR | 10-2017-0094930 A | 8/2017 |

*Primary Examiner* — Ismail A Muse
*Assistant Examiner* — Gustavo G Ramallo
(74) *Attorney, Agent, or Firm* — Lewis Roca Rothgerber Christie LLP

(57) ABSTRACT

A display device includes: a substrate including a pixel; a scan line for supplying a scan signal to the pixel; a data line for supplying a data signal to the pixel; a first power line for supplying a first driving power source to the pixel; a second power line for supplying a second driving power source to the pixel; and a third power line for supplying a ground voltage to the pixel. The pixel includes: first and second electrodes spaced apart from each other on the substrate; a plurality of light emitting elements, each of the light emitting elements having first and second end portions in a length direction thereof and being arranged between the first electrode and the second electrode; and a first switch electrically connected between the third power line and the first electrode. The first switch is configured to be turned on by a control signal.

19 Claims, 35 Drawing Sheets

(51) Int. Cl.
- *H01L 27/15* (2006.01)
- *H01L 27/12* (2006.01)
- *H01L 49/02* (2006.01)
- *H01L 23/552* (2006.01)
- *H01L 33/06* (2010.01)
- *H01L 33/00* (2010.01)
- *H01L 33/32* (2010.01)

(52) U.S. Cl.
CPC .. *G09G 2300/0809* (2013.01); *H01L 27/1259* (2013.01); *H01L 33/007* (2013.01); *H01L 33/06* (2013.01); *H01L 33/325* (2013.01)

(56) References Cited

U.S. PATENT DOCUMENTS

| | | | |
|---|---|---|---|
| 2014/0160179 A1* | 6/2014 | Ishii | G09G 3/3233 345/690 |
| 2020/0075667 A1* | 3/2020 | Lee | G09G 3/3233 |
| 2021/0288104 A1* | 9/2021 | Yang | H01L 33/405 |

* cited by examiner

DISPLAY DEVICE HAVING IMPROVED ALIGNMENT

CROSS-REFERENCE TO RELATED APPLICATION

This application claims priority to and the benefit of Korean Patent Application No. 10-2019-0015172, filed on Feb. 8, 2019 in the Korean Intellectual Property Office (KIPO), the entire disclosure of which is incorporated herein by reference.

BACKGROUND

1. Field

Aspects of embodiments of the present disclosure generally relate to a display device including a micro light emitting device.

2. Related Art

Light emitting diodes exhibit relatively satisfactory durability even in relatively poor environmental conditions and have excellent performance in terms of lifespan and luminance. Recently, studies for applying such light emitting diodes to various light emitting devices have been actively conducted.

As a part of such studies, a technique for fabricating a micro light emitting diode that is small to a degree of micro- or nano-scale (e.g., a micro- or nano-scale light emitting diode) by using an inorganic crystal structure, for example, a structure in which a nitride-based semiconductor is grown, has been studied. The light emitting diode may be manufactured with a size small enough to constitute a pixel of a display panel, etc. After a light emitting diode is separately (or independently) grown on a substrate, the grown light emitting diode is separated from the substrate to be used to manufacture a display panel, etc.

SUMMARY

Embodiments of the present disclosure provide a display device manufactured by a relatively simple process that omits a separation process of lines for aligning a light emitting device and improves reliability by reducing or minimizing a defect that may occur during the separation process.

According to an embodiment of the present disclosure, a display device includes: a substrate including a pixel; a scan line for supplying a scan signal to the pixel; a data line for supplying a data signal to the pixel; a first power line for supplying a first driving power source to the pixel; a second power line for supplying a second driving power source to the pixel; and a third power line for supplying a ground voltage to the pixel. The pixel includes: first and second electrodes spaced apart from each other on the substrate; a plurality of light emitting elements, each of the light emitting elements having first and second end portions in a length direction thereof and being arranged between the first electrode and the second electrode; and a first switch electrically connected between the third power line and the first electrode. The first switch is configured to be turned on by a control signal.

The pixel may further include first and second conductive lines on the same plane as the first and second electrodes. The first and second conductive lines may be spaced apart from each other. When viewed on a plane, the first conductive line and the second conductive line may be between the first electrode and the second electrode.

When the first switch is turned on, an AC voltage having a level different from that of the second driving power source may be applied to the second electrode.

The pixel may further include: a control signal line configured to have the control signal applied thereto; a second switch connected between the first conductive line and the third power line, the second switch configured to be turned on concurrently with the first switch by the control signal; and a third switch connected between the second conductive line and the second power line, the third switch configured to be turned on concurrently with the first switch by the control signal.

The first conductive line and the second conductive line may be floating electrodes.

The control signal line may be in the same layer as the scan line.

Each of the first, second, and third switches may include a thin film transistor.

Each of the first, second, and third switches may include: a gate electrode on the substrate, the gate electrode being integral with the control signal line; an active pattern overlapping one region of the gate electrode; and first and second terminals contacting both ends of the active pattern.

The pixel may further include a pixel circuit connected between the first power line and the first electrode or between the second power line and the second electrode, and the pixel circuit may include a driving transistor for driving the light emitting devices and a switching transistor connected between the data line and the driving transistor.

The driving transistor and the switching transistor may include a transistor having the same type as the first, second, and third switches.

When the first, second, and third switches are concurrently turned on, the ground voltage may be supplied to the first electrode and the AC voltage may be applied to the second electrode such that an electric field is formed between the first electrode and the second electrode.

When the first, second, and third switches are concurrently turned off, the first driving power source may be applied to the first electrode via the pixel circuit and the second driving power source may be applied to the second electrode.

The pixel circuit may further include: a first capacitor connected between a gate electrode of the driving transistor and the first power line; and a second capacitor connected between the first electrode and the second power line.

The first capacitor may include: a first lower electrode on the substrate; a first upper electrode on the first lower electrode; and an interlayer insulating layer interposed between the first lower electrode and the first upper electrode. The second capacitor may include: a second lower electrode in the same layer as the first lower electrode; a second upper electrode on the second lower electrode; and the interlayer insulating layer interposed between the second lower electrode and the second upper electrode. The first upper electrode and the second upper electrode may be in the same layer.

The first conductive line may be electrically connected to the first electrode through a first bridge pattern, and the second conductive line may be electrically connected to the second electrode through a second bridge pattern spaced apart from the first bridge pattern.

The first bridge pattern and the second bridge pattern may be in the same layer as the data line.

When the first switch is turned on, the ground voltage may be applied to each of the first conductive line and the first electrode and the AC voltage may be applied to each of the second conductive line and the second electrode such that an electric field is formed between the first electrode and the second electrode.

The pixel may further include: a first shielding electrode line between the first electrode and the interlayer insulating layer; a second shielding electrode line between the first conductive line and the interlayer insulating layer; and a third shielding electrode line between the second conductive line and the interlayer insulating layer.

The pixel may further include: a first contact electrode electrically connecting any one of the first and second end portions of each of the light emitting elements to the first electrode; and a second contact electrode electrically connecting the other of the first and second end portions of each of the light emitting elements to the second electrode.

According to an embodiment of the present disclosure, a display device includes: a substrate having a display area and a non-display area; and a pixel in the display area and connected to a scan line, a control signal line, and a data line. The pixel includes: a plurality of light emitting elements connected between a first electrode and a second electrode; a first transistor connected to the data line and the scan line and configured to be turned on by an ith (wherein i is a natural number of two or more) scan signal; a second transistor connected between a first node and the first electrode to control an amount of current flowing from a first driving power source of the first node to a second driving power source via the light emitting elements; a first capacitor connected between the first node and the first driving power source; and a first switch connected between a power line to which a ground voltage is to be applied and a second node configured to be turned on by an ith control signal.

The pixel may further include a second capacitor connected between the second node and the second driving power source.

The pixel may further include: a second switch connected between the second node and a second conductive line, the second switch configured to be turned on by the ith control signal; and a third switch connected between the second driving power source and a first conductive line, the third switch configured to be turned on by the ith control signal.

The light emitting elements may be respectively connected in parallel between the first electrode and the first conductive line, between the first conductive line and the second conductive line, and between the second conductive line and the second electrode.

The first electrode, the first and second conductive lines, and the second electrode may be sequentially connected in series via each of the light emitting elements.

The pixel may further include: a third transistor connected between the second transistor and the first node, the third transistor configured to be turned on by the ith scan signal; a fourth transistor connected between an initialization power line to which an initialization power source is to be applied and the first node, the fourth transistor configured to be turned on by an (i−1)th scan signal; a fifth transistor connected between the first node and the first driving power source, the fifth transistor configured to be turned off when an emission control signal is supplied to an emission control line; a sixth transistor connected between the first transistor and the second node, the sixth transistor configured to be turned off when the emission control signal is supplied; and a seventh transistor connected between the initialization power line and the second node.

According to an embodiment of the present disclosure, a display device includes: a substrate having a display area in which a pixel is arranged and a non-display area at a periphery of the display area; a first power line configured to supply a first driving power source to the pixel; a second power line configured to supply a second driving power source to the pixel; a third power line connected to the pixel, the third power line having a ground voltage applied thereto; a control signal line in the non-display area, the control signal line extending in one direction; and a switch connected to the first to third power lines in the non-display area, the switch configured to be turned on by a control signal of the control signal line. The pixel includes: first and second electrodes spaced apart from each other on the substrate; a plurality of light emitting elements, each of the light emitting elements having a first end portion and a second end portion in a length direction thereof, the plurality of the light emitting elements being arranged between the first electrode and the second electrode; and first and second conductive lines on the same plane as the first and second electrodes, the first and second conductive lines being spaced apart from each other. When the switch is turned on, the first electrode is connected to any one of the first and second conductive lines and the second electrode is connected the other of the first and second conductive lines.

BRIEF DESCRIPTION OF THE DRAWINGS

Example embodiments will now be described more fully hereinafter with reference to the accompanying drawings; however, the present disclosure may be embodied in different forms and should not be construed as being limited to the example embodiments set forth herein. Rather, these embodiments are provided so that this disclosure will be thorough and complete, and will fully convey the scope of the present disclosure to those skilled in the art.

In the figures, dimensions may be exaggerated for clarity of illustration. Like reference numerals refer to like elements throughout.

DETAILED DESCRIPTION

Figure 1A:
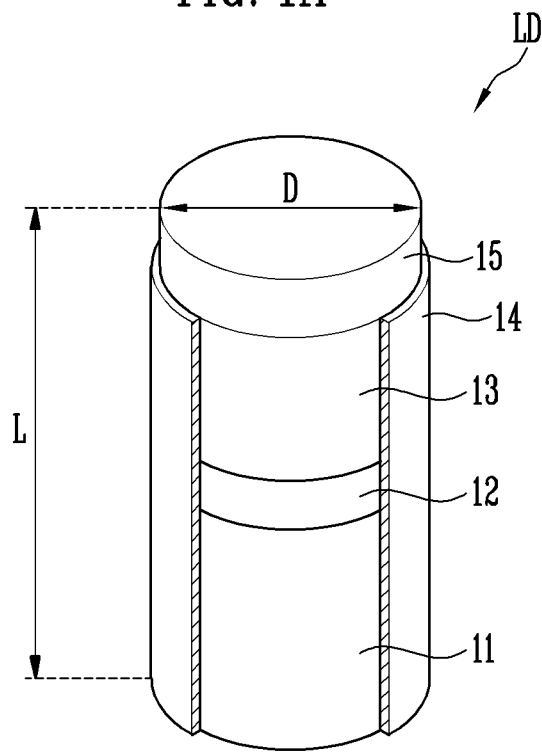
FIG. 1A is a perspective view schematically illustrating a light emitting element according to an embodiment of the present disclosure.

The present disclosure includes various changes and different shapes, in addition to those described herein in connection with the illustrated example embodiments. Thus, the present disclosure is not limited to certain shapes but may be applied to suitable equivalent material(s) and replacement(s).

It will be understood that when an element or layer is referred to as being "on," "connected to," or "coupled to" another element or layer, it may be directly on, connected, or coupled to the other element or layer or one or more intervening elements or layers may also be present. When an element or layer is referred to as being "directly on," "directly connected to," or "directly coupled to" another element or layer, there are no intervening elements or layers present. For example, when a first element is described as being "coupled" or "connected" to a second element, the first element may be directly coupled or connected to the second element or the first element may be indirectly coupled or connected to the second element via one or more intervening elements.

Like numbers refer to like elements throughout. It will be understood that, although the terms "first," "second," etc. may be used herein to describe various elements, these elements should not be limited by these terms. These terms are only used to distinguish one element from another element. Thus, a "first" element discussed below could also be termed a "second" element without departing from the present disclosure. As used herein, the singular form, such as "a" and "an," is intended to include the plural form as well, unless the context clearly indicates otherwise.

It will be further understood that the terms "includes," "including," "comprises," and/or "comprising," when used in this specification, specify the presence of stated features, integers, steps, operations, elements, and/or components but do not preclude the presence and/or addition of one or more other features, integers, steps, operations, elements, components, and/or groups thereof. Further, an expression that an element, such as a layer, region, substrate, or plate, is "on" or "above" another element indicates not only an embodiment in which the element is "directly on" or "just above" the other element but also an embodiment in which another element is interposed between the element and the other element. An expression that an element, such as a layer, region, substrate, or plate, is "beneath" or "below" another element indicates not only a case where the element is placed "directly beneath" or "just below" the other element but also a case where another element is interposed between the element and the other element.

The same reference numerals designate the same elements. As used herein, the term "and/or" includes any and all combinations of one or more of the associated listed items. Further, the use of "may" when describing embodiments of the present invention relates to "one or more embodiments of the present invention." Expressions, such as "at least one of," when preceding a list of elements, modify the entire list of elements and do not modify the individual elements of the list. Also, the term "exemplary" is intended to refer to an example or illustration. As used herein, the terms "use," "using," and "used" may be considered synonymous with the terms "utilize," "utilizing," and "utilized," respectively. As used herein, the terms "substantially," "about," and similar terms are used as terms of approximation and not as terms of degree, and are intended to account for the inherent variations in measured or calculated values that would be recognized by those of ordinary skill in the art.

Hereinafter, exemplary embodiments of the present disclosure will be described, in detail, with reference to the accompanying drawings.

Figure 1B:
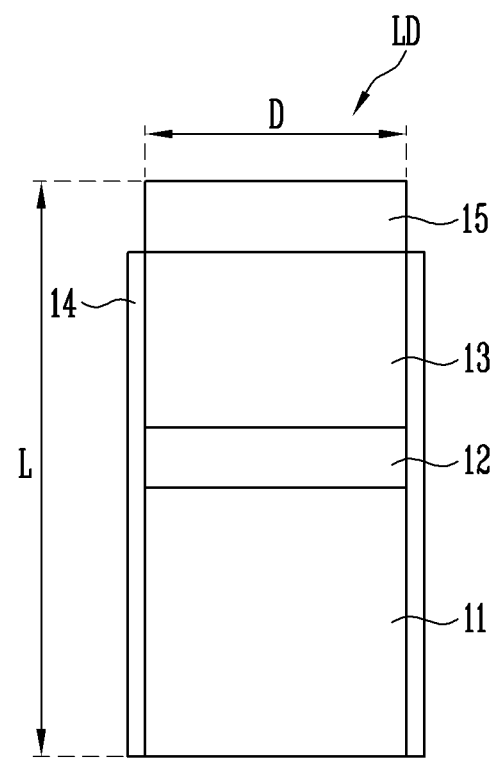
FIG. 1B is a sectional view of the light emitting element shown in FIG. 1A.
Figure 1C:
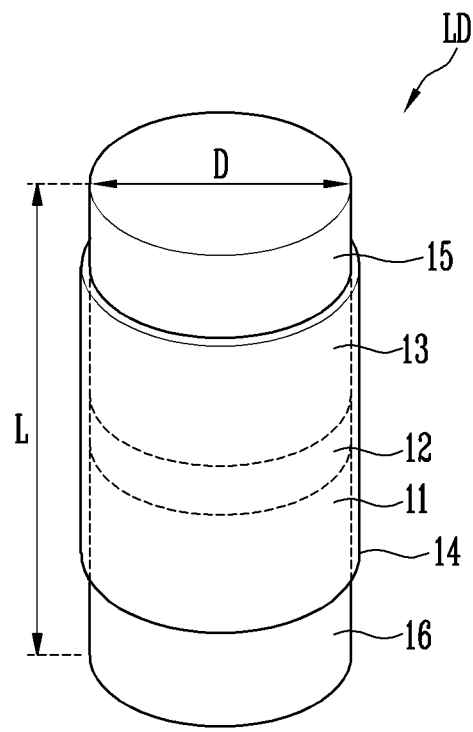
FIG. 1C is a perspective view schematically illustrating a light emitting element according to another embodiment of the present disclosure.
Figure 1D:
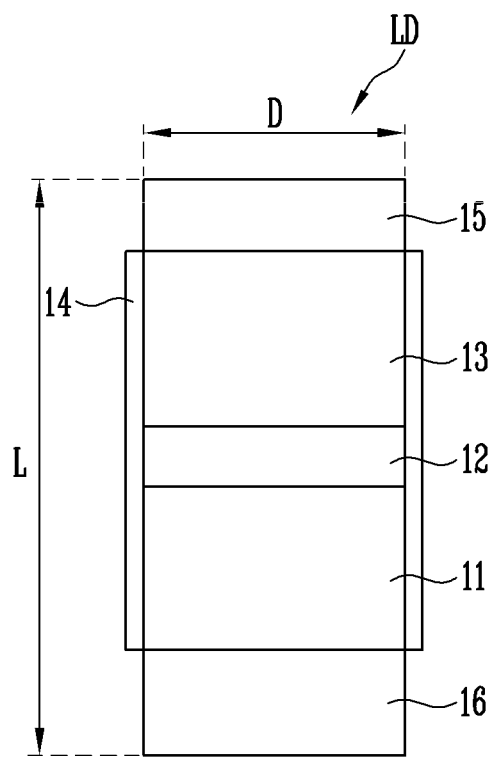
FIG. 1D is a sectional view of the light emitting element shown in FIG. 1C.

FIG. 1A is a perspective view schematically illustrating a light emitting element according to an embodiment of the present disclosure, and FIG. 1B is a sectional view of the light emitting element shown in FIG. 1A. FIG. 1C is a perspective view schematically illustrating a light emitting element according to another embodiment of the present disclosure, and FIG. 1D is a sectional view of the light emitting element shown in FIG. 1C.

In FIGS. 1A-1D, a cylindrical column-shaped light emitting element is illustrated for convenience of description, but the kind and/or shape of the light emitting element according to the present disclosure is not limited thereto.

Referring to FIGS. 1A-1D, each of the light emitting elements LD according to embodiments of the present disclosure may include a first semiconductor layer 11, a second semiconductor layer 13, and an active layer 12 provided between the first and second semiconductor layers 11 and 13. In an example, the light emitting element LD may have (e.g., may be implemented with) a stack structure in which the first semiconductor layer 11, the active layer 12, and the second semiconductor layer 13 are sequentially stacked.

According to an embodiment of the present disclosure, the light emitting element LD may have (e.g., may be provided in) a bar shape extending in one direction. When the extending direction of the light emitting element LD is a length direction, the light emitting element LD may have one end portion and the other end portion along the extending direction. Any one of (e.g., either of) the first and second semiconductor layers 11 and 13 may be disposed at the one end portion, and the other of the first and second semiconductor layers 11 and 13 may be disposed at the other end portion.

The light emitting element LD may have a cylindrical column shape, but the present disclosure is not limited thereto. The light emitting element LD may have a rod-like shape or bar-like shape, which is long in (e.g., which extends or primarily extends in) its length direction (e.g., has an aspect ratio greater than 1). For example, a length L of the light emitting element LD in the length direction may be larger than a diameter D (or a width of a cross-section) of the light emitting element LD. The light emitting element LD may include, for example, a light emitting diode manufactured small enough to have a micro- or nano-scale diameter D and/or a length L (e.g., a diameter D and/or a length L in a degree of micro- or nano-scale).

In an embodiment of the present disclosure, the diameter D of the light emitting element LD may be in a range of about 0.5 μm to 500 μm, and the length L of the light emitting element LD may be in a range of about 1 μm to 10 μm. However, the size of the light emitting element LD is not limited thereto, and the light emitting element LD may be modified to be suitable according to desires and/or requirements of a lighting device or self-luminescent display device to which the light emitting element LD is to be applied.

The first semiconductor layer 11 may include, for example, one or more n-type semiconductor layers. For example, the first semiconductor layer 11 may include a semiconductor material from among indium aluminum gallium (InAlGaN), gallium nitride (GaN), aluminum gallium nitride (AlGaN), indium gallium nitride (InGaN), aluminum nitride (AlN), and indium nitride (InN) and may include a semiconductor layer doped with a first conductive dopant, such as silicon (Si), germanium (Ge), or tin (Sn). However, the material(s) constituting the first semiconductor layer 11 is/are not limited thereto. In addition, various suitable materials may be included in the first semiconductor layer 11.

The active layer 12 is formed on the first semiconductor layer 11 and may be formed to have a single or multiple quantum well structure. In an embodiment, a clad layer doped with a conductive dopant may be formed on the top and/or the bottom of the active layer 12. In an example, the clad layer may be implemented as an aluminum gallium nitride (AlGaN) layer or indium aluminum gallium nitride (InAlGaN) layer. In some embodiments, a material, such as aluminum gallium nitride (AlGaN) or aluminum indium gallium nitride (AlInGaN) may be used to form the active layer 12. In addition, various suitable materials may be included in the active layer 12.

When an electric field having a reference voltage (e.g., a predetermined voltage) or greater is applied to both ends of the light emitting element LD, the light emitting element LD emits light as electron-hole pairs are combined in the active layer 12. The emission of the light emitting element LD is controlled by using such a principle so that the light emitting element LD may be used as a light source for various light emitting apparatuses, including as (or part of) a pixel of a display device.

The active layer 12 may include a first surface contacting an upper surface of the first semiconductor layer 11 and a second surface contacting a lower surface of the second semiconductor layer 13. The first surface and the second surface may face each other in the length direction L.

The second semiconductor layer 13 is formed on the second surface of the active layer 12 and may include a semiconductor layer having a type different from that of the first semiconductor layer 11. In an example, the second semiconductor layer 13 may include one or more p-type semiconductor layer(s). For example, the second semiconductor layer 13 may include one or more semiconductor materials from among InAlGaN, GaN, AlGaN, InGaN, AlN, and InN and may include a semiconductor layer doped with a second conductive dopant, such as magnesium (Mg). However, the material constituting the second semiconductor layer 13 is not limited thereto. In addition, various suitable materials may be included in the second semiconductor layer 13.

According to an embodiment of the present disclosure, the light emitting element LD may further include an electrode layer 15 disposed on the top of the second semiconductor layer 13 as shown in FIGS. 1A and 1B, in addition to the first semiconductor layer 11, the active layer 12, and the second semiconductor layer 13, which are described above. In addition, in some embodiments, the light emitting element LD may further include another electrode layer (e.g., a second electrode layer) 16 disposed at one end of the first semiconductor layer 11 as shown in FIGS. 1C and 1D in addition to the electrode layer (e.g., the first electrode layer) 15.

The electrode layers 15 and 16 may be ohmic contact electrodes, but the present disclosure is not limited thereto. The electrode layers 15 and 16 may include a metal or metal oxide. For example, the electrode layers 15 and 16 may include one or more of chromium (Cr), titanium (Ti), aluminum (Al), gold (Au), nickel (Ni), indium tin oxide (ITO), and an oxide or alloy thereof, but the present disclosure is not limited thereto.

Materials included in the respective electrode layers 15 and 16 may be identical to or different from each other. The electrode layers 15 and 16 may be substantially transparent or translucent. Accordingly, light generated from the light emitting element LD may be emitted to the outside of the light emitting element LD by transmitting through the electrode layers 15 and 16.

In an embodiment of the present disclosure, the light emitting element LD may further include an insulative film 14. However, in some embodiments, the insulative film 14 may be omitted or may be provided to cover only portions of the first semiconductor layer 11, the active layer 12, and the second semiconductor layer 13.

The insulative film 14 may prevent or reduce the risk of an electrical short circuit that may occur when the active layer 12 contacts a conductive material of the first semiconductor layer 11 and the second semiconductor layer 13. In addition, the insulative film 14 is formed so that a surface defect of the light emitting element LD is reduced or minimized, thereby improving the lifespan and efficiency of the light emitting element LD. In addition, when a plurality of light emitting elements LD are densely disposed, the insulative film 14 may prevent or reduce the risk of an unwanted short circuit that may occur between the light emitting elements LD. Whether or not the insulative film 14 is provided is not limited as long as the active layer 12 may be prevented from short circuiting with an external conductive material.

The insulative film 14 may be provided at a portion other than one or both of the end portions of the light emitting element LD as shown in FIGS. 1A and 1B. The insulative film 14 may expose only the electrode layer 15 disposed at one end of the second semiconductor layer 13 of the light emitting element LD and may entirely surround (e.g. may entirely surround a periphery of) the other components of the light emitting element LD except the electrode layer 15. The insulative film 14 may expose at least both of the end portions of the light emitting element LD. In an example, the insulative film 14 may expose one end portion of the first semiconductor layer 11 in addition to the electrode layer 15 disposed at the one end of the second semiconductor layer 13.

In some embodiments, when the electrode layers 15 and 16 are disposed at both of the end portions of the light emitting element LD as shown in FIGS. 1C and 1D, the insulative film 14 may expose at least a region of each of the electrode layers 15 and 16. In another embodiment, the insulative film 14 may be omitted.

According to an embodiment of the present disclosure, the insulative film 14 may include a transparent insulating material. For example, the insulative film 14 may include one or more insulating material(s) selected from the group consisting of silicon oxide (e.g., $SiO_2$), silicon nitride (e.g., $Si_3N_4$), aluminum oxide (e.g., $Al_2O_3$), and titanium oxide (e.g., $TiO_2$). However, the present disclosure is not limited thereto, and various suitable materials having insulating properties may be included in the insulative film 14.

When the insulative film 14 is provided in the light emitting element LD, the active layer 12 may not short circuit with a first electrode and/or with a second electrode. In addition, the insulative film 14 is formed so that a surface defect of the light emitting element LD is reduced or minimized, thereby improving the lifespan and efficiency of the light emitting element LD. In addition, when a plurality of light emitting elements LD are densely disposed, the insulative film 14 may prevent or reduce the risk of an unwanted short circuit that may occur between the light emitting elements LD.

The above-described light emitting element LD may be used as a light emitting source for various display devices. The light emitting elements LD may be manufactured through a surface treatment process. For example, when a plurality of light emitting elements LD is mixed in a liquid solution (or solvent) to be supplied to each light emitting area (e.g., a light emitting area of each sub-pixel), each light emitting element LD may be surface-treated such that the light emitting elements LD are not unequally condensed (or dispersed) in the solution but are equally or substantially equally dispersed in the solution.

A light emitting apparatus including the above-described light emitting element LD may be used in various suitable types of devices that employ a light source, including a display device. When a plurality of light emitting elements LD are disposed in a light emitting area of each sub-pixel of a display panel, the light emitting elements LD may be used as a light source of each sub-pixel. However, the application field of the light emitting element LD is not limited to the above-described example. For example, the light emitting element LD may be used in other suitable types of devices that employ a light source, such as a lighting device.

Figure 2:
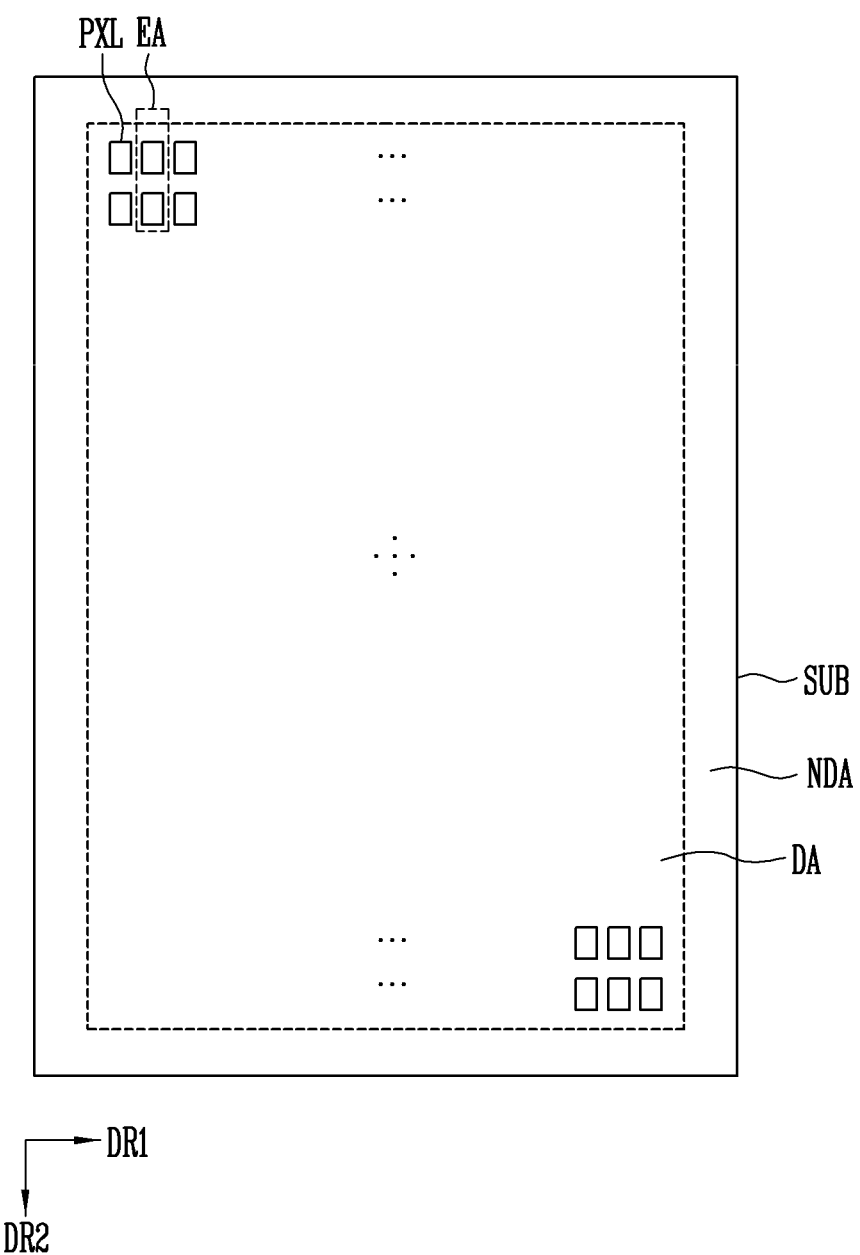
FIG. 2 is a schematic plan view of a display device according to an embodiment of the present disclosure using the light emitting element shown in FIG. 1A as a light emitting source.

FIG. 2 illustrates a schematic plan view of a display device according to an embodiment of the present disclosure that uses the light emitting element shown in FIG. 1A as a light emitting source.

In FIG. 2, for convenience of illustration, a structure of the display device is briefly illustrated based on a display area at where an image is displayed. However, in some embodiments, a driving circuit (e.g., a scan driver and a data driver) and/or a plurality of signal lines may be further disposed in the display device.

Referring to FIGS. 1A and 2, the display device according to an embodiment of the present disclosure may include a substrate SUB, a plurality of pixels PXL provided on the substrate SUB and include one or more light emitting element(s) LD, a driving unit (e.g., a driver) provided on the substrate SUB and that is configured to drive the pixels PXL, and a line unit connecting the pixels PXL and the driving unit to each other.

The display device may be either a passive matrix type display device or an active matrix type display device according to a driving scheme of the light emitting elements LD. In an example, when the display device is the active matrix type display device, each of the pixels PXL may include a driving transistor for controlling an amount of current supplied to the light emitting element LD, a switching transistor for transferring a data signal to the driving transistor, and the like.

Recently, the active matrix type display device in which light is selectively emitted for each pixel PXL has become mainstream from the viewpoint of resolution, contrast, and operation speed. However, the present disclosure is not limited thereto, and the passive matrix type display device in which light is emitted for each group of pixels PXL may use components (e.g., first and second electrodes and the like) for driving the light emitting element LD.

The substrate SUB may include a display area DA and a non-display area NDA.

In some embodiments, the display area DA may be disposed at a central area of the display device, and the non-display area NDA may be disposed at an edge area of the display device to surround (e.g., to surround a periphery of) the display area DA. However, the positions of the display area DA and the non-display area NDA are not limited thereto and may be suitably modified.

The display area DA may be an area at where the pixels PXL for displaying an image are provided. The non-display area NDA may be an area at where the driving unit for driving the pixels PXL and a portion of the line unit that connects the pixels PXL and the driving unit to each other are provided.

The display area DA may have various suitable shapes. For example, the display area DA may have a closed polygon shape, such as a circle, an ellipse, etc., including curved sides, or a semicircle, a semi-ellipse, etc., including linear and curved sides.

The non-display area NDA may be provided at at least one side of the display area DA. In an embodiment of the present disclosure, the non-display area NDA may surround the circumference of the display area DA.

The substrate SUB may include a transparent insulating material such that light may be transmitted therethrough. The substrate SUB may be a rigid substrate. For example, the substrate SUB may be a glass substrate, a quartz substrate, a glass ceramic substrate, and/or a crystalline glass substrate.

In some embodiments, the substrate SUB may be a flexible substrate. In such an embodiment, the substrate SUB may be a film substrate and/or a plastic substrate, which includes a polymer organic material. For example, the substrate SUB may include one or more of polystyrene, polyvinyl alcohol, poly methyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and/or cellulose acetate propionate. However, the material constituting the substrate SUB may be variously, suitably changed, and the substrate SUB may include a fiber reinforced plastic (FRP), etc.

One area on the substrate SUB may be the display area DA with the pixels PXL disposed therein, and the other area on the substrate SUB may be the non-display area NDA. In an example, the substrate SUB may include the display area DA including pixel areas in which the respective pixels PXL are disposed and the non-display area NDA disposed at the periphery of the display area DA.

Each of the pixels PXL may be provided in the display area DA. In an embodiment of the present disclosure, the pixels PXL may be arranged in the display area DA in a stripe or pentile arrangement structure, but the present disclosure is not limited thereto. For example, the pixels PXL may be arranged in the display area DA in various suitable arrangement structures currently known in the art.

Each pixel PXL may include a light emitting element LD driven by a corresponding scan signal and a corresponding data signal. The light emitting element LD may have a size small on a micro- or nano-scale and may be connected in parallel to light emitting devices disposed adjacent thereto. However, the present disclosure is not limited thereto. The light emitting element LD may be configured as a light source of each pixel PXL.

Each pixel PXL may include one or more light source(s) driven by a control signal (e.g., a predetermined control signal, a scan signal, and/or a data signal) and/or a power source (e.g., a predetermined power source, a first driving power source, and/or a second driving power source). For example, each pixel PXL may include the light emitting element LD according to the embodiment shown in FIG. 1A, for example, one or more micro bar type light emitting element(s) LD having a size small on a micro- or nano-scale. However, the kind of light emitting element LD that may be used as the light source of the pixel PXL is not limited thereto. For example, in another embodiment, each pixel PXL may include a light emitting device having a core-shell structure, which is manufactured by using a growth technique. In an embodiment, the light emitting device having the core-shell structure may be a micro light emitting device having the core-shell structure, which has a size small on a micro- or nano-scale, but the size of the light emitting device having the core-shell structure is not limited thereto.

In an embodiment of the present disclosure, the color, kind, and/or number of the pixels PXL are not particularly limited. In an example, the color of light emitted by each pixel PXL may be variously, suitably modified.

The driving unit provides a signal to each pixel PXL through the line unit, and accordingly, the driving of the pixel PXL can be controlled.

The driving unit may include a scan driver for providing a scan signal to the pixels PXL through scan lines, an emission driver for providing an emission control signal to the pixels PXL through emission control lines, a data driver for providing a data signal to the pixels PXL through data lines, and a timing controller. The timing controller may control the scan driver, the emission driver, and the data driver.

FIGS. 3A-3D are circuit diagrams illustrating electrical connection relationships between components included in one pixel from among the pixels shown in FIG. 2 according to various embodiments of the present disclosure.

For example, FIGS. 3A-3D illustrate electrical connection relationships between components included in the pixel PXL applicable to an active display device according to different embodiments of the present disclosure. However, the kinds of the components included in the pixel PXL to which embodiments of the present disclosure are applicable are not limited thereto.

In FIGS. 3A-3D, the pixel PXL comprehensively includes not only components included in each of the pixels shown in FIG. 2 but also an area in which the components are provided. In some embodiments, each of pixels PXL shown in FIGS. 3A-3D may be any one of the pixels PXL provided in the display device shown in FIG. 2, and the pixels PXL may have structures that are identical or substantially similar to one another.

Referring to FIGS. 1A, 2, 3A, 3B, 3C, and 3D, one pixel PXL (hereinafter, referred to as a "pixel") may include a light emitting unit EMU that generates light with a luminance corresponding to a data signal. Also, the pixel PXL may selectively further include a pixel circuit 144 for driving the light emitting unit EMU.

In some embodiments, the light emitting unit EMU may include a plurality of light emitting elements LD connected in parallel between a first power line PL1 to which a first driving power source VDD is applied and a second power line PL2 to which a second driving power source VSS is applied. For example, the light emitting unit EMU may include a first electrode EL1 (also referred to as a "first alignment electrode") connected to the first driving power source VDD via the pixel circuit 144 and the first power line PL1, a second electrode EL2 (also, referred to as a "second alignment electrode") connected to the second driving power source VSS through the second power line PL2, and a plurality of light emitting elements LD connected in parallel in the same direction between the first and second electrodes EL1 and EL2. In an embodiment of the present disclosure, the first electrode EL1 may be an anode electrode, and the second electrode EL2 may be a cathode electrode.

In an embodiment of the present disclosure, the light emitting unit EMU may include first and second conductive lines CL1 and CL2. Any one of the first conductive line CL1 and the second conductive line CL2 may be an anode electrode, and the other of the first conductive line CL1 and the second conductive line CL2 may be a cathode electrode. In an embodiment of the present disclosure, the second conductive line CL2 may be the anode electrode, and the first conductive line CL1 may be the cathode electrode. The light emitting unit EMU may include light emitting elements LD connected in parallel between the first electrode EL1 and the first conductive line CL1, light emitting elements LD connected in parallel between the first conductive line CL1 and the second conductive line CL2, and light emitting elements LD connected in parallel between the second conductive line CL2 and the second electrode EL2.

In an embodiment of the present disclosure, each of the light emitting elements LD included in the light emitting unit EMU may have one end portion connected to the first driving power source VDD through the first electrode EL1 and the other end portion connected to the second driving power source VSS through the second electrode EL2.

As described above, the light emitting elements LD connected in parallel in the same direction between the first electrode EL1 and the first conductive line CL1, between the first conductive line CL1 and the second conductive line CL2, and between the second conductive line CL2 and the second electrode EL2, to which difference voltages are supplied, may form effective light sources, respectively. The effective light sources may constitute the light emitting unit EMU of the pixel PXL.

In some embodiments, the first driving power source VDD and the second driving power source VSS may have different potentials. In an example, the first driving power source VDD may be set as a high-potential power source, and the second driving power source VSS may be set as a low-potential power source. The potential difference between the first and second driving power sources VDD and VSS may be set to a threshold voltage or more of the light emitting elements LD during an emission period of the pixel PXL.

The light emitting elements LD of the light emitting unit EMU may emit light with a luminance corresponding to a driving current supplied through a corresponding pixel circuit 144. For example, the pixel circuit 144 may supply, to the light emitting unit EMU, a driving current corresponding to a grayscale value of corresponding frame data during each frame period. The driving current supplied to the light emitting unit EMU may be divided to flow through the light emitting elements LD connected in the same direction. Accordingly, the light emitting unit EMU can emit light with a luminance corresponding to the driving current while each light emitting element LD emits light with a luminance corresponding to a current flowing therethrough.

Although an embodiment in which the light emitting elements LD are connected in the same direction (e.g., a forward direction) between the first and second driving power sources VDD and VSS is illustrated in FIGS. 3A-3D, the present disclosure is not limited thereto. In some embodiments, the light emitting unit EMU may further include one or more ineffective light source(s) in addition to the light emitting elements LD forming the respective effective light sources. In an example, a reverse light emitting element may be further connected between the first and second electrodes EL1 and EL2. The reverse light emitting device is connected in parallel together with the light emitting elements LD forming the effective light sources between the first and second electrodes EL1 and EL2 and may be connected between the first and second electrodes EL1 and EL2 in a direction opposite to that in which the light emitting elements LD are connected. Although a driving voltage (e.g., a forward driving voltage) is applied between the first and second electrodes EL1 and EL2, the reverse light emitting element remains in an inactive state, and accordingly, substantially no current flows through the reverse light emitting device.

The pixel circuit 144 may be connected to a scan line Si and a data line Dj of a corresponding pixel PXL. In an example, when assuming that a pixel PXL is disposed on an ith (i is a natural number) row and a jth (j is a natural number) column of the display area DA, the pixel circuit 144 of the pixel PXL may be connected to an ith scan line Si and a jth data line Dj of the display area DA. In some embodiments, the pixel circuit 144 may include first and second transistors T1 and T2 and first and second capacitors C1 and C2 as shown in, for example, FIGS. 3A and 3B. However, the structure of the pixel circuit 144 is not limited to the embodiments shown in FIGS. 3A and 3B.

A first terminal of the first transistor (e.g., a switching transistor) T1 may be connected to the data line Dj, and a second terminal of the first transistor T1 may be connected to a first node N1. The first and second terminals of the first transistor T1 are different terminals. For example, when the first terminal is a source electrode, the second terminal may be a drain electrode. In addition, a gate electrode of the first transistor T1 may be connected to the scan line Si.

The first transistor T1 may be turned on when a scan signal having a voltage (e.g., a low voltage) at which the first transistor T1 can be turned on to electrically connect the data line Dj and the first node N1 to each other. A data signal of a corresponding frame is supplied to the data line Dj. Accordingly, the data signal is transferred to the first node N1. The data signal transferred to the first node N1 is charged in the first capacitor C1.

A first terminal of the second transistor (e.g., a driving transistor) T2 may be connected to the first driving power source VDD, and a second terminal of the second transistor T2 may be electrically connected to a first electrode of each of the light emitting elements LD. In addition, a gate electrode of the second transistor T2 may be connected to the first node N1. The second transistor T2 controls an amount of driving current supplied to the light emitting elements LD, corresponding to a voltage of the first node N1.

One electrode of the first capacitor C1 may be connected to the first driving power source VDD, and the other electrode of the first capacitor C1 may be connected to the first node N1. The first capacitor C1 charges a voltage corresponding to the data signal supplied to the first node N1 and maintains the charged voltage until a data signal of a next frame is supplied.

One electrode of the second capacitor C2 may be connected to a second node N2, and the other electrode of the second capacitor C2 may be connected to the second power line PL2 to which the second driving power source VDD is applied. Thus, the second capacitor C2 may decrease coupling of the light emitting elements LD of the light emitting unit EMU.

Figure 3A:
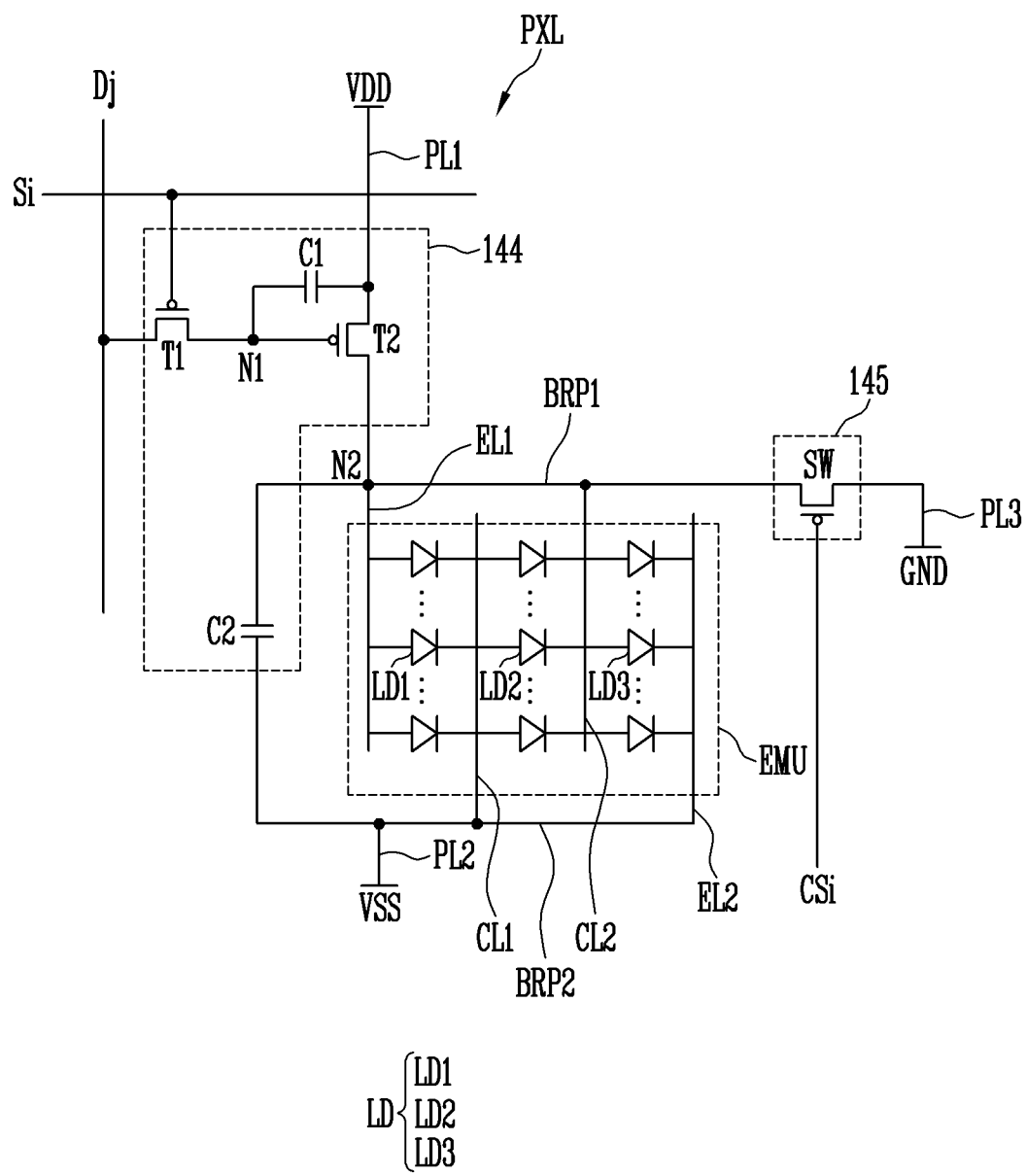
FIGS. 3A-3D are circuit diagrams illustrating electrical connection relationships between components included in one pixel from among the pixels shown in FIG. 2 according to various embodiments of the present disclosure.
Figure 3B:
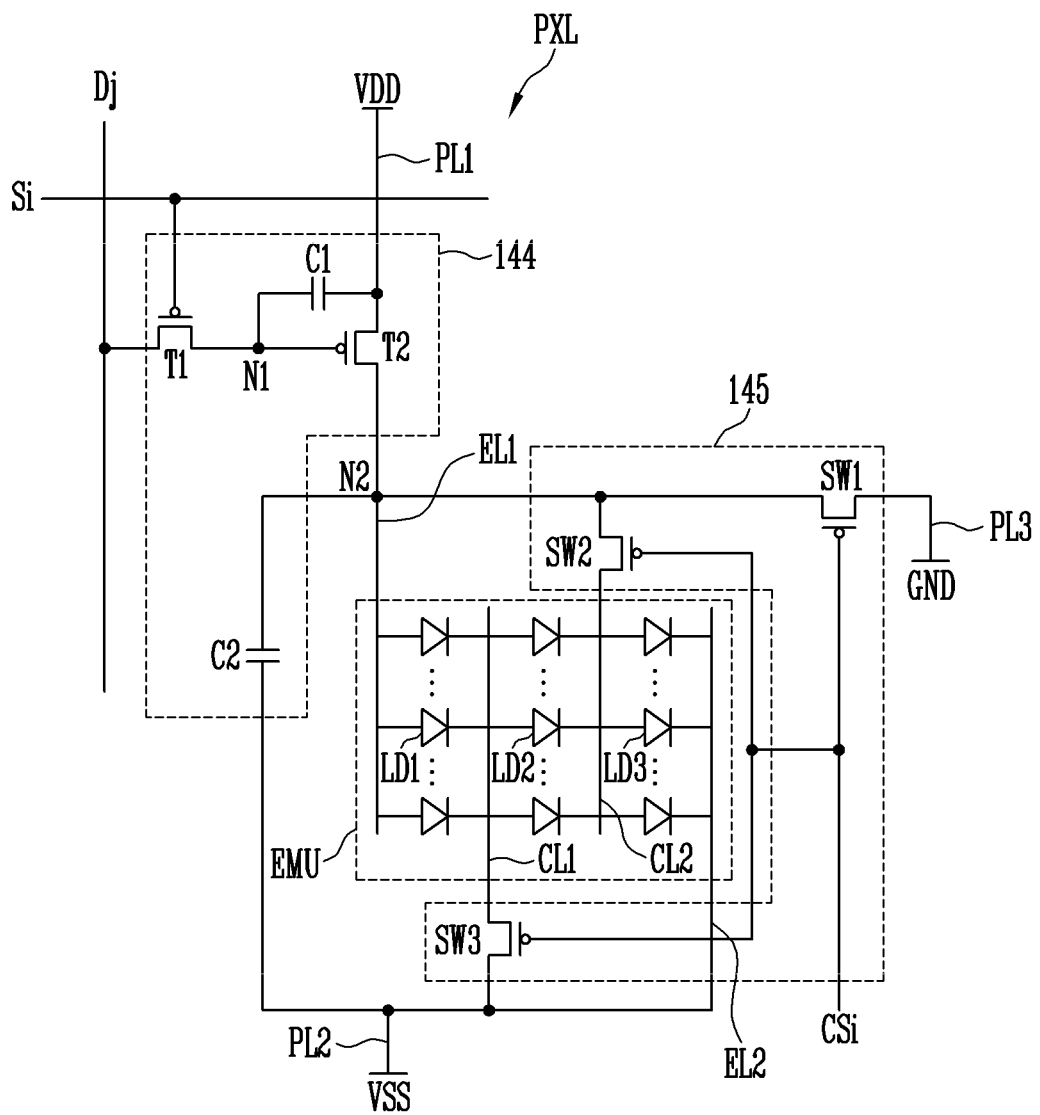

In FIGS. 3A and 3B, the pixel circuit 144 is illustrated as including the first transistor T1 for transferring a data signal to the inside of the pixel PXL, the first capacitor C1 for storing the data signal, the second transistor T2 for supplying a driving current corresponding to the data signal to the light emitting elements LD, and the second capacitor C2 for decreasing the coupling of the light emitting elements LD.

However, the present disclosure is not limited thereto, and the structure of the pixel circuit 144 may be variously, suitably modified and embodied. In an example, the pixel circuit 144 may further include one or more transistor element(s), such as a transistor element for compensating for a threshold voltage of the second transistor T2, a transistor element for initializing the first node N1, and/or a transistor element for controlling an emission time of the light emitting devices, or other suitable circuit elements, such as a boosting capacitor for boosting the voltage of the first node N1.

In addition, although an embodiment in which all of the transistors (e.g., the first and second transistors T1 and T2) included in the pixel circuit 144 are implemented as P-type transistors is illustrated in FIGS. 3A and 3B, the present disclosure is not limited thereto. For example, at least one of the first and second transistors T1 and T2 included in the pixel circuit 144 may be implemented as an N-type transistor.

The configuration of the pixel circuit 144 is not limited to the embodiments shown in FIGS. 3A and 3B. For example, the pixel circuit 144 may be configured according to the embodiments shown in FIGS. 3C and 3D.

Figure 3C:
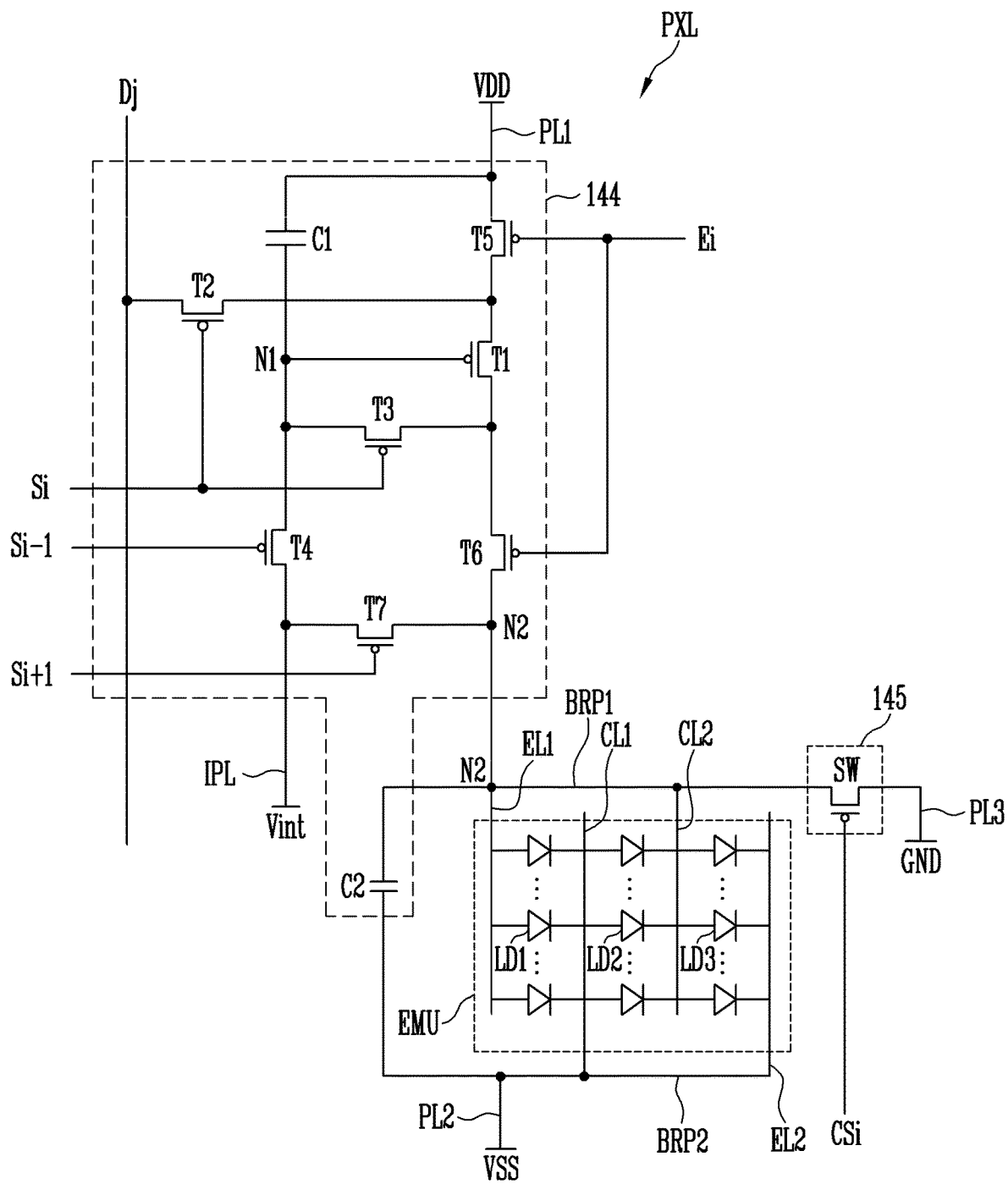
Figure 3D:
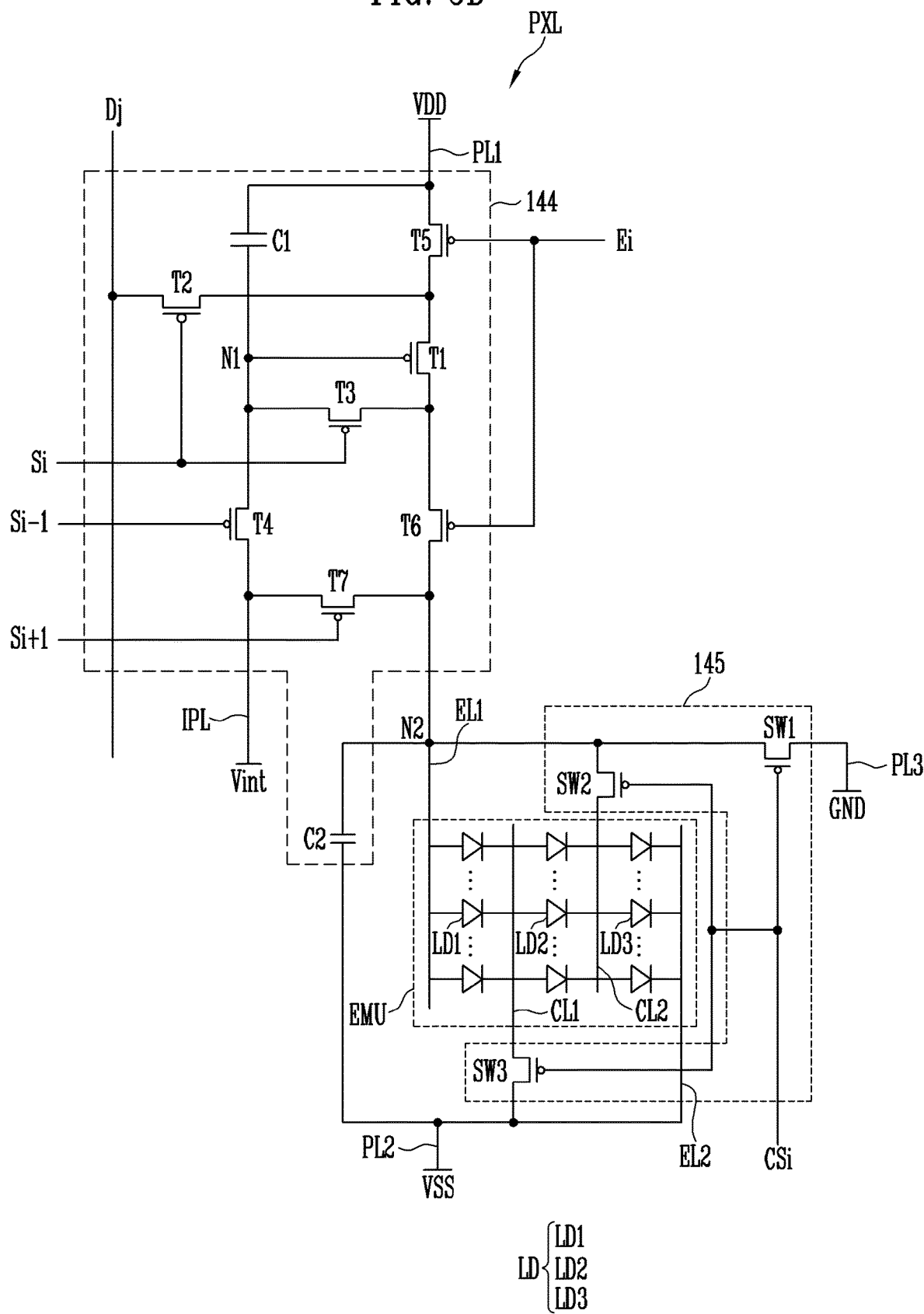

As shown in FIGS. 3C and 3D, the pixel circuit 144 may be connected to the scan line Si and the data line Dj of the pixel PXL. In an example, when assuming that a pixel PXL is disposed on an ith row and a jth column of the display area DA, the pixel circuit 144 of the corresponding pixel PXL may be connected to an ith scan line Si and a jth data line Dj of the display area DA.

In some embodiments, the pixel circuit 144 may be further connected to one or more other scan line(s). For example, a pixel PXL disposed on the ith row of the display area DA may be further connected to an $(i-1)^{th}$ scan line Si−1 and/or an $(i+1)^{th}$ scan line Si+1. Also, in some embodiments, the pixel circuit 144 may be further connected to a third power source in addition to the first and second driving power sources VDD and VSS. For example, the pixel circuit 144 may also be connected to an initialization power source Vint.

The pixel circuit 144 may include first to seventh transistor T1-T7 and first and second capacitors C1 and C2.

One electrode (e.g., a source electrode) of the first transistor (e.g., the driving transistor) T1 may be connected to the first driving power source VDD via the fifth transistor T5, and another electrode (e.g., a drain electrode) of the first transistor T1 may be connected to one end portion of light emitting elements LD via the sixth transistor T6. In addition, a gate electrode of the first transistor T1 may be connected to the first node N1. The first transistor T1 is configured to control an amount of driving current flowing between the first driving power source VDD and the second driving power source VSS via the light emitting elements LD, corresponding to a voltage of the first node N1.

The second transistor (e.g., the switching transistor) T2 may be connected between the jth data line Dj connected to the pixel PXL and the source electrode of the first transistor T1. In addition, a gate electrode of the second transistor T2 may be connected to the ith scan line Si connected to a first sub-pixel SP1. The second transistor T2 may be turned on when a scan signal having a gate-on voltage (e.g., a low voltage) is supplied to the ith scan line Si to electrically connect the jth data line Dj to the source electrode of the first transistor T1. Therefore, when the second transistor T2 is turned on, a data signal supplied from the jth data line Dj is transferred to the first transistor T1.

The third transistor T3 may be connected between the drain electrode of the first transistor T1 and the first node N1. In addition, a gate electrode of the third transistor T3 may be connected to the ith scan line Si. The third transistor T3 may be turned on when the scan signal having the gate-on voltage is supplied from the ith scan line Si to electrically connect the drain electrode of the first transistor T1 and the first node N1 to each other.

The fourth transistor T4 may be connected between the first node N1 and an initialization power line IPL to which the initialization power source Vint is applied. In addition, a gate electrode of the fourth transistor T4 may be connected to a previous scan line, for example, the $(i-1)^{th}$ scan line Si−1. The fourth transistor T4 may be turned on when the scan signal having the gate-on voltage is supplied to the $(i-1)^{th}$ scan line Si−1 to transfer the voltage of the initialization power source Vint to the first node N1. The initialization power source Vint may have a voltage equal to or smaller than the lowest voltage of the data signal.

The fifth transistor T5 may be connected between the first driving power source VDD and the first transistor T1. In addition, a gate electrode of the fifth transistor T5 may be connected to a corresponding emission control line, for example, an ith emission control line Ei. The fifth transistor T5 may be turned off when an emission control signal having a gate-off voltage is supplied to the ith emission control line Ei and may be turned on otherwise.

The sixth transistor T6 may be connected between the first transistor T1 and the one end portion of the light emitting elements LD. In addition, a gate electrode of the sixth transistor T6 may be connected to the ith emission control line Ei. The sixth transistor T6 may be turned off when the emission control signal having the gate-off voltage is supplied to the ith emission control line Ei and may be turned on otherwise.

The seventh transistor T7 may be connected between the one end portion of the light emitting elements LD and the initialization power line IPL. In addition, a gate electrode of the seventh transistor T7 may be connected to any one of the scan lines of a next stage (e.g., the $(i+1)^{th}$ scan line Si+1). The seventh transistor T7 may be turned on when the scan signal having the gate-on voltage is supplied to the $(i+1)^{th}$ scan line Si+1 to supply the voltage of the initialization power source Vint to the one end portion of the light emitting elements LD.

The first capacitor C1 may be connected between the first driving power source VDD and the first node N1. The first capacitor C1 may store a voltage corresponding to a data signal supplied to the first node N1 in each frame period and a threshold voltage of the first transistor T1.

The second capacitor C2 may be connected between a second node N2 and the second power line PL2. The second capacitor C2 may decrease coupling of the light emitting elements LD of the light emitting unit EMU.

In an embodiment of the present disclosure, the pixel PXL may further include an alignment unit 145 connected between a third power line PL3 to which a ground voltage GND is applied and the second node N2. Although, as shown in FIGS. 3A to 3D, the alignment unit 145 is a component provided independently from the pixel circuit 144, in other embodiments the alignment unit 145 may be a component substantially included in the pixel circuit 144.

As shown in FIGS. 3A and 3C, the alignment unit 145 may include one or more switch(es) SW and a control signal line CSi for controlling turn-on/off of the switch SW.

In an embodiment of the present disclosure, the switch SW may be a transistor. The switch SW may include a gate electrode connected to the control signal line CSi, a first terminal connected to the third power line PL3, and a second terminal connected to the second node N2. The switch SW is turned on when a control signal having a voltage (e.g., a low voltage) at which the switch SW can be turned on is supplied from the control signal line CSi to electrically connect the third power line PL3 and the second node N2 to each other. The ground voltage GND applied to the third power line PL3 may be supplied to the second conductive line CL2 and the first electrode EL1, which are connected to the second node N2.

When the switch SW included in the alignment unit 145 is turned on, an alignment voltage (e.g., an AC voltage) may be applied to the second power line PL2. The alignment voltage applied to the second power line PL2 may be transferred to the second electrode EL2 and the first conductive line CL1. When the switch SW is turned on, the ground voltage GND may be applied to each of the first electrode EL1 and the second conductive line CL2, and the alignment voltage may be applied to each of the second electrode EL2 and the first conductive line CL1.

An electric field caused by a potential difference between the first electrode EL1 and the first conductive line CL1 may be formed due to the ground voltage GND applied to the first electrode EL1 and the alignment voltage applied to the first conductive line CL1. In addition, an electric field caused by a potential difference between the first conductive line CL1 and the second conductive line CL2 may be formed due to the alignment voltage applied to the first conductive line CL1 and the ground voltage GND applied to the second conductive line CL2. In addition, an electric field caused by a potential difference between the second conductive line CL2 and the second electrode EL2 may be formed due to the ground voltage GND applied to the second conductive line CL2 and the alignment voltage applied to the second electrode EL2.

In an embodiment of the present disclosure, the switch SW included in the alignment unit 145 may be turned on after a liquid solution in which light emitting elements LD are mixed is sprayed and/or applied into a corresponding pixel PXL to induce alignment of the light emitting elements LD by forming an electric field in the corresponding pixel PXL. After the alignment of the light emitting elements LD in the corresponding pixel PXL is completed, the switch SW included in the alignment unit 145 may be turned off.

When the switch SW is turned on, electric fields are respectively formed between the first electrode EL1 and the first conductive line CL1, between the first conductive line CL1 and the second conductive line CL2, and between the second conductive line CL2 and the second electrode EL2. Therefore, the light emitting elements LD may be aligned in the corresponding pixel PXL by the electric fields.

When the alignment of the light emitting elements LD in the pixel PXL is completed, a control signal having a voltage (e.g., a high voltage) at which the switch SW can be turned off is supplied to the switch SW from the control signal line CSi to turn off the switch SW. When the switch SW is turned off, the second node N2 and the third power line PL3 may be electrically separated from each other. After the switch SW is turned off, the voltage of the second power source VSS is applied to the second power line PL2.

The configuration of the alignment unit 145 is not limited to the embodiments shown in FIGS. 3A and 3C. For example, the alignment unit 145 may be configured according to the embodiments shown in FIGS. 3B and 3D.

Referring to FIGS. 3B and 3D, the alignment unit 145 may include first to third switches SW1-SW3 and a control signal line CSi for controlling turn-on/off of each of the first to third switches SW1-SW3.

When the alignment unit 145 includes the first to third switches SW1-SW3, each of the first and second conductive lines CL1 and CL2 of the light emitting unit EMU may be connected to any one of the switch from among the first to third switches SW1-SW3.

In an embodiment of the present disclosure, the first to third switches SW1-SW3 may be implemented with a transistor having the same type as the transistors included in the pixel circuit 144. Also, the first to third switches SW1-SW3 may be implemented with the same type of transistor to be turned on/off (e.g., to be concurrently or simultaneously turned on/off) by one control signal.

The first switch SW1 may be connected between the third power line PL3 and the second node N2. The first switch SW1 may be turned on when a control signal having a voltage (e.g., a low voltage) at which the first switch SW1 can be turned on is supplied from the control signal line CSi to electrically connect the third power line PL3 and the second node N2 to each other. The ground voltage GND applied to the third power line PL3 may be supplied to the first electrode EL1 connected to the second node N2.

The second switch SW2 may be connected between the second node N2 and the second conductive line CL2. The second switch SW2 may be concurrently (e.g., simultaneously) turned on when the first switch SW1 is turned on to electrically connect the third power line PL3 and the second node N2 to each other. The ground voltage GND applied to the third power line PL3 may be supplied to the second conductive line CL2 connected to the second node N2.

The third switch SW3 may be connected between the second power line PL2 and the first conductive line CL1. The third switch SW3 may be concurrently (e.g., simultaneously) turned on when the first and second switches SW1 and SW2 are turned on to electrically connect the first conductive line CL1 to the second electrode EL2. Because the second electrode EL2 is electrically connected to the second power line PL2, the first conductive line CL1 may be electrically connected to the second power line PL2 when the third switch SW3 is turned on.

When the first to third switches SW1-SW3 included in the alignment unit 145 are turned on, the alignment voltage applied to the second power line PL2 may be transferred to the second electrode EL2 and the first conductive line CL1.

In an embodiment of the present disclosure, gate electrodes of the first to third switches SW1-SW3 included in the alignment unit 145 are commonly connected to the control signal line CSi. Accordingly, the first to third switches SW1-SW3 may be concurrently (e.g., simultaneously) turned on when a control signal having a voltage at which each switch can be turned on is supplied from the control signal line CSi and may be concurrently (e.g., simultaneously) turned off when a control signal having a voltage (e.g., a high voltage) at which each switch can be turned off is supplied from the control signal line CSi.

When the first to third switches SW1-SW3 are turned on, the ground voltage GND may be applied to each of the first electrode EL1 and the second conductive line CL2, and the alignment voltage may be applied to each of the second electrode EL2 and the first conductive line CL1. Therefore, electric fields may be respectively formed by potential differences between the first electrode EL1 and the first conductive line CL1, between the first conductive line CL1 and the second conductive line CL2, and between the second conductive line CL2 and the second electrode EL2.

In an embodiment of the present disclosure, the first to third switches SW1-SW3 included in the alignment unit 145 may be turned on before the light emitting elements LD are aligned in a corresponding pixel PXL and may be turned off after the alignment of the light emitting elements LD is completed.

When the first to third switches SW1-SW3 are turned on, the light emitting elements LD may be aligned in the corresponding pixel PXL by the electric fields respectively formed between the first electrode EL1 and the first conductive line CL1, between the first conductive line CL1 and the second conductive line CL2, and between the second conductive line CL2 and the second electrode EL2.

When the alignment of the light emitting elements LD in the pixel PXL is completed, a control signal having a voltage at which the first to third switches SW1-SW3 can be turned off is supplied to the first to third switches SW1-SW3 from the control signal line CSi so that the first to third switches SW1 to SW3 are turned off.

When the first switch SW1 is turned off, the second node N2 and the third power line PL3 may be electrically separated from each other. When the second switch SW2 is turned off, the second conductive line CL2 may be electrically separated from the second node N2 and the first electrode EL1 to be in a floating state. When the third switch SW3 is turned off, the first conductive line CL1 may be electrically separated from the second power line PL2 and the second electrode EL2 to be in a floating state. That is, when the first to third switches SW1-SW3 included in the alignment unit 145 are turned off, each of the first conductive line CL1 and the second conductive line CL2 may become an electrically isolated floating electrode.

When the first to third switches SW1-SW3 are turned off, the voltage of the second driving power source VSS is applied to the second power line PL2.

As described above, after the light emitting elements LD are aligned in a pixel PXL, and the first to third switches SW1-SW3 are turned off, the light emitting unit EMU of the corresponding pixel PXL may include a first light emitting element LD1, a second light emitting element LD2, and a third light emitting element LD3, which are connected in series in a forward direction between the first driving power source VDD and the second driving power source VSS to form effective light sources. In an embodiment of the present disclosure, the first light emitting element LD1 may be any one of light emitting elements LD disposed between the first electrode EL1 and the first conductive line CL1 that is a floating electrode, the second light emitting element LD2 may be any one of light emitting elements LD disposed between the first conductive line CL1 and the second conductive line CL2 that is a floating electrode, and the third light emitting element LD3 may be any one of light emitting elements LD disposed between the second conductive line CL2 and the second electrode EL2.

In an embodiment of the present disclosure, the first light emitting element LD1, the second light emitting element LD2, and the third light emitting element LD3 may be connected in series in the forward direction between the first driving power source VDD and the second driving power source VSS. For example, one end portion of the first light emitting element LD1 may be connected to the first driving power source VDD through the first electrode EL1, and the other end portion of the first light emitting element LD1 may be connected to one end portion of the second light emitting element LD2 through the first conductive line CL1. The one end portion of the second light emitting element LD2 may be connected to the other end portion of the first light emitting element LD1, and the other end portion of the second light emitting element LD2 may be connected to one end portion of the third light emitting element LD3 through the second conductive line CL2. The one end portion of the third light emitting element LD3 may be connected to the other end portion of the second light emitting element LD2, and the other end portion of the third light emitting element LD3 may be connected to the second driving power source VSS through the second electrode EL2. In the above-described manner, the first light emitting element LD1, the second light emitting element LD2, and the third light emitting element LD3 may be sequentially connected in series between the first and second electrodes EL1 and EL2 of the light emitting unit EMU. For example, the first electrode EL1, the first conductive line CL1, the second conductive line CL2, and the second electrode EL2 may be sequentially connected in series via each light emitting element LD.

As described above, the light emitting unit EMU may be configured to include one or more serial stage(s) including a plurality of light emitting elements LD connected in parallel to one another. For example, the light emitting unit EMU may be configured in a serial/parallel combination structure.

The structure of a pixel PXL applicable to the present disclosure is not limited to the embodiments shown in FIGS. 3A-3D, and the corresponding pixels PXL may have various suitable structures. In another embodiment of the present disclosure, each pixel PXL may be configured at the inside of a passive light emitting display device, etc. Therefore, the pixel circuit 144 may be omitted, and both end portions of light emitting elements LD included in the light emitting unit EMU may be directly connected to the scan lines Si−1, Si, and Si+1, the data line Dj, the first power line PL1 to which the first driving power source VDD is applied, a second power line PL2 to which the second driving power source VSS is applied, and/or a control line.

In a pixel PXL, the light emitting elements LD are aligned in a desired area of the corresponding pixel PXL by using an alignment unit 145, and one or more switch(es) included in the alignment unit 145 is/are turned off after the light emitting elements LD are aligned so that the corresponding pixel PXL can be driven individually from an adjacent pixel PXL. Thus, a process of removing a portion of an alignment line to drive one pixel PXL individually from an adjacent pixel PXL and the like may be omitted so that the manufacturing process of the display device according to embodiments of the present disclosure can be simplified.

Generally, in a related-art display device, a first alignment voltage is applied to a first electrode EL1 of each pixel through a first alignment line commonly connected to pixels PXL, and a second alignment voltage different from the first alignment voltage is applied to a second electrode EL2 of each pixel PXL through a second alignment line commonly connected to the pixels PXL. An electric field is formed between the first and second electrodes EL1 and EL2 of each pixel PXL due to the first alignment voltage applied to the first electrode EL1 of each of the pixels PXL and the second alignment voltage applied to the second electrode EL2 of each of the pixels PXL. Light emitting elements LD sprayed and/or applied into each of the pixels PXL are aligned between the first electrode EL1 and the second electrode EL2 of each pixel PXL by the electric field. To drive each pixel PXL individually from adjacent pixels PXL after the light emitting elements LD are aligned, the first alignment line commonly connected to the pixels PXL is cut in the unit of each pixel PXL by removing a portion of the first alignment line so that the first electrode EL1 of the pixel PXL can be electrically separated from that of each of the adjacent pixels PXL. The first alignment line cut in the unit of each pixel PXL is used to drive the light emitting elements LD aligned in the pixel PXL.

The above-described process of removing a portion of the alignment line in the related-art display device is performed through, for example, a wet etching process. Some components, such as the first electrode EL1, the second electrode EL2, and the like, which are provided and/or formed in the pixel PXL by an etchant used when the wet etching process is performed, may be damaged.

Accordingly, in embodiments of the present disclosure, each of the pixels PXL is individually driven using the alignment unit 145 so that damage of components provided in each pixel PXL due to the etchant used in the wet etching process can be prevented by omitting the process of removing a portion of the alignment line. Thus, the reliability of the display device according to an embodiment of the present disclosure is improved.

Further, in an embodiment of the present disclosure, when the light emitting unit EMU of the pixel PXL is configured by connecting a plurality of light emitting elements LD in a serial/parallel combination structure, driving current/voltage conditions may be more easily adjusted to be suitable for specifications of a desired product and a defect rate caused by a short circuit may be reduced.

Figure 4:
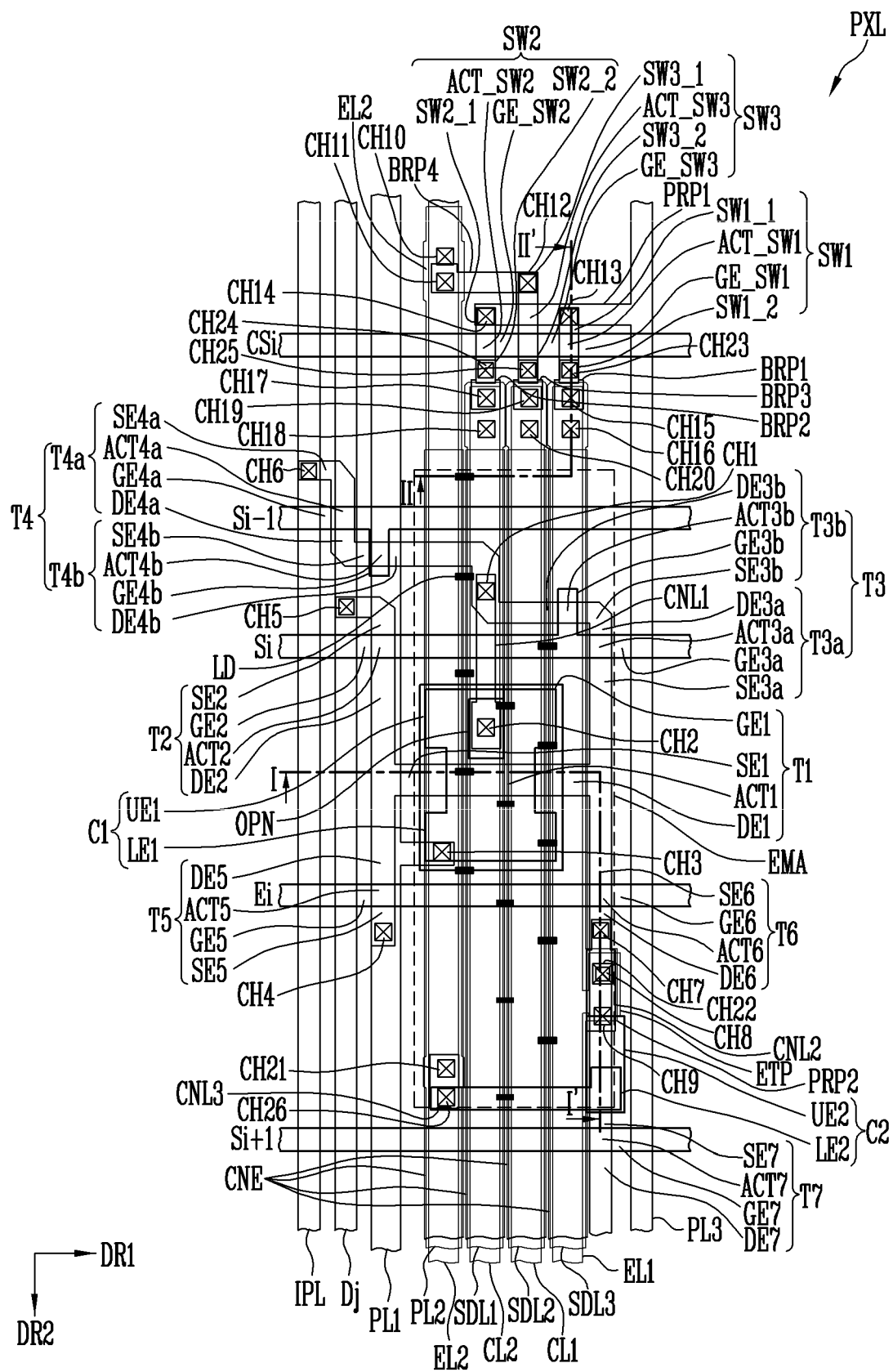
FIG. 4 is a plan view illustrating a pixel shown in FIG. 3D.
Figure 5:
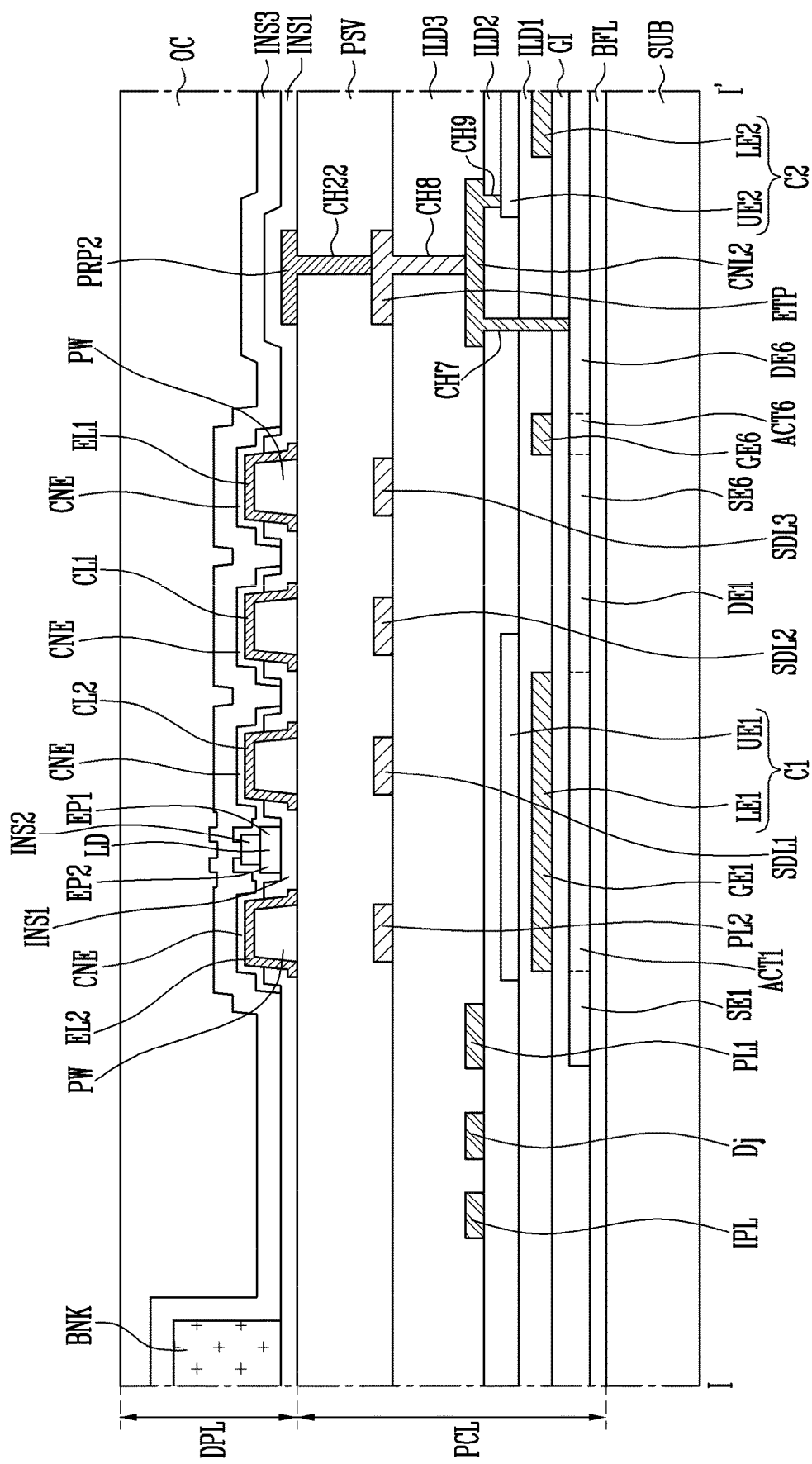
FIG. 5 is a sectional view taken along the line I-I' shown in FIG. 4.
Figure 6:
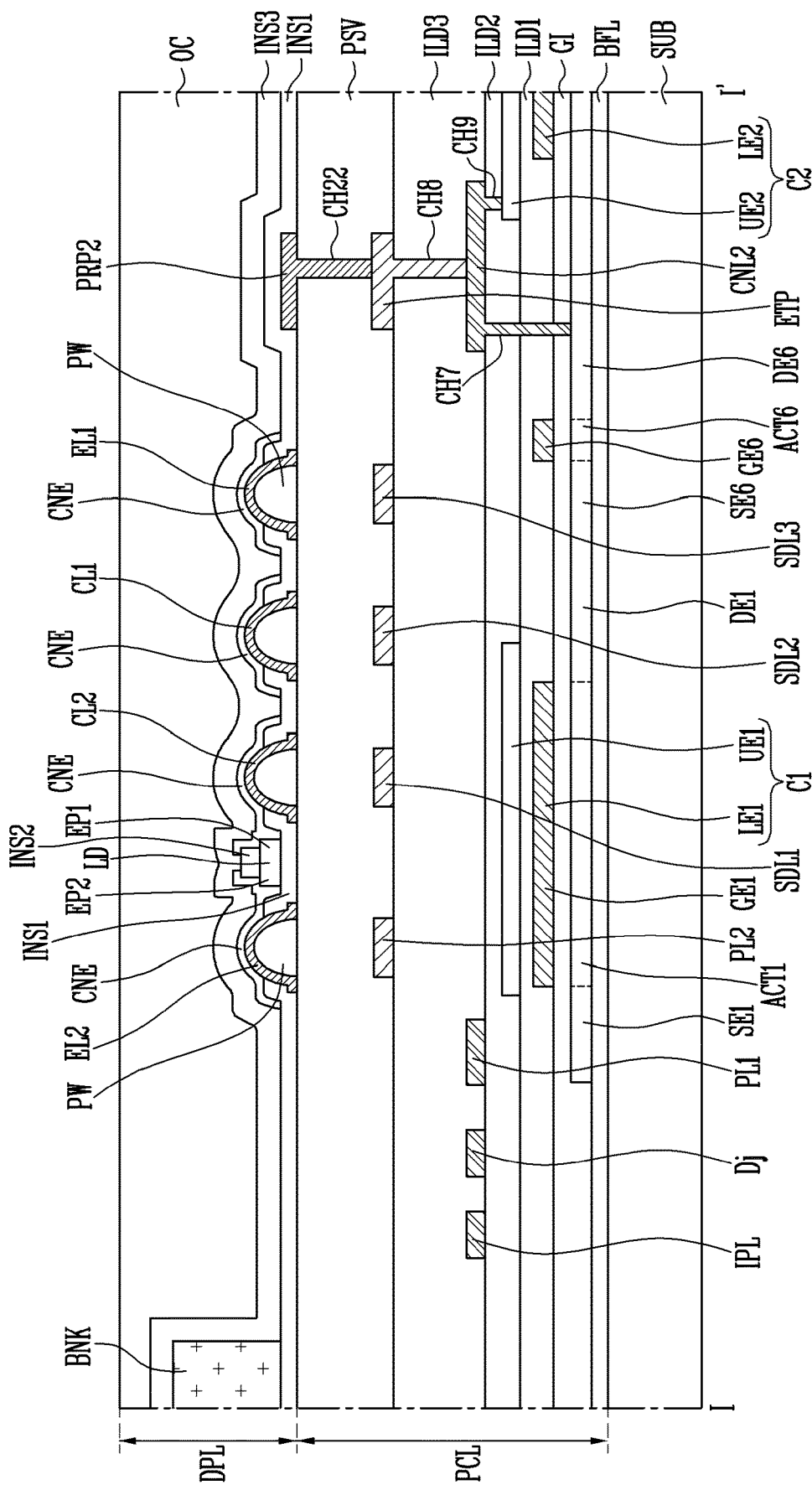
FIG. 6 illustrates an embodiment of the first bank shown in FIG. 5, which is a sectional view corresponding to the line I-I' shown in FIG. 4.
Figure 7:
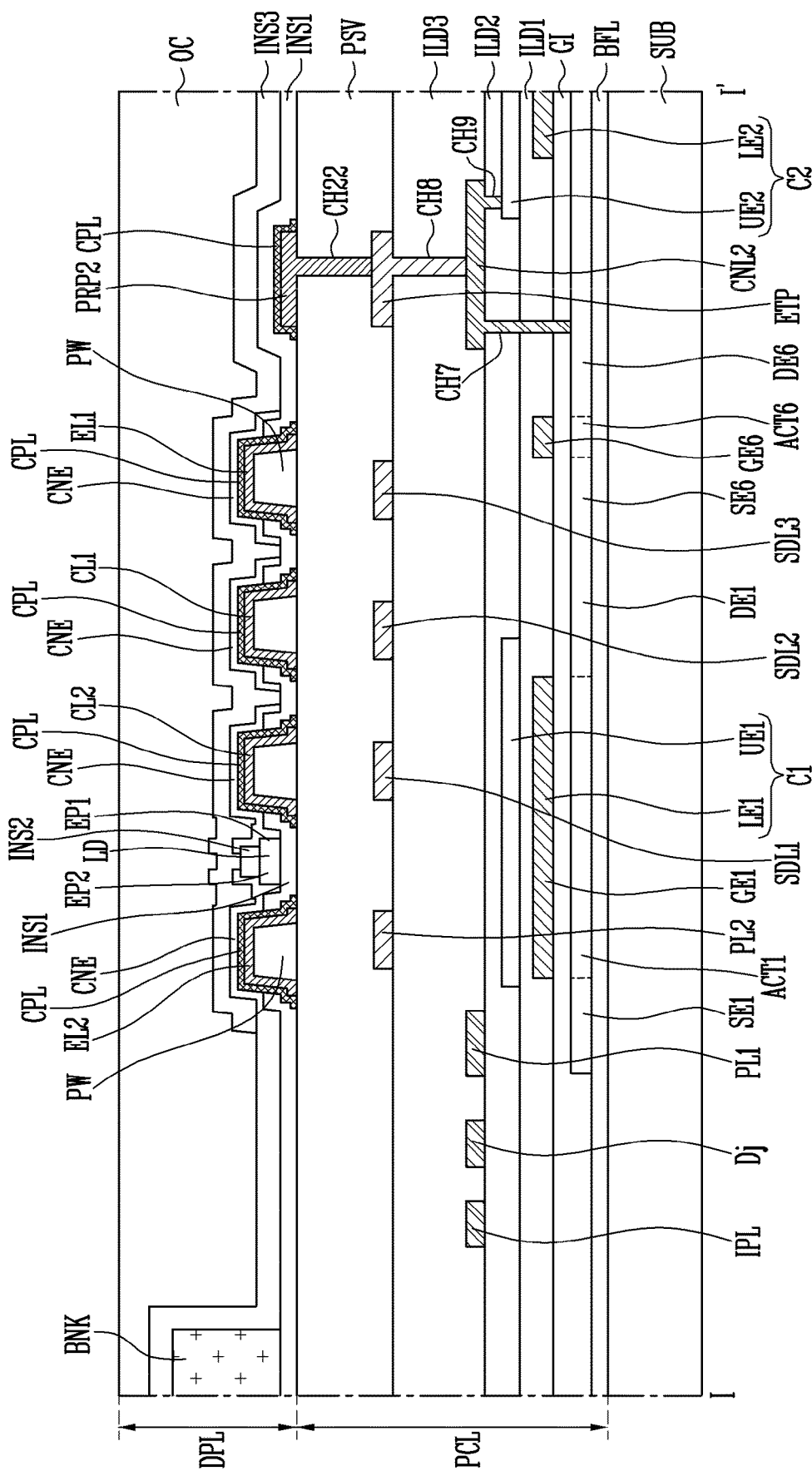
FIG. 7 illustrates an embodiment in which a capping layer is disposed between first and second electrodes and a contact electrode, which are shown in FIG. 5 and which is a sectional view corresponding to the line I-I' shown in FIG. 4.
Figure 8:
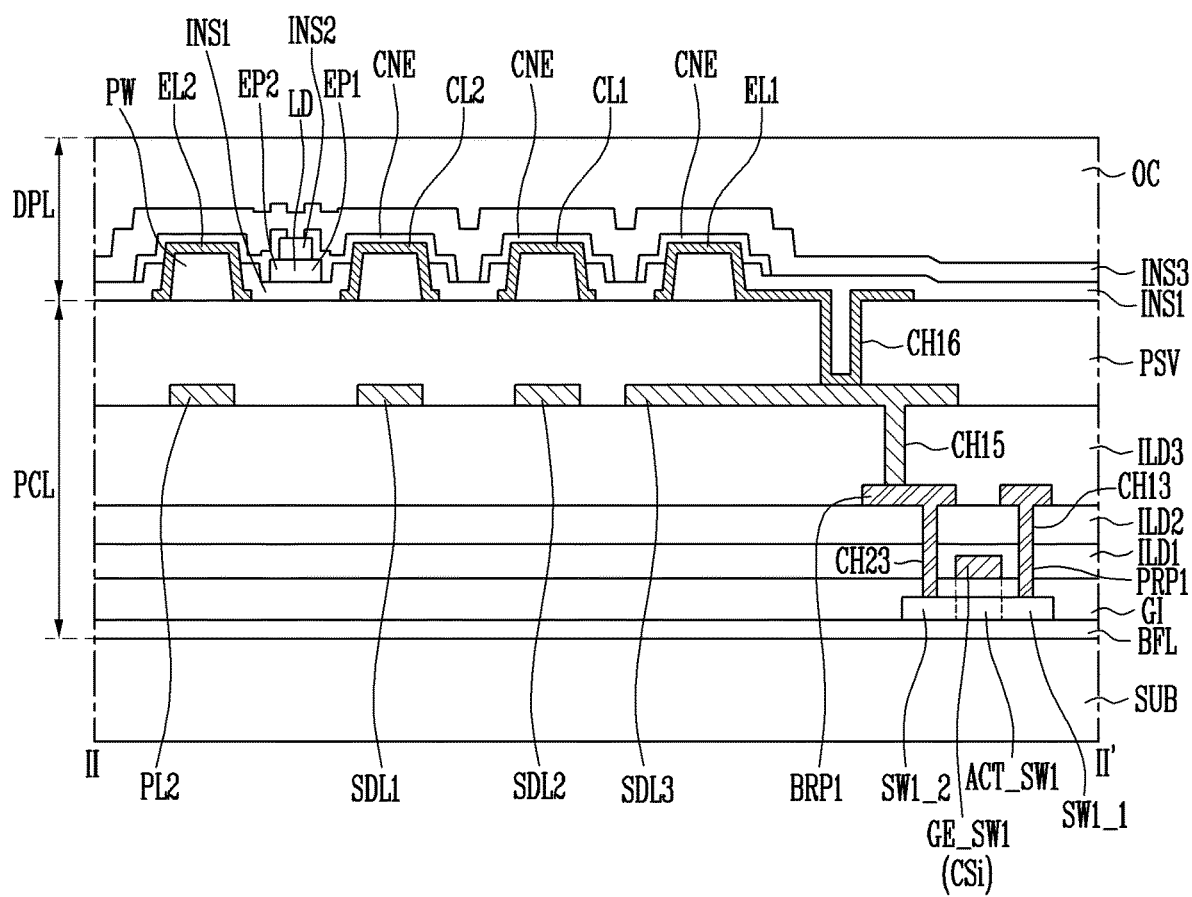
FIG. 8 is a sectional view taken along the line II-II' shown in FIG. 4.
Figure 9A:
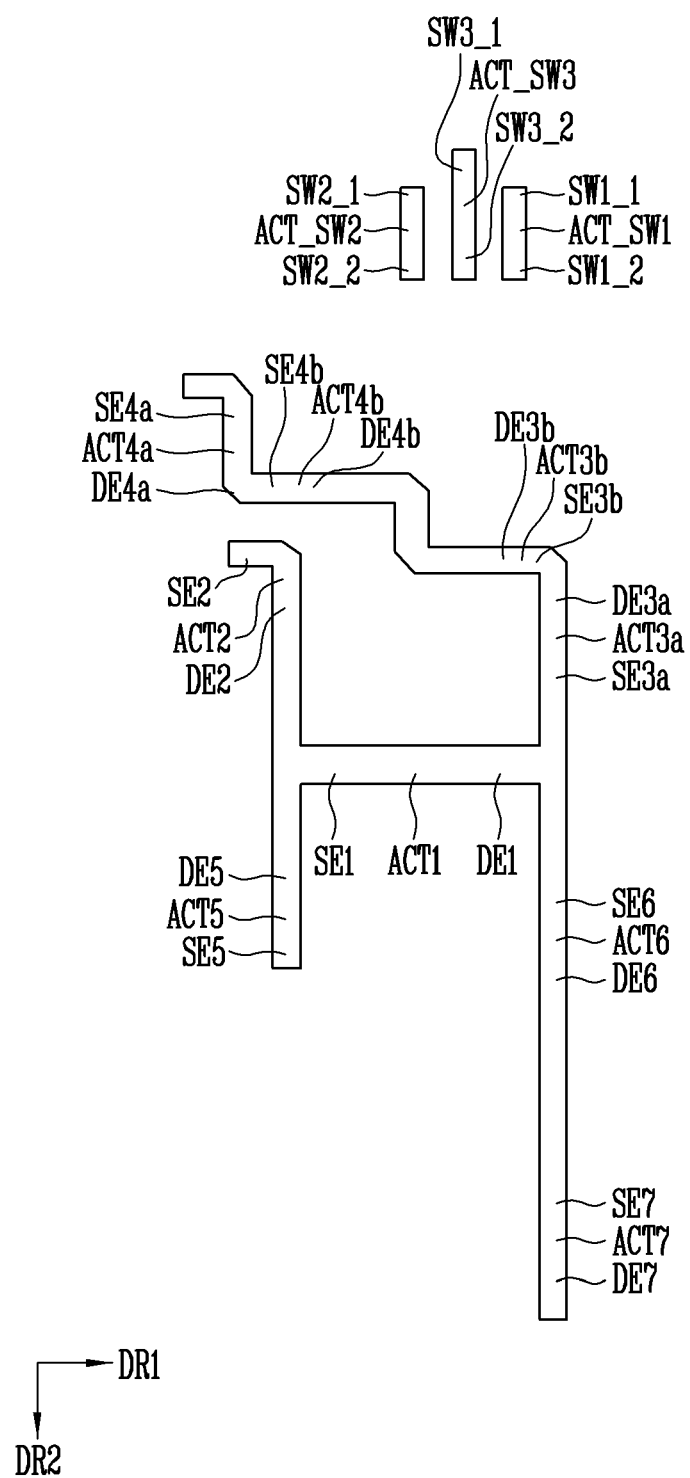
FIGS. 9A-9H are plan views schematically illustrating components of the pixel shown in FIG. 4 in each layer.
Figure 9B:
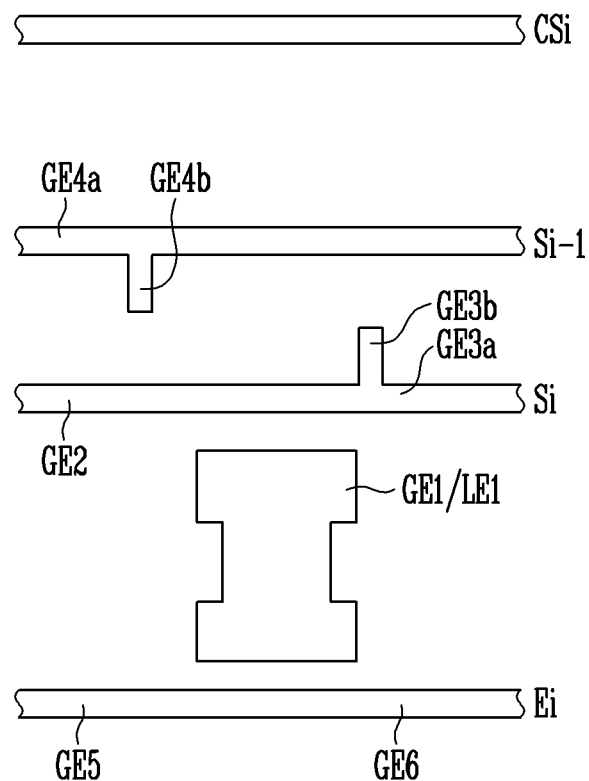
Figure 9B:
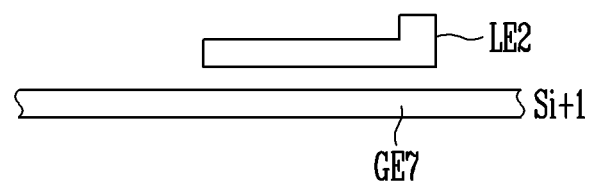
Figure 9B:
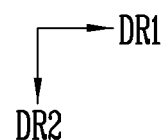
Figure 9C:
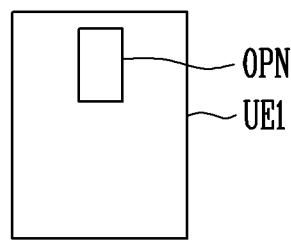
Figure 9C:
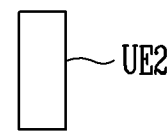
Figure 9C:
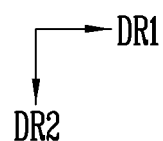
Figure 9D:
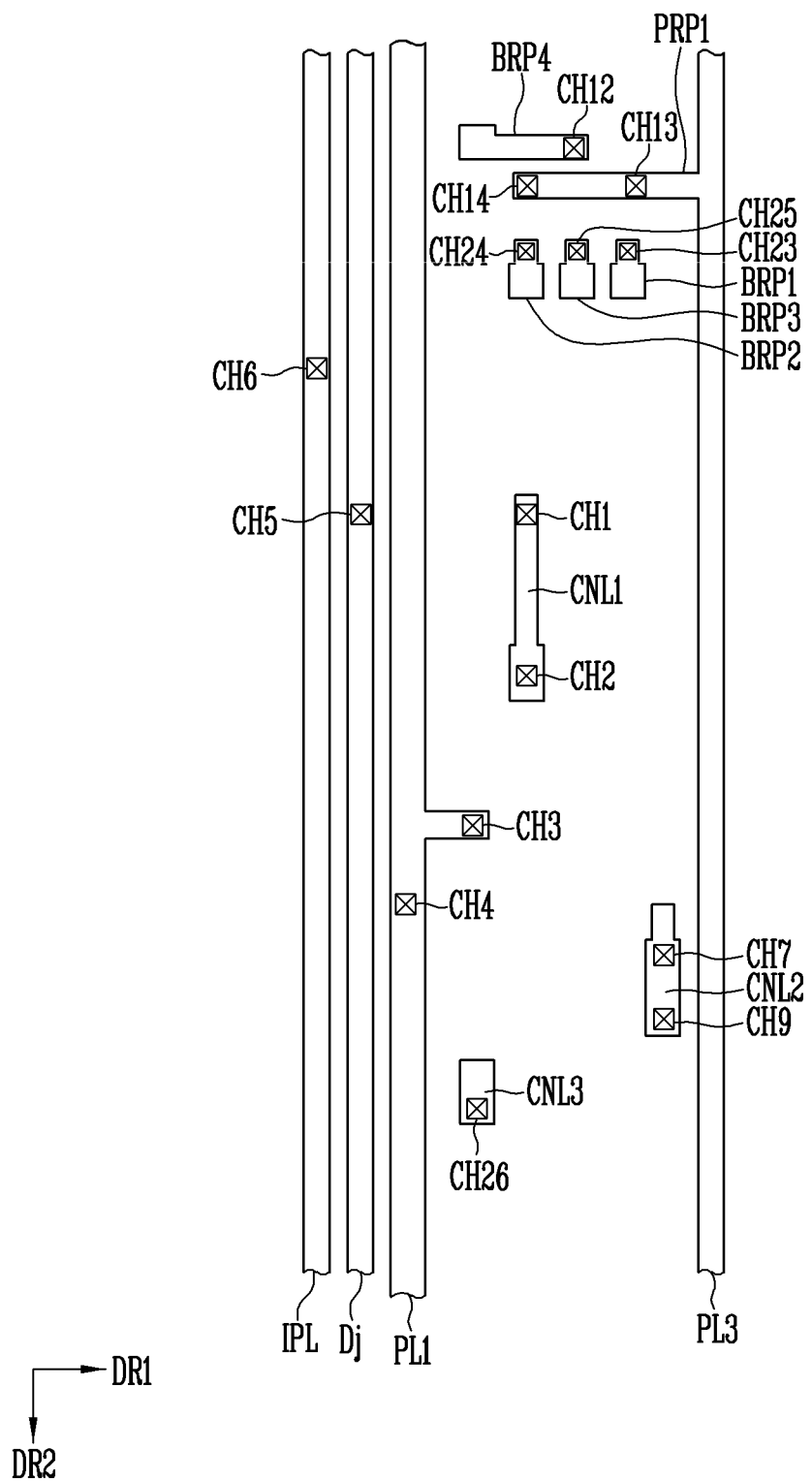
Figure 9E:
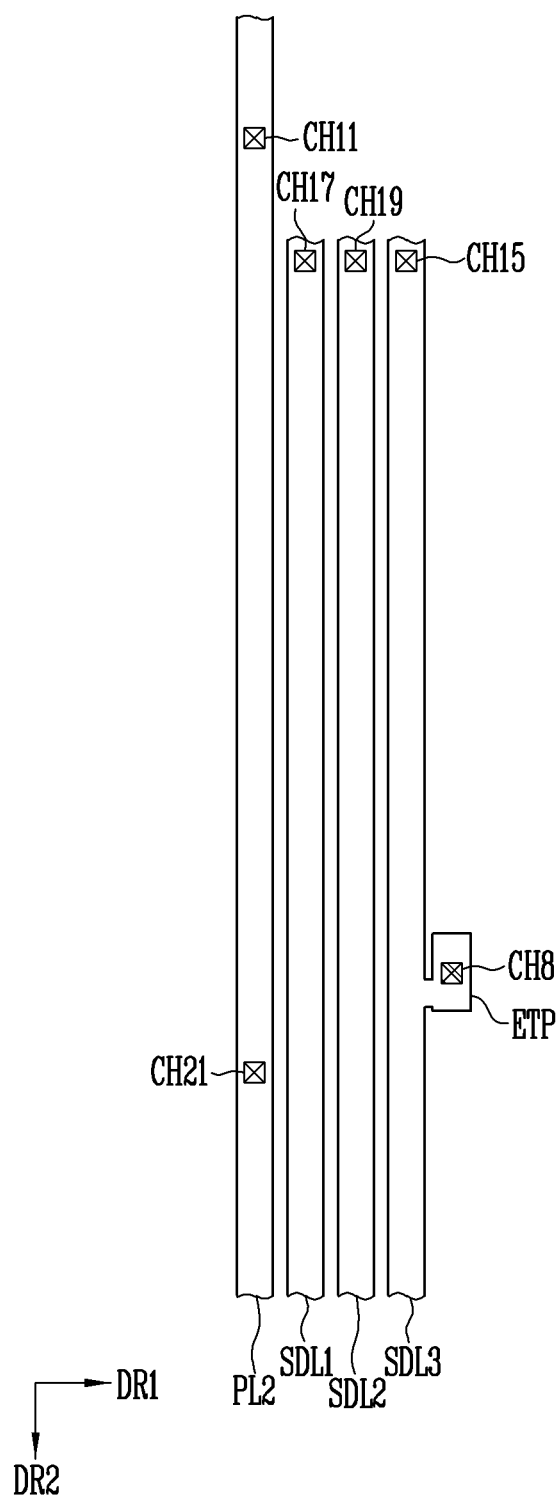
Figure 9F:
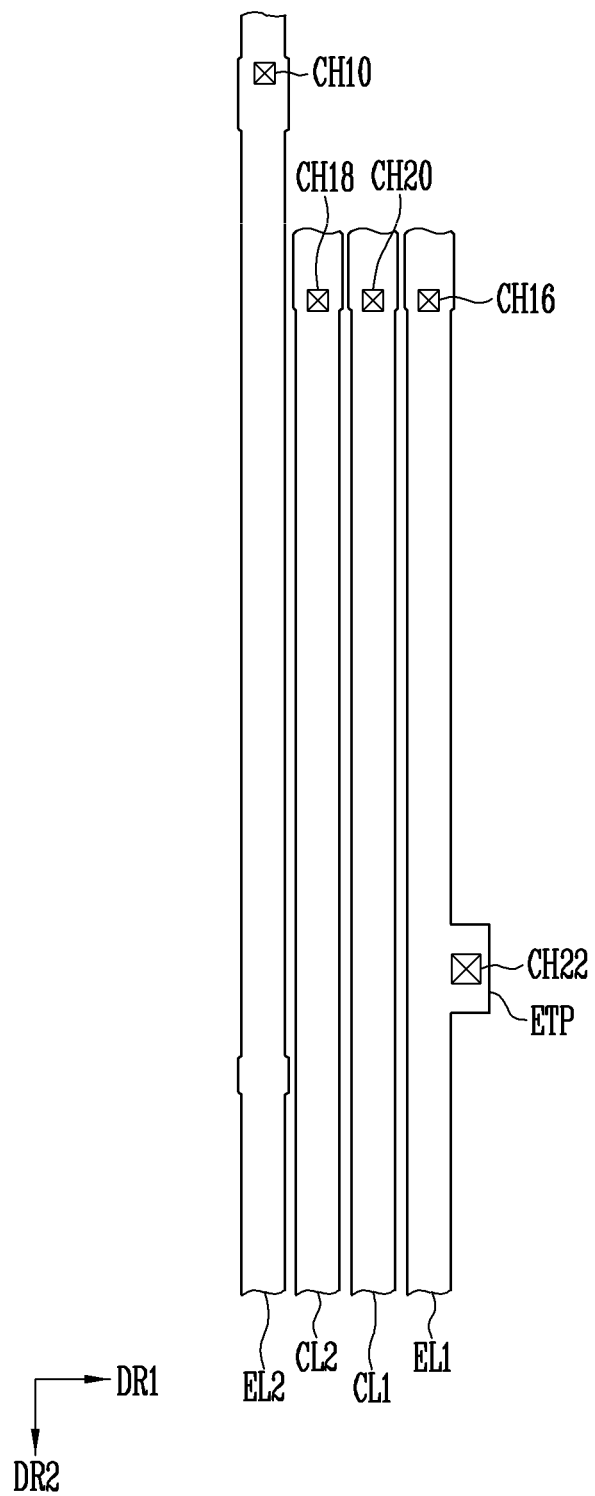
Figure 9G:
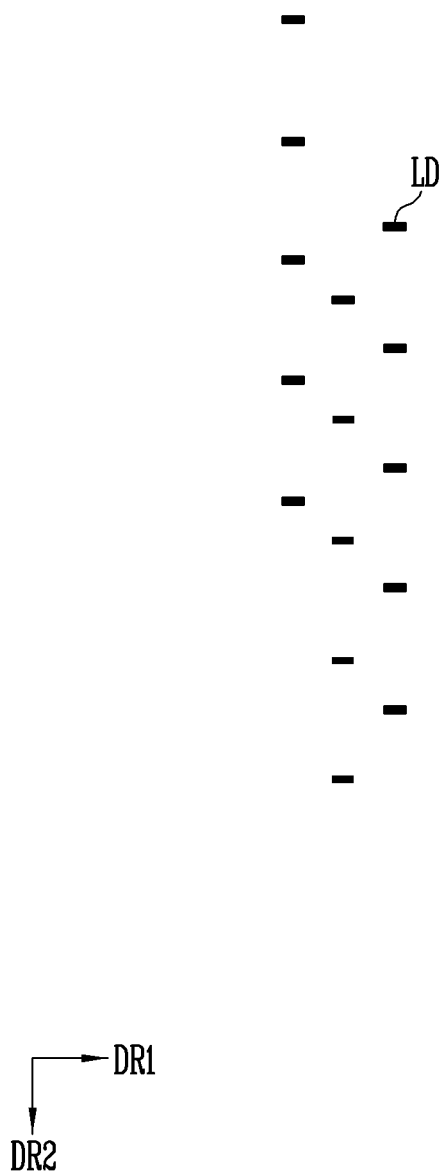
Figure 9H:
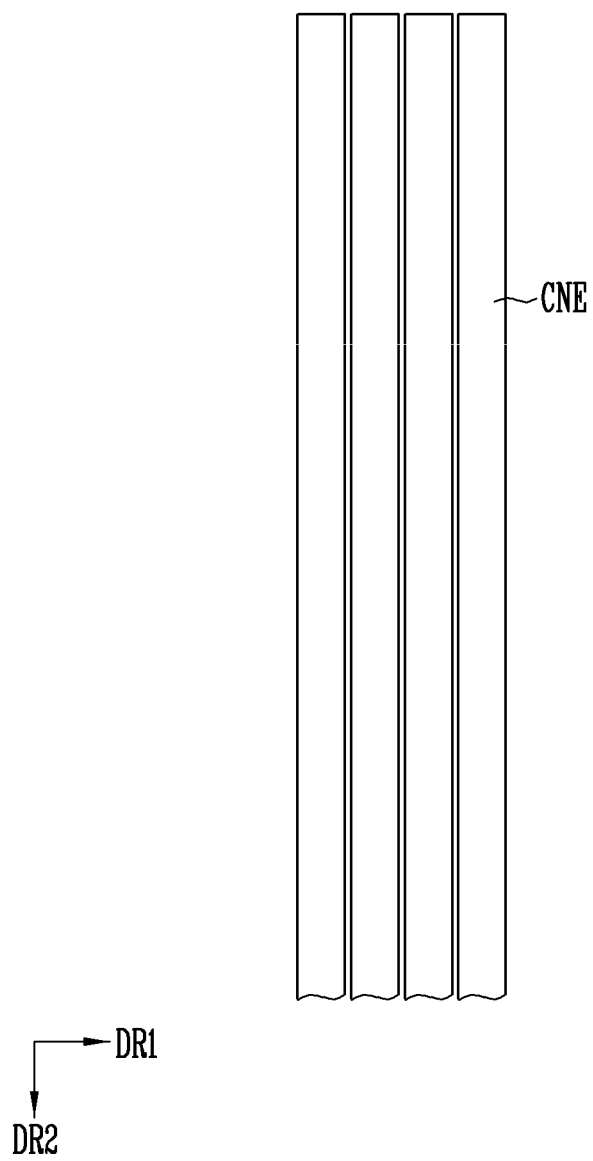

FIG. 4 is a plan view illustrating the pixel shown in FIG. 3D, and FIG. 5 is a sectional view taken along the line I-I' shown in FIG. 4. FIG. 6 is a sectional view corresponding to the line I-I' shown in FIG. 4 and illustrates another implementation of a first bank shown in FIG. 5. FIG. 7 is a sectional view corresponding to the line I-I' shown in FIG. 4 and illustrates an embodiment in which a capping layer is disposed between first and second electrodes and a contact electrode, which are shown in FIG. 5. FIG. 8 is a sectional view taken along the line II-II' shown in FIG. 4. FIGS. 9A-9H are plan views schematically illustrating components of the pixel shown in FIG. 4 for each layer.

In FIG. 4, based on one pixel PXL disposed on an ith row and a jth column, which are provided in the display area, three scan lines Si−1, Si, and Si+1, an emission control line Ei, first to third power lines PL1-PL3, a control signal line CSi, a data line Dj, and an initialization power line IPL, which are connected to the one pixel PXL, are illustrated.

In FIGS. 4-8, 9B, and 9D, for convenience of description, a scan line on an (i−1)th row is referred to as an "(i−1)th scan line Si−1," a scan line on the ith row is referred to as an "ith scan line Si," a scan line on an (i+1)th row is referred to as an "(i+1)th scan line Si+1," an emission control line on the ith row is referred to as an "emission control line Ei," a data line on the jth column is referred to as a "data line Dj," a first power line on the jth column is referred to as a "a first power line PL1," a second power line on the jth column is referred to as a "second power line PL2," a third power line on the jth column is referred to as a "third power line PL3," and a control signal line on the ith row is referred to as a "control signal line CSi."

Also, in FIGS. 4-8, the structure of the one pixel PXL is simplified with each electrode being illustrated as a single electrode layer and each insulating layer being illustrated as a single insulating layer. However, the present disclosure is not limited thereto.

Referring to FIGS. 1A, 2, 3D, 4-8, and 9A-9H, the display device according to an embodiment of the present disclosure may include a substrate SUB, a line unit, and one or more pixel(s) PXL.

The substrate SUB may include a transparent insulating material such that light may be transmitted therethrough. The substrate SUB may be a rigid substrate or a flexible substrate.

The rigid substrate may include a glass substrate, a quartz substrate, a glass ceramic substrate, and a crystalline glass substrate.

The flexible substrate may include a film substrate and a plastic substrate, which include a polymer organic material. For example, the flexible substrate may include one or more of polyethersulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). Also, the flexible substrate may include a fiber glass reinforced plastic (FRP).

A material applied to the substrate SUB may have resistance (or heat resistance) to high processing temperature in a manufacturing process of the display device. In an embodiment of the present disclosure, the entire or at least a portion of the substrate SUB may be flexible.

The line unit may provide signals to the pixel PXL provided in the display area DA and may include scan lines Si−1, Si, and Si+1, a data line Dj, an emission control line Ei, first to third power lines PL1-PL3, an initialization power line IPL, a control signal line CSi, and first to third shielding electrode lines SDL1-SDL3.

The scan lines Si−1, Si, and Si+1 may extend in a first direction DR1. The scan lines Si−1, Si, and Si+1 may include an (i−1)th scan line Si−1, an ith scan line Si, and an (i+1)th scan line Si+1, which are sequentially arranged along a second direction DR2 intersecting the first direction DR1. The scan lines Si−1, Si, and Si+1 may be provided and/or formed on a gate insulating layer GI. The gate insulating layer GI may be an inorganic insulating layer made of (or including) an inorganic material.

A scan signal may be supplied to the scan lines Si−1, Si, and Si+1. For example, an (i−1)th scan signal may be supplied to the (i−1)th scan line Si−1, an ith scan signal may be supplied to the ith scan line Si, and an (i+1)th scan signal may be supplied to the (i+1)th scan line Si+1.

The emission control line Ei may extend in the first direction DR1 and may be disposed to be spaced apart from each of the ith scan line Si and the (i+1)th scan line Si+1 between the ith scan line Si and the (i+1)th scan line Si+1 when viewed on a plane. An emission control signal may be applied to the emission control line Ei. The emission control line Ei may be disposed in the same layer as the scan lines Si−1, Si, and Si+1 and may include the same (or substantially the same) material as the scan lines Si−1, Si, and Si+1. The emission control line Ei may be provided and/or formed on the gate insulating layer GI.

The control signal line CSi may extend in the first direction DR1 and may be disposed to be spaced apart from the (i−1)$^{th}$ scan line Si−1 when viewed on a plane. A control signal may be applied to the control signal line CSi. The control signal line CSi may be disposed in the same layer as the scan lines Si−1, Si, and Si+1 and may include the same (or substantially the same) material as the scan lines Si−1, Si, and Si+1. The control signal line CSi may be provided and/or formed on the gate insulating layer GI.

The data line Dj may extend in the second direction DR2 and may be arranged along the first direction DR1. A data signal may be applied to the data line Dj. The data line Dj may be provided and/or formed on a second interlayer insulating layer ILD2. The second interlayer insulating layer ILD2 may be an inorganic insulating layer made of (or including) an inorganic material or an organic insulating layer made of (or including) an organic material.

The initialization power line IPL may extend along the second direction DR2 and may be disposed to be spaced apart from the data line Dj. The initialization power source Vint may be applied to the initialization power line IPL. The initialization power line IPL may be disposed in the same layer as the data line Dj and may include the same (or substantially the same) material as the data line Dj. The initialization power line IPL may be provided and/or formed on the second interlayer insulating layer ILD2. However, the present disclosure is not limited thereto. In some embodiments, the initialization power line IPL may be provided and/or formed on a first interlayer insulating layer ILD1 between the data line Dj and the scan lines Si−1, Si, and Si+1.

The first power line PL1 may extend along the second direction DR2 and may be disposed to be spaced apart from the data line Dj. The first driving power source VDD may be applied to the first power line PL1.

The third power line PL3 may extend along the second direction DR2 and may be disposed to be spaced apart from the first power line PL1. The ground voltage GND may be applied to the third power line PL3.

In an embodiment of the present disclosure, the first and third power lines PL1 and PL3 may be disposed in the same layer as the data line Dj and may include the same (or substantially the same) material as the data line Dj. The first and third power lines PL1 and PL3 may be provided and/or formed on the second interlayer insulating layer ILD2.

The second power line PL2 may extend along the second direction DR2 and may be disposed on the first power line PL1 with a third interlayer insulating layer ILD3 interposed therebetween. The second driving power source VSS may be applied to the second power line PL2.

The first shielding electrode line SDL1 may extend along the second direction DR2 and may be disposed to be spaced apart from the second power line PL2.

The second shielding electrode line SDL2 may extend along the second direction DR2 and may be disposed to be spaced apart from the first shielding electrode line SDL1.

The third shielding electrode line SDL3 may extend along the second direction DR2 and may be disposed to be spaced apart from the second shielding electrode line SDL2.

In an embodiment of the present disclosure, the first to third shielding electrode lines SDL1, SDL2, and SDL3 may be disposed in the same layer as the second power line PL2 and may include the same (or substantially the same) material as the second power line PL2. The first to third shielding electrode lines SDL1, SDL2, and SDL3 may be provided and/or formed on the third interlayer insulating layer ILD3.

The pixel PXL may include a display element layer including one or more light emitting device(s) LD and a pixel circuit layer PCL that drives the light emitting device(s) LD.

The pixel circuit layer PCL may include an alignment unit 145 for aligning the light emitting elements LD in a light emitting area EMA of the pixel PXL, a pixel circuit 144 for driving the light emitting elements LD, and a protective layer PSV covering the alignment unit 145 and the pixel circuit 144.

The display element layer DPL may include the light emitting elements LD, first and second electrodes EL1 and EL2, first and second conductive lines CL1 and CL2, contact electrodes CNE, and the like.

For convenience of description, the display element layer DPL will be described after the pixel circuit layer PCL is described.

The pixel circuit 144 may include first to seventh transistors T1-T7 and first and second capacitors C1 and C2. The alignment unit 145 may include first to third switches SW1-SW3.

The pixel circuit 144 and the alignment unit 145 may be provided (or formed) on the substrate SUB with a buffer layer BFL interposed therebetween.

The buffer layer BFL may prevent or substantially prevent an impurity from being diffused into each of the first to seventh transistors T1-T7 and the first to third switches SW1-SW3. The buffer layer BFL may be provided in a single layer, but in other embodiment, the buffer layer BFL may have a multi-layer structure including a plurality of layers. When the buffer layer BFL has the multi-layer structure, the layers may be formed of the same (or substantially the same) material or may be formed of different materials. The buffer layer BFL may be omitted according to the material and process conditions of the substrate SUB.

The first transistor T1 may include a first gate electrode GE1, a first active pattern ACT1, a first source electrode SE1, a first drain electrode DE1, and a first connection electrode CNL1.

The first gate electrode GE may be connected to a 3ath drain electrode DE3a of a 3ath transistor T3a and a 4bth drain electrode DE4b of a 4bth transistor T4b.

One end of the first connection electrode CNL1 may be connected to each of the 3ath drain electrode DE3a and the 4bth drain electrode DE4b through a first contact opening (e.g., a first contract hole) CH1 penetrating the gate insulating layer GI and the first and second interlayer insulating layers ILD1 and ILD2. The other end of the first connection electrode CNL1 may be connected to the first gate electrode GE1 through a second contact opening (e.g., a second contact hole) CH2 penetrating the first and second interlayer insulating layers ILD1 and ILD2.

The first active pattern ACT1, the first source electrode SE1, and the first drain electrode DE1 may be formed of a semiconductor layer undoped or doped with an impurity. For example, the first source electrode SE1 and the first drain electrode DE1 may be formed of a semiconductor layer doped with the impurity, and the first active pattern ACT1 may be formed of a semiconductor layer undoped (or not doped) with the impurity.

The first active pattern ACT1 may have a bar shape extending in a direction and may have a shape bent multiple times along the extending direction. The first active pattern ACT1 may overlap the first gate electrode GE1 when viewed on a plane. The first active pattern ACT1 is formed long (e.g., has an extended shape), so that a channel region of the first transistor T1 can be formed long (e.g., may have an extended shape). Accordingly, the driving range of a gate voltage applied to the first transistor T1 is widened (or increased). Thus, the grayscale of light emitted from the light emitting elements LD may be finely controlled.

The first source electrode SE1 may be connected to one end of the first active pattern ACT1. Also, the first source electrode SE1 may be connected to a second drain electrode DE2 of the second transistor T2 and a fifth train electrode DE5 of the fifth transistor T5. The first drain electrode DE1 may be connected to the other end of the first active pattern ACT1. Also, the first drain electrode DE1 may be connected to a 3ath source electrode SE3a of the 3ath transistor T3a and a sixth source electrode SE6 of the sixth transistor T6.

The second transistor T2 may include a second gate electrode GE2, a second active pattern ACT2, a second source electrode SE2, and the second drain electrode DE2.

The second gate electrode GE2 may be connected to the ith scan line Si. The second gate electrode GE may be a portion of the ith scan line Si or may have a shape protruding from the ith scan line Si.

The second active pattern ACT2, the second source electrode SE2, and the second drain electrode DE2 may be formed of a semiconductor layer undoped (e.g., not doped) or doped with an impurity. For example, the second source electrode SE2 and the second drain electrode DE2 may be formed of a semiconductor layer doped with the impurity, and the second active pattern ACT2 may be formed of a semiconductor layer undoped with (or not doped with) the impurity.

The second active pattern ACT2 corresponds to a portion overlapping the second gate electrode GE2. One end of the second source electrode SE2 is connected to the second active pattern ACT2, and the other end of the second source electrode SE2 is connected to the jth data line DLj through a fifth contact opening (e.g., a fifth contact hole) CH5 penetrating the gate insulating layer GI and the first and second interlayer insulating layers ILD1 and ILD2. One end of the second drain electrode DE2 is connected to the second active pattern ACT2, and the other end of the second drain electrode DE2 is connected to the first source electrode SE1 of the first transistor T1 and the fifth drain electrode DE5 of the fifth transistor T5.

The third transistor T3 may have a double gate structure to prevent or reduce leakage current. For example, the third transistor T3 may include the 3ath transistor T3a and a 3bth transistor T3b.

The 3ath transistor T3a may include a 3ath gate electrode GE3a, a 3ath active pattern ACT3a, the 3ath source electrode SE3a, and the 3ath drain electrode DE3a. The 3bth transistor T3b may include a 3bth gate electrode GE3b, a 3bth active pattern ACT3b, a 3bth source electrode SE3b, and a 3bth drain electrode DE3b.

Each of the 3ath and 3bth gate electrodes GE3a and GE3b may be connected to the ith scan line Si. Each of the 3ath and 3bth gate electrodes GE3a and GE3b may be a portion of the ith scan line Si or may be a shape protruding from the ith scan line Si.

Each of the 3ath and 3bth active patterns ACT3a and ACT3b, the 3ath and 3bth source electrodes SE3a and SE3b, and the 3ath and 3bth drain electrodes DE3a and DE3b may be formed of a semiconductor layer doped or undoped with an impurity. For example, each of the 3ath and 3bth source electrodes SE3a and SE3b and the 3ath and 3bth drain electrodes DE3a and DE3b may be formed of a semiconductor layer doped with the impurity, and each of the 3ath and 3bth active patterns ACT3a and ACT3b may be formed of a semiconductor layer undoped with the impurity. The 3ath active pattern ACT3a corresponds to a portion overlapping the 3ath gate electrode GE3a, and the 3bth active pattern ACT3b corresponds to a portion overlapping the 3bth gate electrode GE3b.

One end of the 3ath source electrode SE3a may be connected to the 3ath active pattern ACT3a, and the other end of the 3ath source electrode SE3a may be connected to the first drain electrode DE1 of the first transistor T1 and the sixth source electrode SE6 of the sixth transistor T6. One end of the 3ath drain electrode DE3a may be connected to the 3ath active pattern ACT3a, and the other end of the 3ath drain electrode DE3a may be connected to the 3bth source electrode SE3b of the 3bth transistor T3b.

One end of the 3bth source electrode SE3b may be connected to the 3bth active pattern ACT3b, and the other end of the 3bth source electrode SE3b may be connected to the 3ath drain electrode DE3a of the 3ath transistor T3a. One end of the 3bth drain electrode DE3b may be connected to the 3bth active pattern ACT3b, and the other end of the 3bth drain electrode DE3b may be connected to the 4bth drain electrode DE4b of a 4bth transistor T4b. Also, the other end of the 3bth drain electrode DE3b may be connected to the first gate electrode GE1 via the first and second contact openings CH1 and CH2 and the first connection electrode CNL1.

Similar to the third transistor T3, the fourth transistor T4 may have a double gate structure to prevent or reduce leakage current. For example, the fourth transistor T4 may include the 4ath transistor T4a and the 4bth transistor T4b.

The 4ath transistor T4a may include a 4ath gate electrode GE4a, a 4ath active pattern ACT4a, a 4ath source electrode SE4a, and a 4ath drain electrode DE4a. The 4bth transistor T4b may include a 4bth gate electrode GE4b, a 4bth active pattern ACT4b, a 4bth source electrode SE4b, and the 4bth drain electrode DE4b.

Each of the 4ath and 4bth gate electrodes GE4a and GE4b may be connected to the $(i-1)^{th}$ scan line Si-1. Each of the 4ath and 4bth gate electrodes GE4a and GE4b may be a portion of the $(i-1)^{th}$ scan line Si-1 or may be a shape protruding from the $(i-1)^{th}$ scan line Si-1.

Each of the 4ath and 4bth active patterns ACT4a and ACT4b, the 4ath and 4bth source electrode SE4a and SE4b, and the 4ath and 4bth drain electrodes DE4a and DE4b may be formed of a semiconductor layer doped or undoped with an impurity. For example, each of the 4ath and 4bth source electrode SE4a and SE4b and the 4ath and 4bth drain electrodes DE4a and DE4b may be formed of a semiconductor layer doped with the impurity, and each of the 4ath and 4bth active patterns ACT4a and ACT4b may be formed of a semiconductor layer undoped with the impurity. The 4ath active pattern ACT4a corresponds to a portion overlapping the 4ath gate electrode GE4a, and the 4bth active pattern ACT4b corresponds to a portion overlapping the 4bth gate electrode GE4b.

One end of the 4ath source electrode SE4a may be connected to the 4ath active pattern ACT4a, and the other end of the 4ath source electrode SE4a may be connected to the initialization power line IPL through a sixth contact opening (e.g., a sixth contact hole) CH6 penetrating the gate insulating layer GI and the first and second interlayer insulating layers ILD1 and ILD2. One end of the 4ath drain electrode DE4a may be connected to the 4ath active pattern ACT4a, and the other end of the 4ath drain electrode DE4a may be connected to the 4bth source electrode SE4b of the 4bth transistor T4b.

One end of the 4bth source electrode SE4b may be connected to the 4bth active pattern ACT4b, and the other end of the 4bth source electrode SE4b may be connected to the 4ath drain electrode DE4a of the 4ath transistor T4a. One end of the 4bth drain electrode DE4b may be connected to the 4bth active pattern ACT4b, and the other end of the 4bth drain electrode DE4b may be connected to the 3bth drain electrode DE3b of the 3bth transistor T3b. Also, the other end of the 4bth drain electrode DE4b may be connected to the first gate electrode GE1 of the first transistor T1 through the first and second contact openings CH1 and CH2 and the first connection electrode CNL1.

The fifth transistor T5 may include a fifth gate electrode GE5, a fifth active pattern ACT5, a fifth source electrode SE5, and the fifth drain electrode DE5.

The fifth gate electrode GE5 may be connected to the emission control line Ei. The fifth gate electrode GE5 may be a portion of the emission control line Ei or may be a shape protruding from the emission control line Ei.

The fifth active pattern ACT5, the fifth source electrode SE5, and the fifth drain electrode DE5 may be formed of a semiconductor layer undoped or doped with an impurity. In one example, the fifth source electrode SE5 and the fifth drain electrode DE5 may be formed of a semiconductor layer doped with the impurity, and the fifth active pattern ACT5 may be formed of a semiconductor layer undoped with the impurity.

The fifth active pattern ACT5 may correspond to a portion overlapping the fifth gate electrode GE5.

One end of the fifth source electrode SE5 may be connected to the fifth active pattern ACT5, and the other end of the fifth source electrode SE5 may be connected to the first power line PL1 through a fourth contact opening (e.g., a fourth contact hole) CH4 penetrating the gate insulating layer GI and the first and second interlayer insulating layers ILD1 and ILD2. One end of the fifth drain electrode DE5 may be connected to the fifth active pattern ACT5, and the other end of the fifth drain electrode DE5 may be connected to the first source electrode SE1 of the first transistor T1 and the second drain electrode DE2 of the second transistor T2.

The sixth transistor T6 may include a sixth gate electrode GE6, a sixth active pattern ACT6, the sixth source electrode SE6, and a sixth drain electrode DE6.

The sixth gate electrode DE6 may be connected to the emission control line Ei. The sixth gate electrode GE6 may be a portion of the emission control line Ei or may be a shape protruding from the emission control line Ei.

The sixth active pattern ACT6, the sixth source electrode SE6, and the sixth drain electrode DE6 may be formed of a semiconductor layer undoped or doped with an impurity. For example, the sixth source electrode SE6 and the sixth drain electrode DE6 may be formed of a semiconductor layer doped with the impurity, and the sixth active pattern ACT6 may be formed of a semiconductor layer undoped with the impurity.

The sixth active pattern ACT6 may correspond to a portion overlapping the sixth gate electrode GE6.

One end of the sixth source electrode SE6 may be connected to the sixth active pattern ACT6, and the other end of the sixth source electrode SE6 may be connected to the first drain electrode DE1 of the first transistor T1 and the 3ath source electrode SE3a of the 3ath transistor T3a. One end of the sixth drain electrode DE6 may be connected to the sixth active pattern ACT6, and the other end of the sixth drain electrode DE6 may be connected to a second connection electrode CNL2 through the fifth contact opening CH5 penetrating the gate insulating layer GI and the first and second interlayer insulating layers ILD1 and ILD2.

One end of the second connection electrode CNL2 may be connected to the sixth drain electrode DE6 of the sixth transistor T6 through a seventh contact opening (e.g., a seventh contact hole) CH7 penetrating the gate insulating layer GI and the first and second interlayer insulating layers ILD1 and ILD2, and the other end of the second connection electrode CNL2 may be connected to an extension electrode ETP through an eighth contact opening (e.g., an eighth contact hole) CH8 penetrating the third interlayer insulating layer ILD3.

The extension electrode ETP may be disposed on the second connection electrode CNL2 with the third interlayer insulating layer ILD3 interposed therebetween. One end of the extension electrode ETP may be connected to the second connection electrode CNL2 through the eighth contact opening CH8, and the other end of the extension electrode ETP may be connected to a second protrusion electrode PRP2 through a twenty-second contact opening (e.g., a twenty-second contact hole) CH22 penetrating the protective layer PSV.

The seventh transistor T7 may include a seventh gate electrode GE7, a seventh active pattern ACT7, a seventh source electrode SE7, and a seventh drain electrode DE7.

The seventh gate electrode GE7 may be connected to the $(i+1)^{th}$ scan line Si+1. The seventh gate electrode GE7 may be a portion of the $(i+1)^{th}$ scan line Si+1 or may be a shape protruding from the $(i+1)^{th}$ scan line Si+1.

The seventh active pattern ACT7, the seventh source electrode SE7, and the seventh drain electrode DE7 may be formed of a semiconductor layer undoped or doped with an impurity. For example, the seventh source electrode SE7 and the seventh drain electrode DE7 may be formed of a semiconductor layer doped with the impurity, and the seventh active pattern ACT7 may be formed of a semiconductor layer undoped with the impurity.

The seventh active pattern ACT7 may correspond to a portion overlapping the seventh gate electrode GE7.

One electrode of the seventh source electrode SE7 may be connected to the seventh active pattern ACT7, and the other end of the seventh source electrode SE7 may be connected to the sixth drain electrode DE6 of the sixth transistor T6.

One end of the seventh drain electrode DE7 may be connected to the seventh active pattern ACT7, and the other end of the seventh drain electrode DE7 may be electrically connected to the initialization power line IPL connected to a pixel on the $(i+1)^{th}$ row through a contact opening (e.g., a contact hole). Therefore, the other end of the seventh drain electrode DE7 may be connected to a 4ath source electrode of a fourth transistor of the pixel disposed on the $(i+1)^{th}$ row.

The first capacitor C1 may include a first lower electrode LE1 and a first upper electrode UE1.

The first lower electrode LE1 may be integrally provided with (e.g., integrally formed with) the first gate electrode GE1 of the first transistor T1. When the first lower electrode LE1 is integrally provided with the first gate electrode GE1, the first lower electrode LE1 may be a portion of the first gate electrode GE1.

The first upper electrode UE1 may overlap the first lower electrode LE1. When viewed on a plane, the first upper electrode UE1 may cover the first lower electrode LE1. The overlapping area of the first upper electrode UE1 and the first lower electrode LE1 may be widened so that the capacitance of the first capacitor C1 may be increased. The first upper electrode UE1 may be electrically connected to the first power line PL1 through a third contact opening (e.g., a third contact hole) CH3 penetrating the second interlayer insulating layer ILD2. Accordingly, the first driving power source VDD applied to the first power line PL1 may be transferred to the first upper electrode UE1. The first upper electrode UE1 may include an opening OPN corresponding to a region in which the second contact opening CH2, through which the first gate electrode GE1 of the first transistor T1 and the first connection electrode CNL1 are connected, is formed.

The second capacitor C2 may include a second lower electrode LE2 and a second upper electrode UE2.

The second lower electrode LE2 may be located between the emission control line Ei and the $(i+1)^{th}$ scan line Si+1 when viewed on a plane and may be disposed with the first lower electrode LE1 on the same plane. The second lower electrode LE2 may be connected to a third connection electrode CNL3 through a twenty-sixth contact opening (e.g., a twenty-sixth contact hole) CH26 penetrating the first and second interlayer insulating layers ILD1 and ILD2.

One end of the third connection electrode CNL3 may be connected to the second power line PL2 through a twenty-first contact opening (e.g., a twenty-first contact hole) CH21 penetrating the third interlayer insulating layer ILD3, and the other end of the third connection electrode CNL3 may be electrically connected to the second lower electrode LE2 through the twenty-sixth contact opening CH26. Because the third connection electrode CNL3 is connected to the second power line PL2, the second driving power source VSS applied to the second power line PL2 may be transferred to the second lower electrode LE2 through the third connection electrode CNL3.

The second upper electrode UE2 may overlap the second lower electrode LE2 and may cover the second lower electrode LE2 when viewed on a plane. The overlapping area of the second upper electrode UE2 and the second lower electrode LE2 are widened so that the capacitance of the second capacitor C2 may be increased. The second upper electrode UE2 may be connected to the second connection electrode CNL2 through a ninth contact opening (e.g., a ninth contact hole) CH9 penetrating the second interlayer insulating layer ILD2.

Next, components included in the alignment unit 145 according to an embodiment of the present disclosure will be further described.

The alignment unit 145 may include first to third switches SW1, SW2, and SW3. In an embodiment of the present disclosure, the first to third switches SW1, SW2, and SW3 included in the alignment unit 145 may be configured as the same type of switch elements (e.g., transistors). Also, the first to third switches SW1, SW2, and SW3 may be configured as transistors having the same type as the first to seventh transistors T1-T7 included in the pixel circuit 144 (e.g., P-type transistors).

The first switch SW1 may include a (1-1)th terminal SW1_1, a (1-2)th terminal SW1_2, a first switch gate electrode GE_SW1, and a first switch active pattern ACT_SW1.

The first switch active pattern ACT_SW1, the (1-1)th terminal SW1_1, and the (1-2)th terminal SW1_2 may be formed of a semiconductor layer undoped or doped with an impurity. For example, the (1-1)th terminal SW1_1 and the (1-2)th terminal SW1_2 may be formed of a semiconductor layer doped with the impurity, and the first switch active pattern ACT_SW1 may be formed of a semiconductor layer undoped with the impurity (e.g., an undoped semiconductor layer).

The first switch gate electrode GE_SW1 may be connected to the control signal line CSi. The first switch gate electrode GE_SW1 may be a portion of the control signal line CSi or may be a shape protruding from the control signal line CSi.

The switch active pattern ACT_SW1 may extend along the second direction DR2 and may overlap the first switch gate electrode GE_SW1 when viewed on a plane.

One end of the (1-1)th terminal SW1_1 may be connected to the first switch active pattern ACT_SW1, and the other end of the (1-1)th terminal SW1_1 may be connected to a first protrusion electrode PRP1 through a thirteenth contact opening (e.g., a thirteenth contact hole) CH13 penetrating the gate insulating layer GI and the first and second interlayer insulating layers ILD1 and ILD2. One end of the (1-2)th terminal SW1_2 may be connected to the first switch active pattern ACT_SW1, and the other end of the (1-2)th terminal SW1_2 may be connected to a first bridge pattern BRP1 through a twenty-third contact opening (e.g., a twenty-third contact hole) CH23 penetrating the gate insulating layer GI and the first and second interlayer insulating layers ILD1 and ILD2.

In an embodiment of the present disclosure, when the first switch SW1 is a transistor, any one of the (1-1)th and (1-2)th terminals SW1_1 and SW1_2 may be a source electrode, and the other of the (1-1)th and (1-2)th terminals SW1_1 and SW1_2 may be a drain electrode.

The first protrusion electrode PRP1 may have a shape protruding along the first direction DR1 from the third power line PL3 and may be integrally formed (or provided) with the third power line PL3. For example, the first protrusion electrode PRP1 may be a portion of the third power line PL3. Accordingly, the other electrode of the (1-1)th terminal SW1_1 may be connected to the third power line PL3 by the first protrusion electrode PRP1.

One end of the first bridge pattern BRP1 may be connected to the (1-2)th terminal SW1_2 of the first switch SW1 through the twenty-third contact opening CH23, and the other end of the first bridge pattern BRP1 may be connected to the third shielding electrode line SDL3 through a fifteenth contact opening (e.g., a fifteenth contact hole) CH15 penetrating the third interlayer insulating layer ILD3.

The third shielding electrode line SDL3 may be connected to the first bridge pattern BRP1 through the fifteenth contact opening CH15. Also, the third shielding electrode line SDL3 may be connected to the first electrode EL1 of the display element layer DPL through a sixteenth contact opening (e.g., a sixteenth contact hole) CH16 penetrating the protective layer PSV. The first electrode EL1 may be provided and/or formed on the third shielding electrode line SDL3 with the protective layer PSV interposed therebetween. Accordingly, the first electrode EL1 may overlap the third shielding electrode line SLD3 when viewed on a plane.

In an embodiment of the present disclosure, the third shielding electrode line SDL3 may be disposed on the third interlayer insulating layer ILD3 to prevent alignment and/or driving of the light emitting elements LD from being influenced by (or from being substantially influenced by) an electric field induced from components included in the pixel circuit 144, such as the first to seventh transistors T1-T7, etc.

In an embodiment of the present disclosure, the third shielding electrode line SDL3 may include an extension electrode ETP extending in the first direction DR1. The extension electrode ETP may be provided in the same layer as the third shielding electrode line SDL3 and may include the same (or substantially the same) material as the third shielding electrode line SDL3. For example, the extension electrode ETP and the third shielding electrode line SDL3 may be integrally formed to be electrically and/or physically connected to each other. When the extension electrode ETP and the third shielding electrode line SDL3 are integrally provided and/or formed, the extension electrode ETP may be one region of the third shielding electrode line SDL3.

The second switch SW2 may include a (2-1)th terminal SW2_1, a (2-2)th terminal SW2_2, a second switch gate electrode GE_SW2, and a second switch active pattern ACT_SW2.

In an embodiment of the present disclosure, when the second switch SW2 is a transistor, any one of the (2-1)th and (2-2)th terminals SW2_1 and SW2_2 may be a source electrode, and the other of the (2-1)th and (2-2)th terminals SW2_1 and SW2_2 may be a drain electrode.

The second switch active pattern ACT_SW2, the (2-1)th terminal SW2_1, and the (2-2)th terminal SW2_2 may be formed of a semiconductor layer undoped or doped with an impurity. For example, the (2-1)th terminal SW2_1 and the (2-2)th terminal SW2_2 may be formed of a semiconductor layer doped with the impurity, and the second switch active pattern ACT_SW2 may be formed of a semiconductor layer undoped with the impurity.

The second switch gate electrode GE_SW2 may be connected to the control signal line CSi. The second switch gate electrode GE_SW2 may be a portion of the control signal line CSi or may be a shape protruding from the control signal line CSi.

The second switch active pattern ACT_SW2 may extend along the second direction DR2 and may overlap the second switch gate electrode GE_SW2 when viewed on a plane.

One end of the (2-1)th terminal SW2_1 may be connected to the second switch active pattern ACT_SW2, and the other of the (2-1)th terminal SW2_1 may be connected to the first protrusion electrode PRP1 through a fourteenth contact opening (e.g., a fourteenth contact hole) CH14 penetrating the gate insulating layer GI and the first and second interlayer insulating layers ILD1 and ILD2. One end of the (2-2)th terminal SW2_2 may be connected to the second switch active pattern ACT_SW2, and the other end of the (2-2)th terminal SW2_2 may be connected to a second bridge pattern BRP2 through a twenty-fourth contact opening (e.g., a twenty-fourth contact hole) CH24 penetrating the gate insulating layer GI and the first and second interlayer insulating layers ILD1 and ILD2.

One end of the second bridge pattern BRP2 may be connected to the (2-2)th terminal SW2_2 through the twenty-fourth contact opening CH24, and the other end of the second bridge pattern BRP2 may be connected to the first shielding electrode line SDL1 through a seventeenth contact opening (e.g., a seventeenth contact hole) CH17 penetrating the third interlayer insulating layer ILD3.

The first shielding electrode line SDL1 may be connected to the second bridge pattern BRP2 through the seventeenth contact opening CH17. Also, the first shielding electrode line SDL1 may be connected to the second conductive line CL2 of the display element layer DPL through an eighteenth contact opening (e.g., an eighteenth contact hole) CH18 penetrating the protective layer PSV. The second conductive line CL2 may be provided and/or formed on the first shielding electrode line SDL1 with the protective layer PSV interposed therebetween. Accordingly, the second conductive line CL2 may overlap the first shielding electrode line SDL1 when viewed on a plane.

Similar to the third shielding electrode line SDL3, the first shielding electrode line SDL1 may be disposed on the third interlayer insulating layer ILD3 to prevent alignment and/or driving of the light emitting elements LD from being influenced (or from being substantially influenced) by an electric field induced from components included in the pixel circuit 144.

The third switch SW3 may include a (3-1)th terminal SW3_1, a (3-2)th terminal SW3_2, a third switch gate electrode GE_SW3, and a third switch active pattern ACT_SW3.

In an embodiment of the present disclosure, when the third switch SW3 is a transistor, any one of the (3-1)th and (3-2)th terminals SW3_1 and SW3_2 may be a source electrode, and the other of the (3-1)th and (3-2)th terminals SW3_1 and SW3_2 may be a drain electrode.

The third switch active pattern ACT_SW3, the (3-1)th terminal SW3_1, and the (3-2)th terminal SW3_2 may be formed of a semiconductor layer undoped or doped with an impurity. For example, the (3-1)th terminal SW3_1 and the (3-2)th terminal SW3_2 may be formed of a semiconductor layer doped with the impurity, and the third switch active pattern ACT_SW3 may be formed of a semiconductor layer undoped with the impurity.

The third switch gate electrode GE_SW3 may be connected to the control signal line CSi. The third switch gate electrode GE_SW3 may be a portion of the control signal line CSi or may be a shape protruding from the control signal line CSi.

The third switch active pattern ACT_SW3 may extend along the second direction DR2 and may overlap the third switch gate electrode GE_SW3 when viewed on a plane.

One end of the (3-1)th terminal SW3_1 may be connected to the third switch active pattern ACT_SW3, and the other of the (3-1)th terminal SW3_1 may be connected to a fourth bridge pattern BRP4 through a twelfth contact opening (e.g., a twelfth contact hole) CH12 penetrating the gate insulating layer GI and the first and second interlayer insulating layers ILD1 and ILD2. One end of the (3-2)th terminal SW3_2 may be connected to the third switch active pattern ACT_SW3, and the other end of the (3-2)th terminal SW3_2 may be connected to a third bridge pattern BRP3 through a twenty-fifth contact opening (e.g., a twenty-fifth contact hole) CH25 penetrating the gate insulating layer GI and the first and second interlayer insulating layers ILD1 and ILD2.

One end of the third bridge pattern BRP3 may be connected to the (3-2)th terminal SW3_2 through the twenty-fifth contact opening CH25, and the other end of the third bridge pattern BRP3 may be connected to the second shielding electrode line SDL2 through a nineteenth contact opening (e.g., a nineteenth contact hole) CH19 penetrating the third interlayer insulating layer ILD3.

The second shielding electrode line SDL2 may be disposed between the first and third shielding electrode lines SDL1 and SDL3 when viewed on a plane and spaced apart from each of the first and third shielding electrode lines SDL1 and SDL3. The second shielding electrode line SDL2 may be connected to the third bridge pattern BRP3 through the nineteenth contact opening CH19. Also, the second shielding electrode line SDL2 may be connected to the first conductive line CL1 of the display element layer DPL through a twentieth contact opening (e.g., a twentieth contact hole) CH20 penetrating the protective layer PSV. The first conductive line CL1 may be provided and/or formed on the second shielding electrode line SDL2 with the protective layer PSV interposed therebetween. Accordingly, the first conductive line CL1 may overlap the second shielding electrode line SDL2 when viewed on a plane.

Similar to the first and third shielding electrode lines SDL1 and SDL3, the second shielding electrode line SDL2 may be disposed on the third interlayer insulating layer ILD3 to prevent alignment and/or driving of the light emitting elements LD from being influenced (or from being substantially influenced) by an electric field induced from components included in the pixel circuit 144.

The fourth bridge pattern BRP4 may have a shape extending along the first direction DR1. One end of the fourth bridge pattern BRP4 may be connected to the (3-1)th terminal SW3_1 through the twelfth contact opening CH12 penetrating the gate insulating layer GI and the first and second interlayer insulating layers ILD1 and ILD2. The other end of the fourth bridge pattern BRP4 may be connected to the second power line PL2 through an eleventh contact opening (e.g., an eleventh contact hole) CH11 penetrating the third interlayer insulating layer ILD3.

The second power line PL2 may be connected to the fourth bridge pattern BRP4 through the eleventh contact opening CH11. Also, the second power line PL2 may be electrically connected to the second electrode EL2 of the display element layer DPL through a tenth contact opening (e.g., a tenth contact hole) CH10 penetrating the protective layer PSV.

The second electrode EL2 may be provided and/or formed on the second power line PL2 with the protective layer PSV interposed therebetween. Accordingly, the second electrode EL2 may overlap the second power line PL2 when viewed on a plane.

In an embodiment of the present disclosure, the first to seventh transistors T1-T7 and the first to third switches SW1-SW3, which are provided in the pixel PXL, may be LTPS thin film transistors, but the present disclosure is not limited thereto. In some embodiments, the first to seventh transistors T1-T7 and the first to third switches SW1-SW3 may be oxide semiconductor thin film transistors.

In an embodiment of the present disclosure, the first to third switches SW1-SW3 maintain a turn-off state (e.g., an off state) after the alignment of the light emitting elements LD in the light emitting area EMA of the pixel PXL is completed.

The protective layer PSV may be disposed over the first to seventh transistors T1-T7 and the first to third switches SW1-SW3 to cover the first to seventh transistors T1-T7 and the first to third switches SW1-SW3.

The protective layer PSV may include an inorganic insulating layer and an organic insulating layer disposed on the inorganic insulating layer. The inorganic insulating layer may include one or more of silicon oxide ($SiO_x$) and silicon nitride ($SiN_x$). The organic insulating layer may include an organic insulating material that enables light to be transmitted therethrough (e.g., a transparent organic insulating material). For example, the organic insulating layer may include one or more of photoresist, polyacrylate resin, epoxy resin, phenolic resin, polyamide resin, polyimide resin, unsaturated polyester resin, poly-phenylene ether resin, poly-phenylene sulfide resin, and benzocyclobutene resin.

Next, the display element layer DPL included in the pixel PXL will be further described.

The display element layer DPL may include first banks PW, the first and second electrodes EL1 and EL2, the first and second conductive lines CL1 and CL2, a second bank BNK, a plurality of light emitting devices LD, and a contact electrode CNE, which are provided on the protective layer PSV.

The first bank PW may be provided on the protective layer PSV in the light emitting area EMA of the pixel PXL. The first bank PW may include an inorganic insulating layer made of (or including) an inorganic material or an organic insulating layer made of (or including) an organic material. In some embodiments, the first bank PW may include a single organic insulating layer and/or a single inorganic insulating layer, but the present disclosure is not limited thereto. In an example, the first bank PW may have a multi-layer structure in which a plurality of organic insulating layers and a plurality of inorganic insulating layers are stacked.

The first bank PW may have a trapezoidal cross-section having a width that narrows as it approaches upward from one surface of the protective layer PSV as shown in FIG. 5, but the present disclosure is not limited thereto. In some embodiments, the first bank PW may include a curved surface having a section of a semi-ellipse, a semicircular, etc., which has a width that narrows as it approaches upward from one surface of the protective layer PSV as shown in FIG. 6. When viewed on a section, the shape of the first bank PW is not limited to the above-described embodiments and may be variously, suitably modified within a range in which the efficiency of light emitted from each of the light emitting elements LD can be improved.

The second bank BNK may be disposed in a peripheral area (e.g., a non-emission area in which the light emitting devices LD are not aligned) of a pixel PXL to surround the light emitting area EMA of the corresponding pixel PXL. The second bank BNK is a structure defining the light emitting area EMA of the pixel PXL and may be, for example, a pixel defining layer. The second bank BNK may include one or more of a light blocking material and/or a reflective material to prevent or reduce light leakage where light is leaked between adjacent pixels PXL. In some embodiments, a reflective material layer may be formed on the second bank BNK to further improve the efficiency of the light emitted from the pixel PXL. The second bank BNK may be formed and/or provided in a layer different from that of the first bank PW, but the present disclosure is not limited thereto. In some embodiments, the second bank BNK may be formed and/or provided in the same layer as the first bank PW. When the second bank BNK is formed and/or provided on the same plane as the first bank PW, the second bank BNK and the first bank PW may include the same (or substantially the same) material, but the present disclosure is not limited thereto. In some embodiments, the second bank BNK and the first bank PW may include different materials.

Each of the first and second electrodes EL1 and EL2 may be provided in the light emitting area EMA of the pixel PXL and may extend along the second direction DR2.

In an embodiment of the present disclosure, the first electrode EL1 may include the second protrusion electrode PRP2 protruding in the first direction DR1. The second protrusion electrode PRP2 may be provided in the same layer as the first electrode EL1 and may include the same (or substantially the same) material as the first electrode EL1. For example, the second protrusion electrode PRP2 and the first electrode EL1 may be integrally provided (or formed) to be electrically and/or physically connected to each other. When the second protrusion electrode PRP2 and the first electrode EL1 are integrally formed and/or provided, the second protrusion electrode PRP2 may be one region of the first electrode EL1.

The first electrode EL1 may be electrically connected to the second protrusion electrode PRP2 and the extension electrode ETP extending through the twenty-second contact opening CH22. The extension electrode ETP may be connected each of the sixth drain electrode DE6 of the sixth transistor T6 and the seventh source electrode SE7 of the seventh transistor T7 in the pixel circuit layer PCL through the eighth contact opening CH8 and the second connection electrode CNL2. Accordingly, the first electrode EL1 may be connected to the sixth drain electrode DE6 of the sixth transistor T6 and the seventh source electrode SE7 of the seventh transistor T7 through the second protrusion electrode PRP2, the extension electrode ETP, and the second connection electrode CNL2.

Also, the first electrode EL1 may be electrically connected to the third shielding electrode line SDL3 through the sixteenth contact opening CH16. As described above, the third shielding electrode line SDL3 may be connected to the first bridge pattern BRP1 through the fifteenth contact opening CH15, and the first bridge pattern BRP1 may be connected to the (1-2)th terminal SW1_2 of the first switch SW1 included in the pixel circuit layer PCL through the twenty-third contact opening CH23. When a control signal having a voltage at which the first switch SW1 can be turned on is supplied to the first switch gate electrode GE_SW1 of the first switch SW1 through the control signal line CSi, the first switch SW1 may be turned on. When the first switch SW1 is turned on, the third shielding electrode line SDL3 may be connected to the first protrusion electrode PRP1 of the third power line PL3 through the first bridge pattern PRP1. Accordingly, the first electrode EL1 may be electrically connected to the third power line PL3 when the first switch SW1 is turned on.

The second electrode EL2 may be connected to the second power line PL2 through the tenth contact opening CH10. As described above, the second power line PL2 may be connected to the fourth bridge pattern BRP4 through the eleventh contact opening CH11, and the fourth bridge pattern BRP4 may be connected to the (3-1)th terminal SW3_1 of the third switch SW3 included in the pixel circuit layer PCL through the twelfth contact opening CH12. When a control signal having a voltage at which the third switch SW3 can be turned on is supplied to the third switch gate electrode GE_SW3 of the third switch SW3 through the control signal line CSi, the third switch SW3 may be turned on so that the second power line PL2 may be connected to the first conductive line CL1 through the third bridge pattern BRP3. Accordingly, the second electrode EL2 may be electrically connected to the first conductive line CL1 when the third switch SW3 is turned on.

The first conductive line CL1 may extend along the second direction DR2 and may be disposed between the first electrode EL1 and the second conductive line CL2 when viewed on a plane. As described above, the first conductive line CL1 may be electrically connected to the second electrode EL2 when the third switch SW3 is turned on.

When the third switch SW3 is turned off, the first conductive line CL1 may be electrically separated from the second electrode EL2 and may be in the floating state.

The second conductive line CL2 may extend along the second direction DR2 and may be disposed between the second electrode EL2 and the first conductive line CL1 when viewed on a plane. The second conductive line CL2 may be connected to the first shielding electrode line SDL1 through the eighteenth contact opening CH18.

As described above, the first shielding electrode line SDL1 may be connected to the second bridge pattern BRP2 through the seventeenth contact opening CH17, and the second bridge pattern BRP2 may be connected to the (2-2)th terminal SW2_2 of the second switch SW2 included in the pixel circuit layer PCL through the twenty-fifth contact opening CH25. When a control signal having a voltage at which the second switch SW2 can be turned on is supplied to the second switch gate electrode GE_SW2 of the second switch SW2 through the control signal line CSi, the second switch SW2 may be turned on so that the second bridge pattern BRP2 may be electrically connected to the first protrusion electrode PRP1 of the third power line PL3. Further, the second conductive line CL2 may be connected to the third power line PL3 and the first electrode EL1 when the second switch SW is turned on.

When the second switch SW2 is turned off, the second conductive line CL2 may be electrically separated from the first electrode EL1 and may be in the floating state.

In an embodiment of the present disclosure, before the light emitting elements LD are aligned in the light emitting area EMA of the pixel PXL, each of the first and second electrodes EL1 and EL2 and the first and second conductive lines CL1 and CL2 may be electrically connected to the alignment unit 145 to act as an alignment electrode (or alignment line) for aligning the light emitting elements LD.

Before the light emitting elements LD are aligned in the light emitting area EMA of the pixel PXL, the first to third switches SW1-SW3 are concurrently (e.g., simultaneously) turned on.

When the first to third switches SW1-SW3 are turned on, the first electrode EL1 and the second conductive line CL2 are electrically connected to each other. Also, the first electrode EL1 and the second conductive line CL2 are connected to the third power line PL3, to which the ground voltage GND is applied, so that the ground voltage GND can be transferred to each of the first electrode EL1 and the second conductive line CL2.

When the first to third switches SW1-SW3 are turned on, the second electrode EL2 and the first conductive line CL1 are electrically connected to each other, and the second electrode EL2 and the first conductive line CL1 are connected to the second power line PL2. An alignment voltage (e.g., an AC voltage) is applied to the second power line PL2. Therefore, the alignment voltage may be transferred to each of the second electrode EL2 and the first conductive line CL1.

Accordingly, electric fields may be respectively formed between the first electrode EL1 and the first conductive line CL1, between the first conductive line CL1 and the second conductive line CL2, and between the second conductive line CL2 and the second electrode EL2. Light emitting elements LD may be respectively aligned by the electric fields on the pixel circuit layer PCL between the first electrode EL1 and the first conductive line CL1, on the pixel circuit layer PCL between the first conductive line CL1 and the second conductive line CL2, and on the pixel circuit layer between the second conductive line CL2 and the second electrode EL2.

After the light emitting elements LD are aligned in the light emitting area EMA of the pixel PXL, each of the first and second electrodes EL1 and EL2 may act as a driving electrode (or driving line) for driving the light emitting elements LD. After the light emitting elements LD are aligned in the light emitting area EMA of the pixel PXL, the first to third switches SW1-SW3 maintain the turn-off state (e.g., are maintained in an off state), and the second driving power source VSS is applied to the second power line PL2.

The first and second electrodes EL1 and EL2 may be made of a material having a constant (or substantially constant) reflexibility such that light emitted from both end portions EP1 and EP2 of each of the light emitting elements LD advances in a direction (e.g., a front direction) in which an image is displayed on the display device. In an embodiment of the present disclosure, the first and second electrodes EL1 and EL2, the first conductive line CL1, and the second conductive line CL2 may be provided in the same layer and may be made of the same (or substantially the same) material.

The first and second electrodes EL1 and EL2, the first conductive line CL1, and the second conductive line CL2 may be made of (or may include) a conductive material having a constant reflexibility. The conductive material may include a metal, such as silver (Ag), magnesium (Mg), aluminum (Al), platinum (Pt), palladium (Pd), gold (Au), nickel (Ni), neodymium (Nd), iridium (Ir), chromium (Cr), or any alloy thereof, a conductive oxide, such as indium tin oxide (ITO), indium zinc oxide (IZO), zinc oxide (ZnO), or indium tin zinc oxide (ITZO), a conductive polymer, such as PEDOT, and the like. The material of the first and second electrodes EL1 and EL2, the first conductive line CL1, and the second conductive line CL2 is not limited to the above-described materials.

Also, the first and second electrodes EL1 and EL2, the first conductive line CL1, and the second conductive line CL2 may be formed in a single layer. However, the present disclosure is not limited thereto, and the first and second electrodes EL1 and EL2, the first conductive line CL1, and the second conductive line CL2 may be formed as multi-layer structures in which a plurality of materials from among metals, alloys, conductive oxides, and conductive polymers are stacked. In some embodiments, each of the first and second electrodes EL1 and EL2, the first conductive line CL1, and the second conductive line CL2 may be multi-layer structures to reduce or minimize a voltage drop caused by a signal delay when a signal is transferred to both of the end portions EP1 and EP2 of each of the light emitting elements LD.

Because each of the first and second electrodes EL1 and EL2 has a shape corresponding to that of the first bank PW, light emitted from both of the end portions EP1 and EP2 of each of the light emitting elements LD are reflected by the first and second electrodes EL1 and EL2 to further advance light in the front direction of the display device. Thus, the efficiency of light emitted from each of the light emitting elements LD may be improved.

In an embodiment of the present disclosure, each of the first bank PW, the first and second electrodes EL1 and EL2, the first conductive line CL1, and the second conductive line CL2 may act as a reflective member that induces light emitted from each of the light emitting elements LD in a desired direction to improve the light efficiency of the display device. For example, each of the first bank PW, the first and second electrodes EL1 and EL2, the first conductive line CL1, and the second conductive line CL2 may act as a reflective member that allows light emitted from each of the light emitting elements LD to advance in the front direction of the display device to improve the light output efficiency of the light emitting elements LD.

Any one of the first electrode EL1 and the second electrode EL2 may be an anode electrode, and the other of the first electrode EL1 and the second electrode EL2 may be a cathode electrode. In an embodiment of the present disclosure, the first electrode EL1 may be the anode electrode, and the second electrode EL2 may be the cathode electrode.

Each of the light emitting elements LD may be a micro light emitting diode that has a size small on a micro- or nano-scale that uses (or has) an inorganic crystal structure.

The light emitting elements LD may be aligned between the first electrode EL1 and the second electrode EL2 in the pixel PXL.

A plurality of (e.g., from about two to a few ten) light emitting elements LD may be provided in the light emitting area EMA of the pixel PXL, but the present disclosure is not limited thereto. In some embodiments, the number of light emitting elements LD provided in the pixel PXL may be variously, suitably modified.

Each of the light emitting elements LD may include a light emitting stack structure in which a first semiconductor layer 11, an active layer 12, a second semiconductor layer 13, and an electrode layer 15 are sequentially stacked along the length direction thereof. Also, each of the light emitting elements LD may further include an insulative film 14 surrounding the outer circumference of the light emitting stack structure.

In an embodiment of the present disclosure, each of the light emitting elements LD may have a cylindrical column shape. Each light emitting element LD may include a first end portion EP1 corresponding to any one of a lower portion and an upper portion of the cylindrical column and a second end portion EP2 corresponding to the other of the lower portion and the upper portion of the cylindrical column. Any one of the first semiconductor layer 11 and the second semiconductor layer 13 may be disposed at the first end portion EP1 of each light emitting element LD, and the other of the first semiconductor layer 11 and the second semiconductor layer 13 may be disposed at the second end portion EP1 of each light emitting element LD.

In an embodiment of the present disclosure, each of the light emitting elements LD may emit any one of colored light and/or white light. Each of the light emitting elements LD may be aligned between the first electrode EL1 and the second electrode EL2 such that its length direction is parallel (or substantially parallel) to the first direction DR1. For example, some of the light emitting elements LD may be aligned between the first electrode EL1 and the first conductive line CL1, others of the light emitting elements LD may be aligned between the first conductive line CL1 and the second conductive line CL2, and the others of the light emitting elements LD may be aligned between the second conductive line CL2 and the second electrode EL2.

A first insulating layer INS1 may be provided between each of the light emitting elements LD and the protective layer PSV.

The first insulating layer INS1 may be formed and/or provided at a lower portion of each of the light emitting elements LD between the first electrode EL1 and the second electrode EL2 in the light emitting area EMA of the pixel PXL. In the light emitting area EMA of the pixel PXL, the first insulating layer INS1 may fill a space between each of the light emitting elements LD and the protective layer PSV to stably support the light emitting elements LD and prevent (or reduce the risk of) the light emitting elements LD from being separated from the protective layer PSV.

Also, in the light emitting area EMA of the pixel PXL, the first insulating layer INS1 may expose one region of the first electrode EL1 and cover the other region except the one region to protect the other region of the first electrode EL1. Also, the first insulating layer INS1 may expose one region of the second electrode EL2 and cover the other region except the one region to protect the other region of the second electrode EL2. Also, the first insulating layer INS1 may expose one region of the first conductive line CL1 and cover the other region except the one region to protect the other region of the first conductive line CL1. Additionally, the first insulating layer INS1 may expose one region of the second conductive line CL2 and cover the other region except the one region to protect the other region of the second conductive line CL2.

In addition, the first insulating layer INS1 may be formed and/or provided on the protective layer in a peripheral area (e.g., a non-emission area in which no light is emitted) of the pixel PXL to protect components disposed in the peripheral area.

The first insulating layer INS1 may include an inorganic insulating layer made of (or including) an inorganic material or an organic insulating layer made of (or including) an organic material. In an embodiment of the present disclosure, the first insulating layer INS1 may be formed of an inorganic insulating layer to protect the light emitting elements LD from the pixel circuit layer PCL, but the present disclosure is not limited thereto. In some embodiments, the first insulating layer INS1 may be formed of an organic insulating layer to planarize a supporting surface of the light emitting elements LD.

A second insulating layer INS2 may be provided and/or formed on each of the light emitting elements LD. The second insulating layer INS2 may be provided on each light emitting element LD to cover a partial surface of (e.g., to partially cover) the light emitting element LD while exposing both of the end portions EP1 and EP2 of the light emitting element LD to the outside. The second insulating layer INS2 may be formed as an independent pattern on the light emitting area EMA of the pixel PXL, but the present disclosure is not limited thereto. In some embodiments, the second insulating layer INS2 may be omitted. Contact electrodes CNE electrically separated from each other may directly contact both of the end portions EP1 and EP2 of each light emitting element LD, respectively.

The second insulating layer INS2 may be a single layer or may have a multi-layer structure and may include an inorganic insulating layer including one or more inorganic material(s) or an organic insulating layer including one or more organic material(s). The second insulating layer INS2 may fix each of the light emitting elements LD aligned in the light emitting area EMA of the pixel PXL. In an embodiment of the present disclosure, the second insulating layer INS2 may include an inorganic insulating layer for protecting the active layer 12 of each light emitting element LD from external oxygen and moisture. However, the present disclosure is not limited thereto. The second insulating layer INS2 may include an organic insulating layer including an organic material according to a design condition of the display device.

In an embodiment of the present disclosure, the second insulating layer INS2 is formed over the light emitting elements LD after the alignment of the light emitting elements LD in the light emitting area EMA of the pixel PXL is completed so that the light emitting elements LD may not be separated (or moved) from the positions at which the light emitting elements LD are aligned. When a separation space exists between the first insulating layer INS1 and the light emitting elements LD before the second insulating layer INS2 is formed, the second insulating layer INS2 may fill in the separation space in the process of forming the second insulating layer INS2. Accordingly, the light emitting elements LD can be stably supported.

In an embodiment of the present disclosure, the second insulating layer INS2 is formed on each of the light emitting elements LD so that the active layer 12 of each light emitting element LD may not contact an external conductive material. The second insulating layer INS2 may cover only a partial surface of each of the light emitting elements LD and may expose the both of the end portions EP1 and EP2 of each light emitting element LD to the outside.

Contact electrodes CNE may be disposed on the first electrode EL1, the second electrode EL2, the first conductive line CL1, and the second conductive line CL2, respectively.

In some embodiments, the contact electrodes CNE may be made of various suitable transparent conductive materials. In an example, the contact electrodes CNE may include one or more various suitable transparent conductive materials including ITO, IZO, and ITZO and may be substantially transparent or translucent to provide a reference (e.g., a predetermined or desired) transmittance. Accordingly, light emitted by the light emitting elements LD through the first and second end portions EP1 and EP2 of the light emitting elements LD are transmitted through the contact electrodes CNE to the outside of the display device.

The contact electrode CNE (hereinafter, referred to as a "first contact electrode") on the first electrode EL1 electrically connects the first electrode EL1 to any one of the end portions EP1 and EP2 of each of the light emitting elements LD aligned between the first electrode EL1 and the first conductive line CL1 (hereinafter, referred to as "first light emitting devices").

The contact electrode CNE (hereinafter, referred to as a "second contact electrode") on the first conductive line CL1 electrically connects the first conductive line CL1 to the other of the end portions EP1 and EP2 of each of the first light emitting elements LD. The second contact electrode CNE electrically connects the first conductive line CL1 that is in the floating state to the other end portion of each of the first light emitting elements LD. Finally, the first conductive line CL1 and the first electrode EL1 are electrically connected to each other.

Also, the second contact electrode CNE electrically connects the first conductive line CL1 to any one of the end portions EP1 and EP2 of each of the light emitting elements LD arranged between the first conductive line CL1 and the second conductive line CL2 (hereinafter, referred to as "second light emitting devices").

The contact electrode CNE (hereinafter, referred to as a "third contact electrode") on the second conductive line CL2 electrically connects the second conductive line CL2 to the other of the end portions EP1 and EP2 of each of the second light emitting elements LD. The third contact electrode CNE electrically connects the second conductive line CL2 that is in the floating state to each of the second light emitting elements LD. Finally, the second conductive line CL2 and the first conductive line CL1 are electrically connected to each other.

Also, the third contact electrode CNE electrically connects the second conductive line CL2 to any one of the end portions EP1 and EP2 of each of the light emitting elements LD aligned between the second conductive line CL2 and the second electrode EL2 (hereinafter, referred to as "third light emitting devices").

The contact electrode CNE (hereinafter, referred to as a "fourth contact electrode") on the second electrode EL2 electrically connects the second electrode EL2 to the other of the end portions EP1 and EP2 of each of the third light emitting elements LD.

The first contact electrode CNE, the second contact electrode CNE, the third contact electrode CNE, and the fourth contact electrode CNE may each have a bar shape extending along the second direction DR2. Each of the first contact electrode CNE, the second contact electrode CNE, the third contact electrode CNE, and the fourth contact electrode CNE may be provided on the pixel circuit layer PCL including the second insulating layer INS2 and may be spaced apart from an adjacent contact electrode CNE at a certain distance on the second insulating layer INS2. The first contact electrode CNE, the second contact electrode CNE, the third contact electrode CNE, and the fourth contact electrode CNE may be provided and/or formed in the same layer. However, the present disclosure is not limited thereto. In some embodiments, the first contact electrode CNE, the second contact electrode CNE, the third contact electrode CNE, and the fourth contact electrode CNE may be formed and/or provided in different layers. This will be described in more detail later with reference to FIG. 10.

A third insulating layer INS3 may be provided and/or formed over the first contact electrode CNE, the second contact electrode CNE, the third contact electrode CNE, and the fourth contact electrode CNE.

The third insulating layer INS3 may be entirely provided and/or formed on the substrate SUB on which the first bank PW, the first and second electrodes EL1 and EL2, the first and second conductive lines CL1 and CL2, the light emitting elements LD, and the contact electrodes CNE are formed to cover the first bank PW, the first and second electrode EL1 and EL2, the first and second conductive lines CL1 and CL2, the light emitting elements LD, and the contact electrodes CNE.

The third insulating layer INS3 allows the first contact electrode CNE, the second contact electrode CNE, the third contact electrode CNE, and the fourth contact electrode CNE to not be exposed to the outside to prevent or reduce corrosion of each of the first contact electrode CNE, the second contact electrode CNE, the third contact electrode CNE, and the fourth contact electrode CNE. The third insulating layer INS3 may be formed of any suitable one of an inorganic insulating layer and an organic insulating layer.

An overcoat layer OC may be provided on the third insulating layer INS3. The overcoat layer OC may be encapsulation layer that reduces a step difference generated by the first bank PW, the first and second electrodes EL1 and EL2, the first and second conductive lines CL1 and CL2, the contact electrode CNE, etc., which are disposed thereunder and may prevent or reduce oxygen and moisture from penetrating into the light emitting elements LD. In some embodiments, the overcoat layer OC may be omitted by considering a design condition of the display device.

As described above, the first light emitting elements LD, the second light emitting elements LD, and the third light emitting elements LD, which are aligned in the light emitting area EMA of the pixel PXL, may be electrically connected to each other between the first electrode EL1 and the second electrode EL2. A reference voltage (e.g., a predetermined voltage) may be applied to both of the end portions EP1 and EP2 of each of the light emitting elements LD aligned in the light emitting area EMA of the pixel PXL through the first electrode EL1 and the second electrode EL2. Accordingly, each of the light emitting elements LD may emit light when electron-hole pairs are combined in their respective active layers 12. The active layer 12 may emit light having a wavelength band of about 400 nm to about 900 nm.

In some embodiments, a capping layer CPL may be formed and/or provided in the light emitting area EMA of the pixel PXL as shown in FIG. 7.

The capping layers CPL may be respectively disposed between the first electrode EL1 and the first contact electrode CNE, between the first conductive line CL1 and the second contact electrode CNE, between the second conductive line CL2 and the third contact electrode CNE, and between the second electrode EL2 and the fourth contact electrode CNE. The capping layer CPL prevents or reduces damage to a corresponding electrode and a corresponding conductive line due to a defect occurring in the manufacturing process of the display device and further reinforces adhesion between the protective layer PSV and each of the corresponding electrode and the corresponding conductive line. The capping layer CPL may be formed of a transparent conductive material, such as indium zinc oxide (IZO), to minimize or reduce loss of light that is emitted from each of the light emitting elements LD and that is then reflected in the display direction of the display device by the corresponding electrode and the corresponding conductive line.

Figure 10:
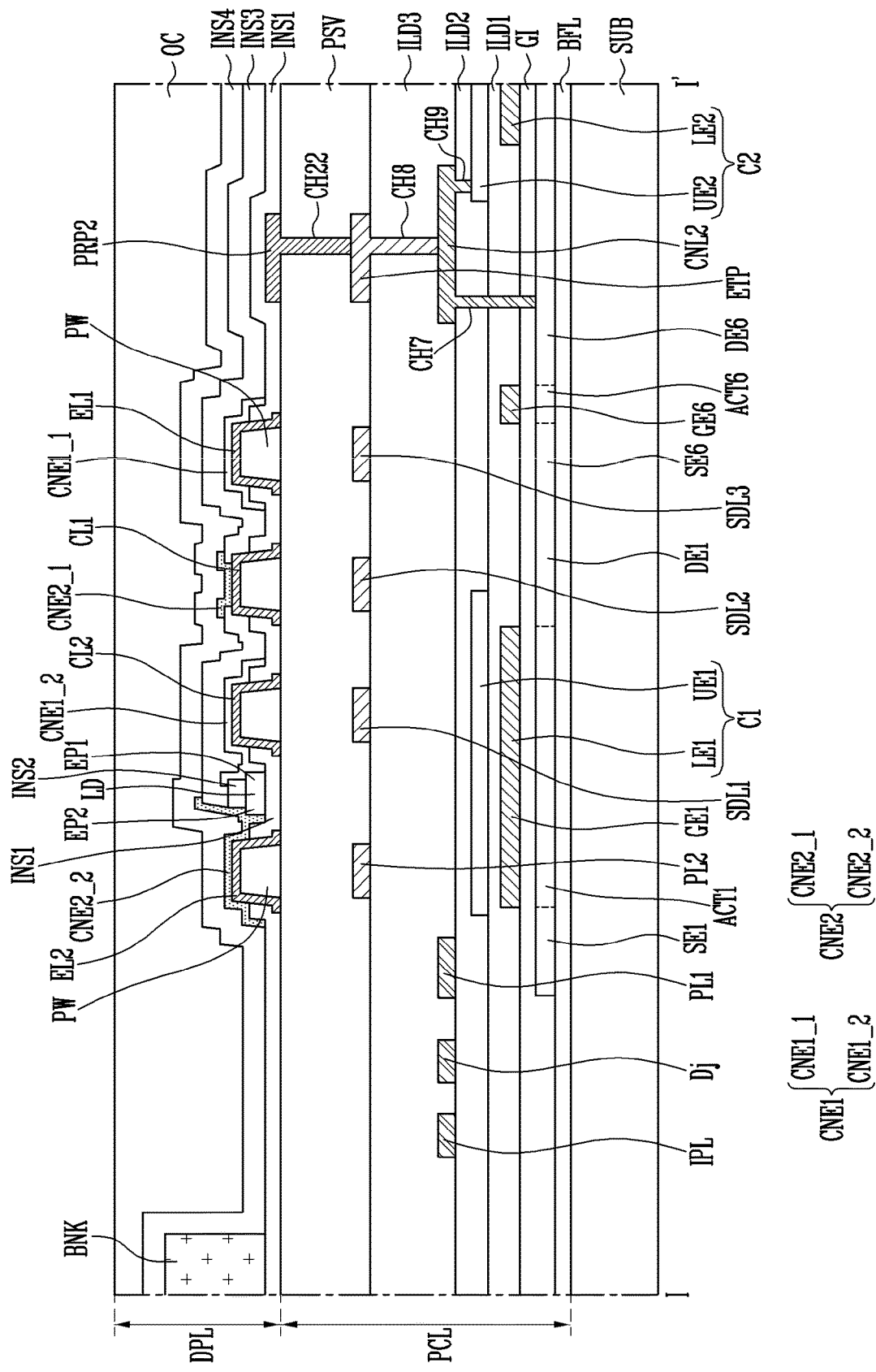
FIG. 10 illustrates a display device according to another embodiment of the present disclosure and is a sectional view corresponding to the line I-I' shown in FIG. 4.
Figure 11A:
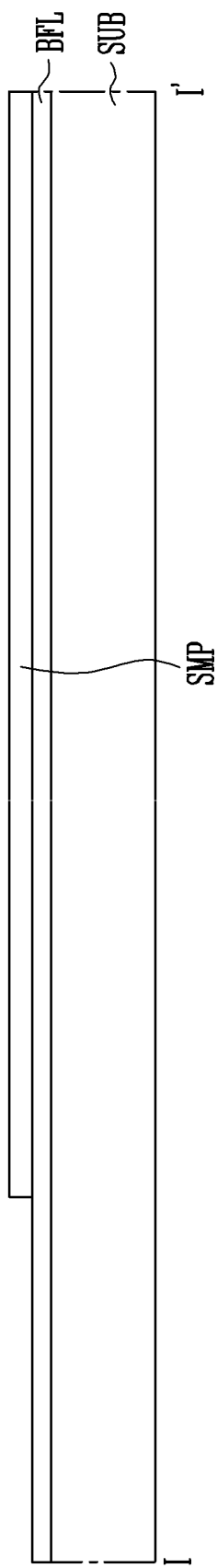
FIGS. 11A-11M are sectional views sequentially illustrating a manufacturing method of the display device shown in FIG. 5.
Figure 11B:
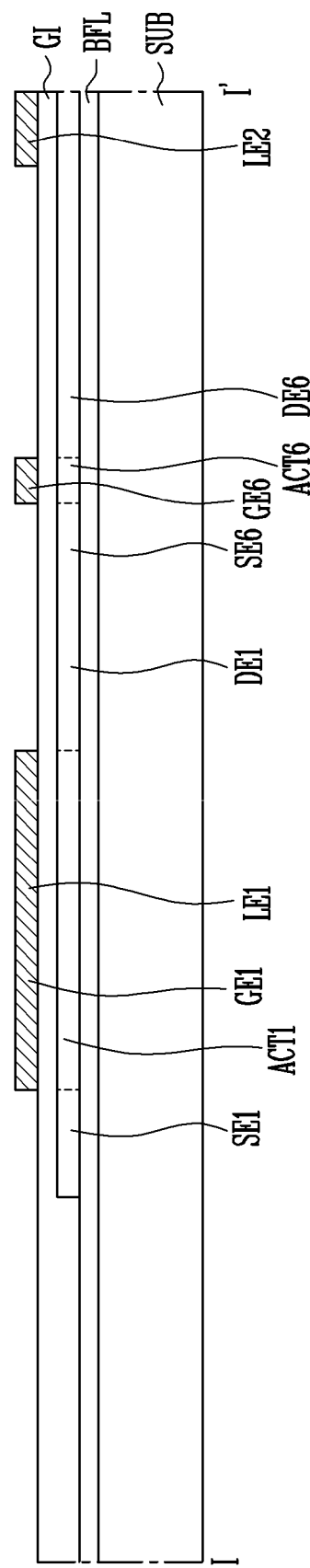
Figure 11C:
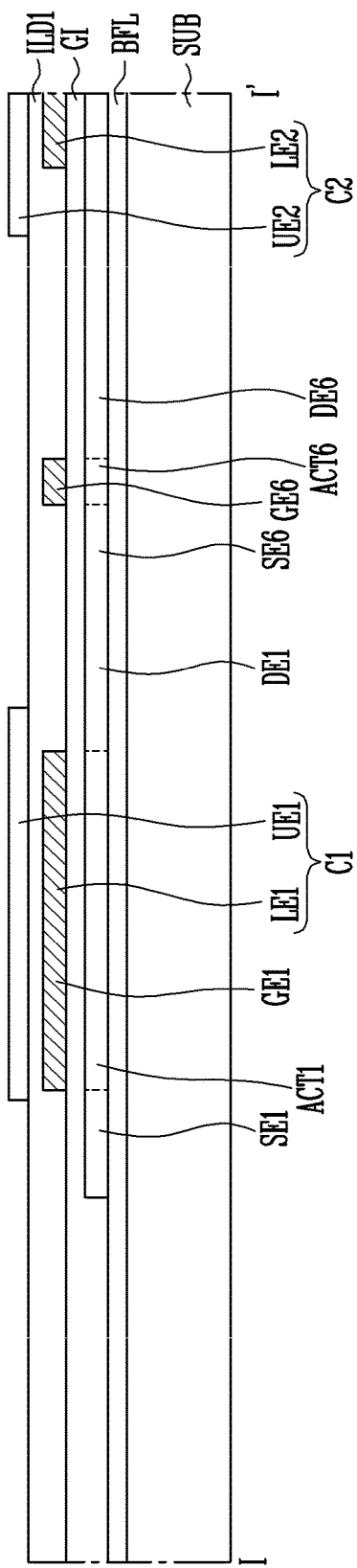
Figure 11D:
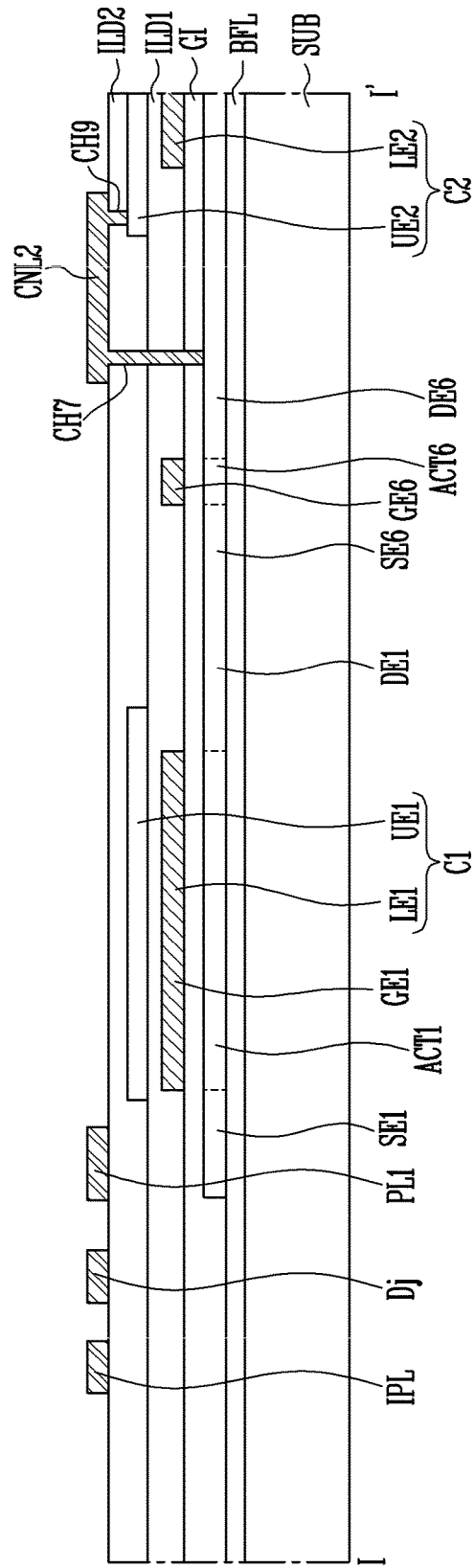
Figure 11E:
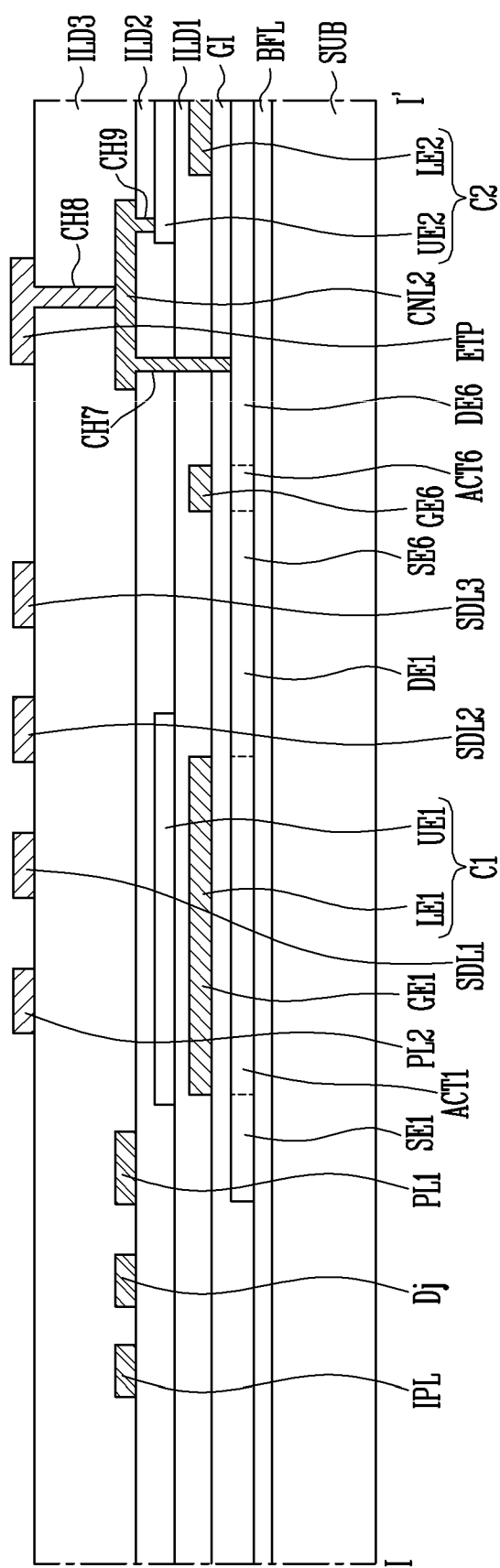
Figure 11F:
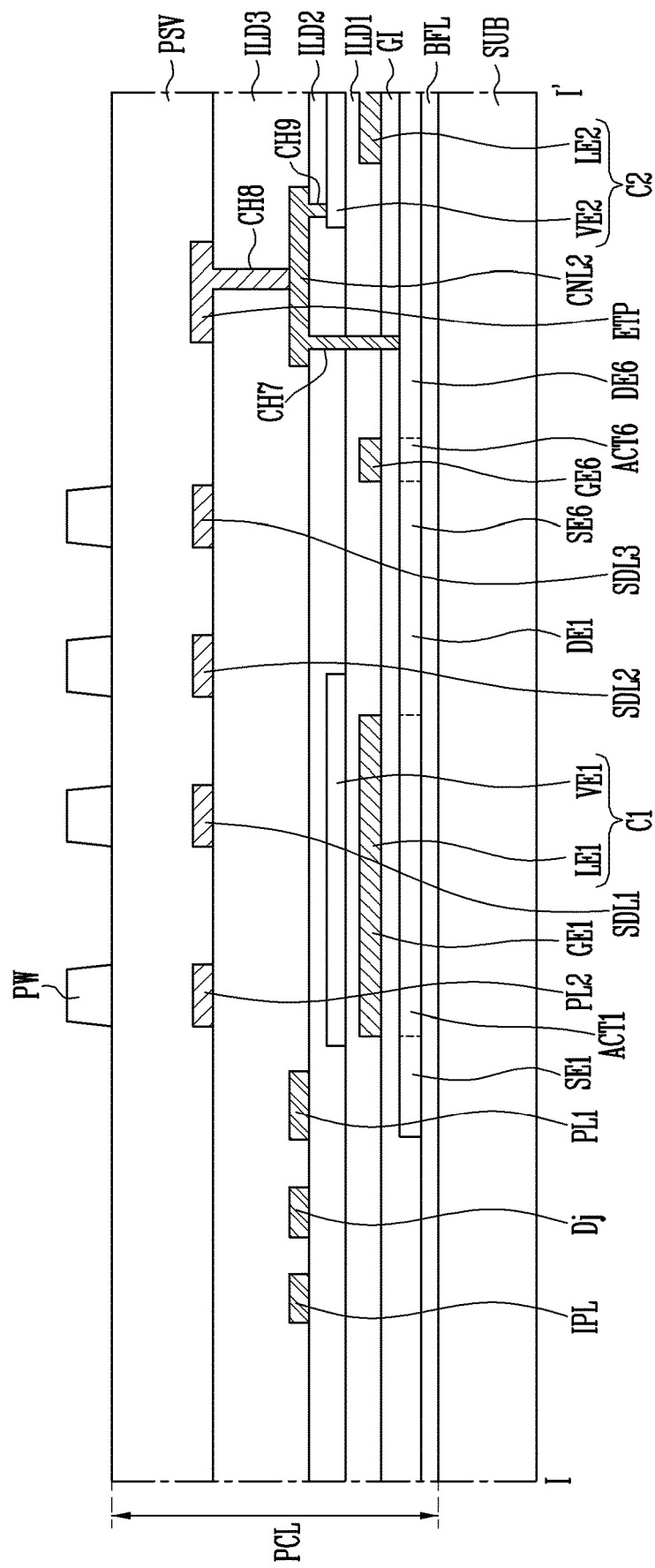
Figure 11G:
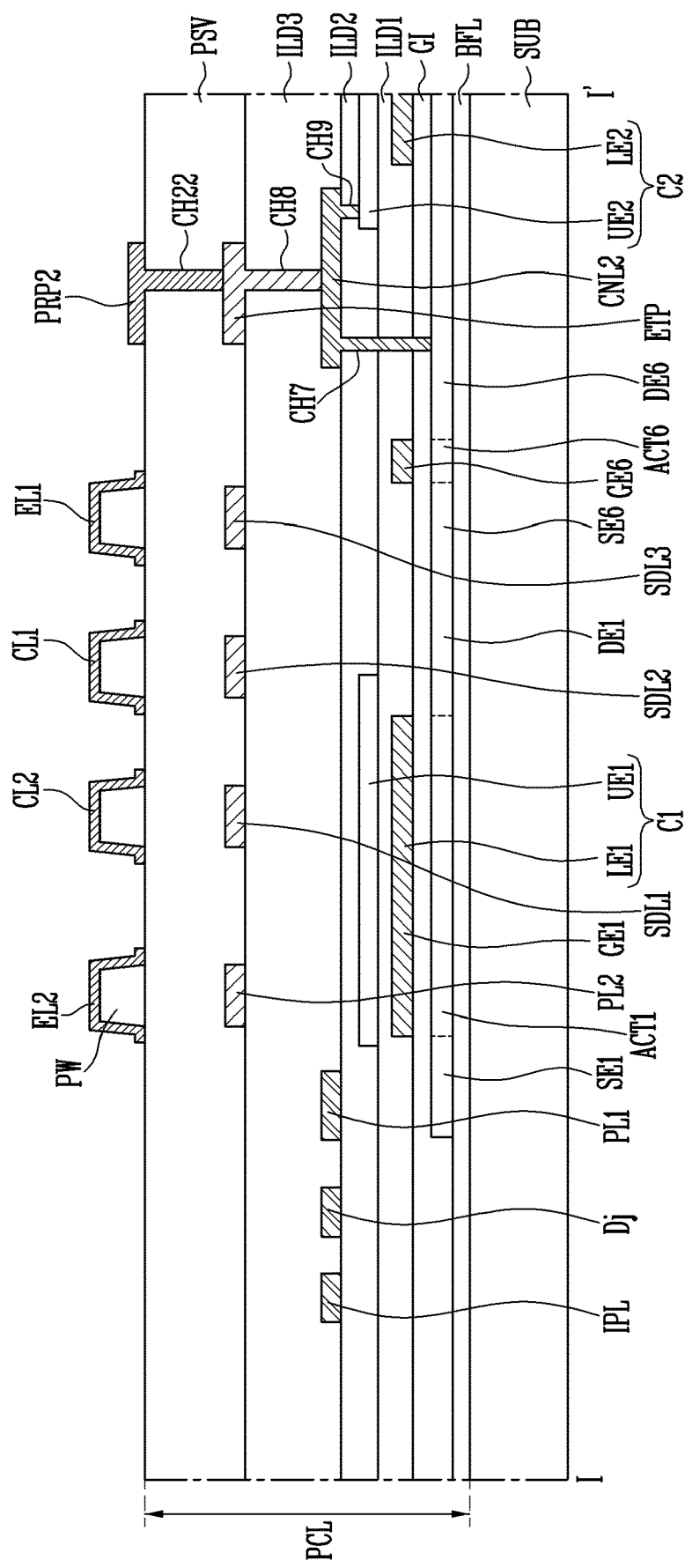
Figure 11H:
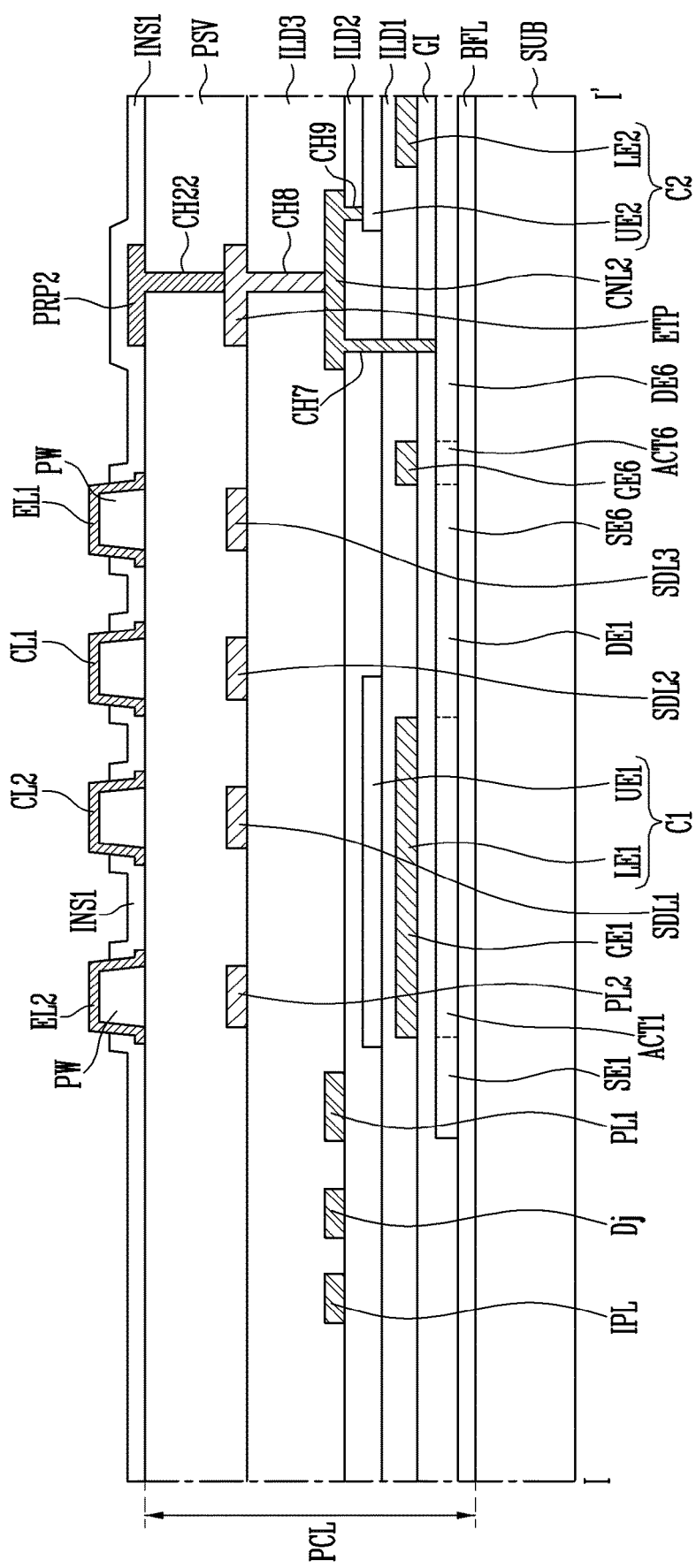
Figure 11I:
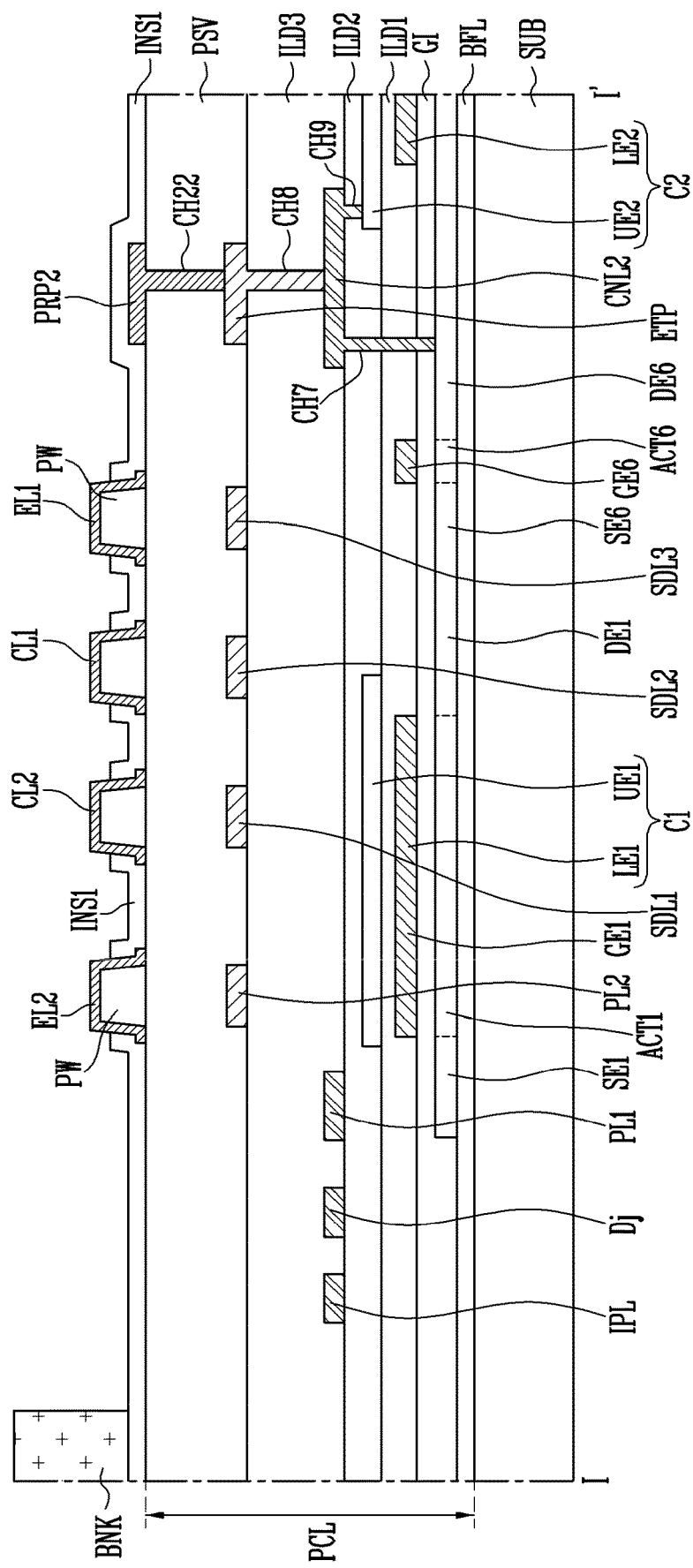
Figure 11J:
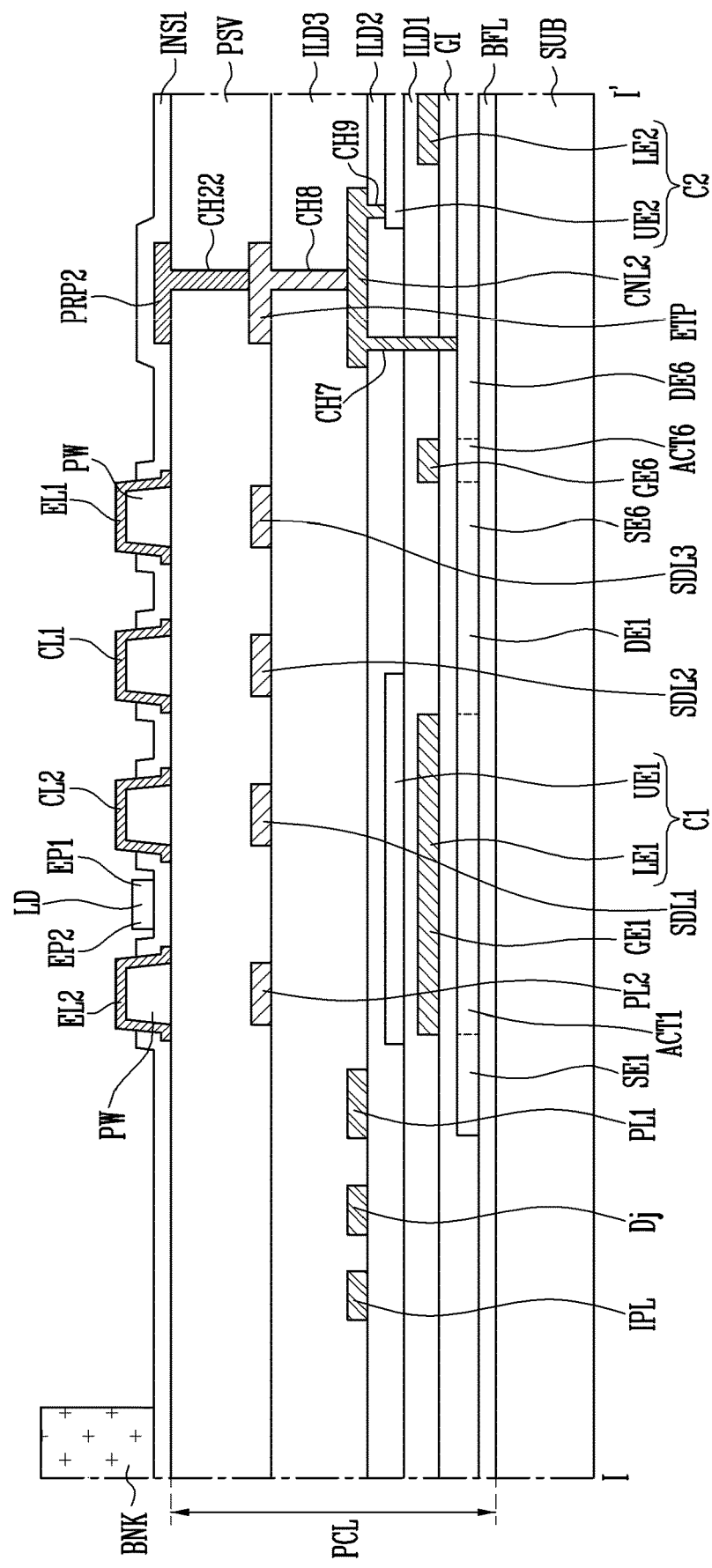
Figure 11K:
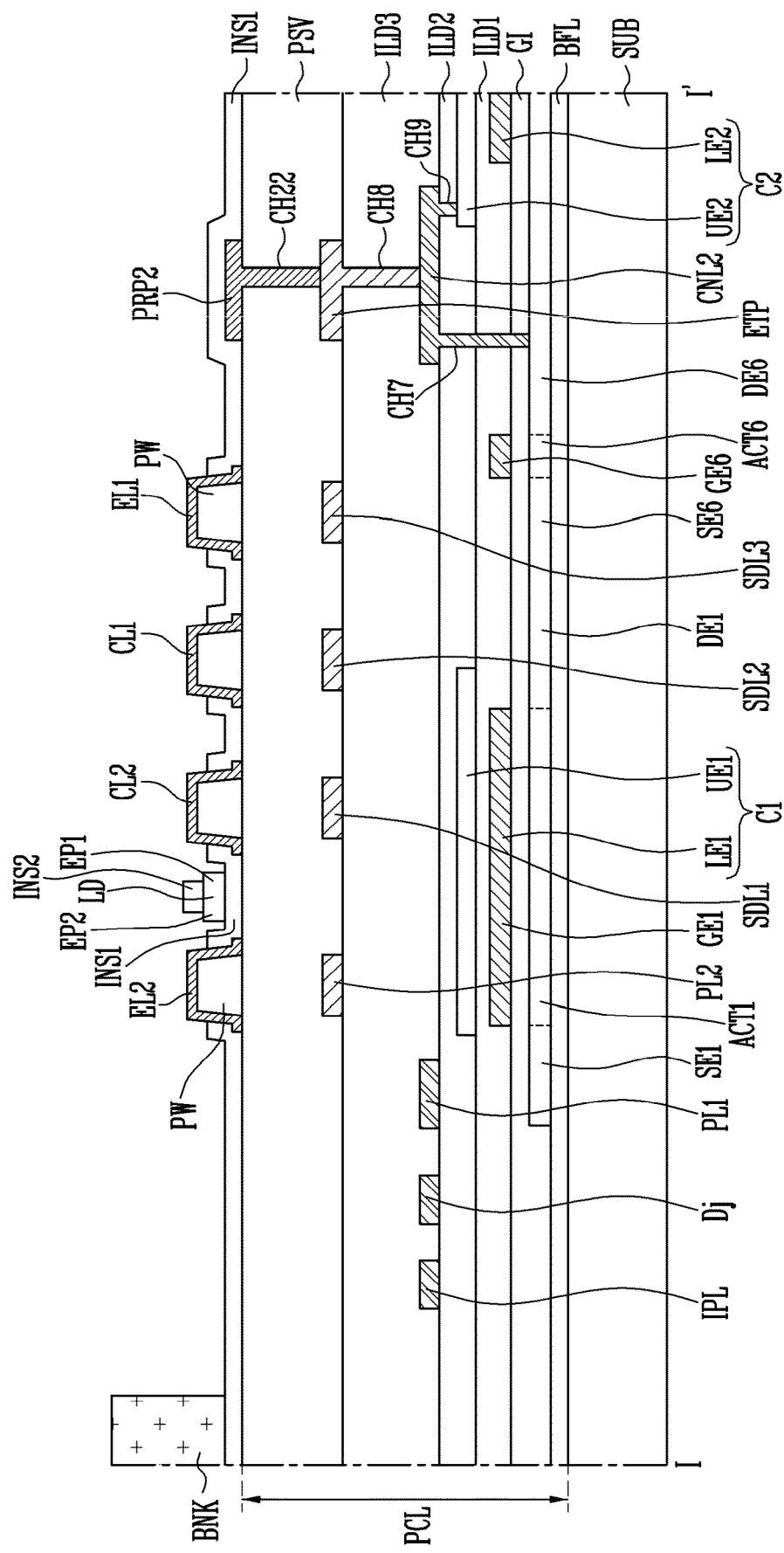
Figure 11L:
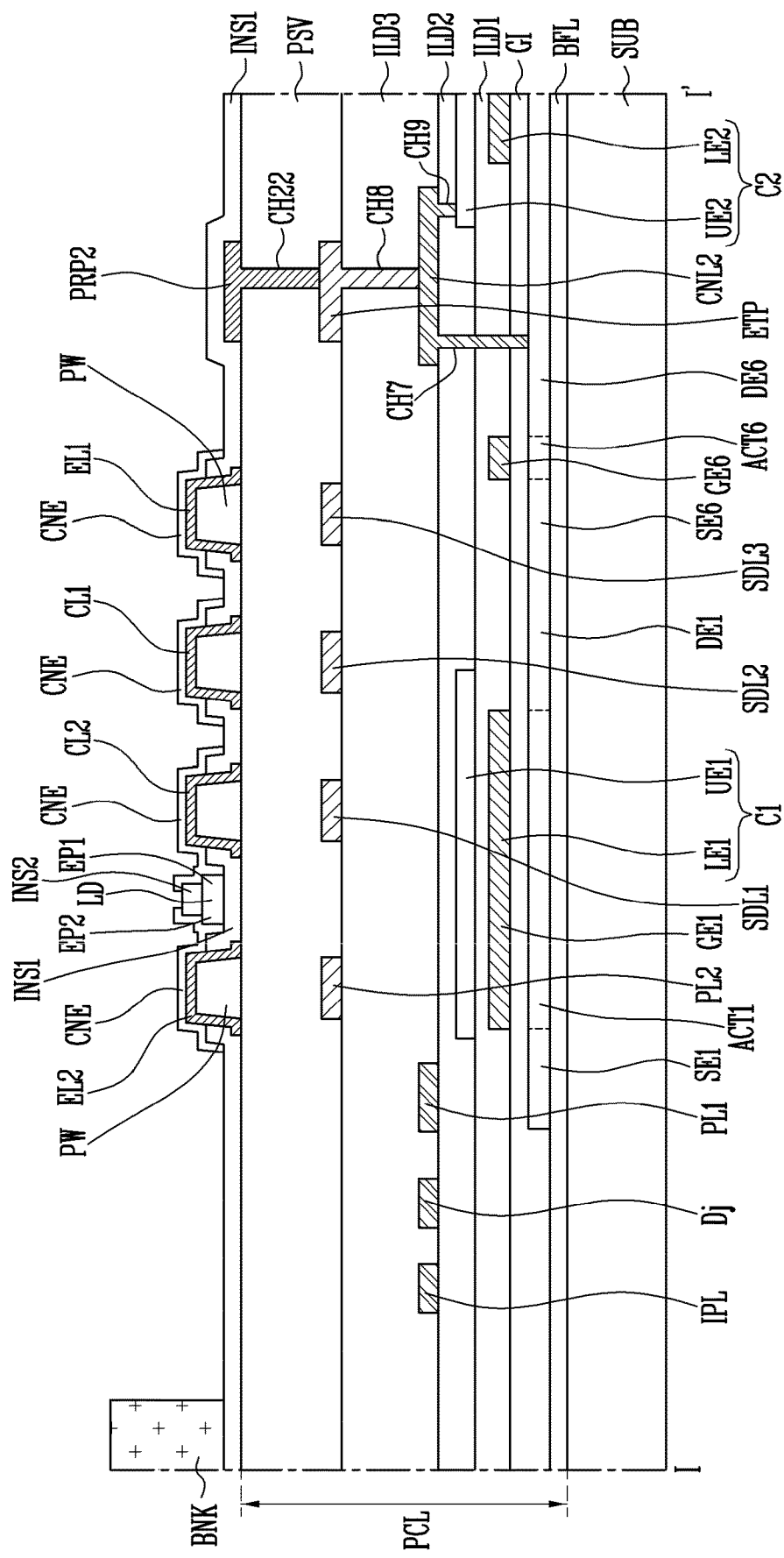
Figure 11M:
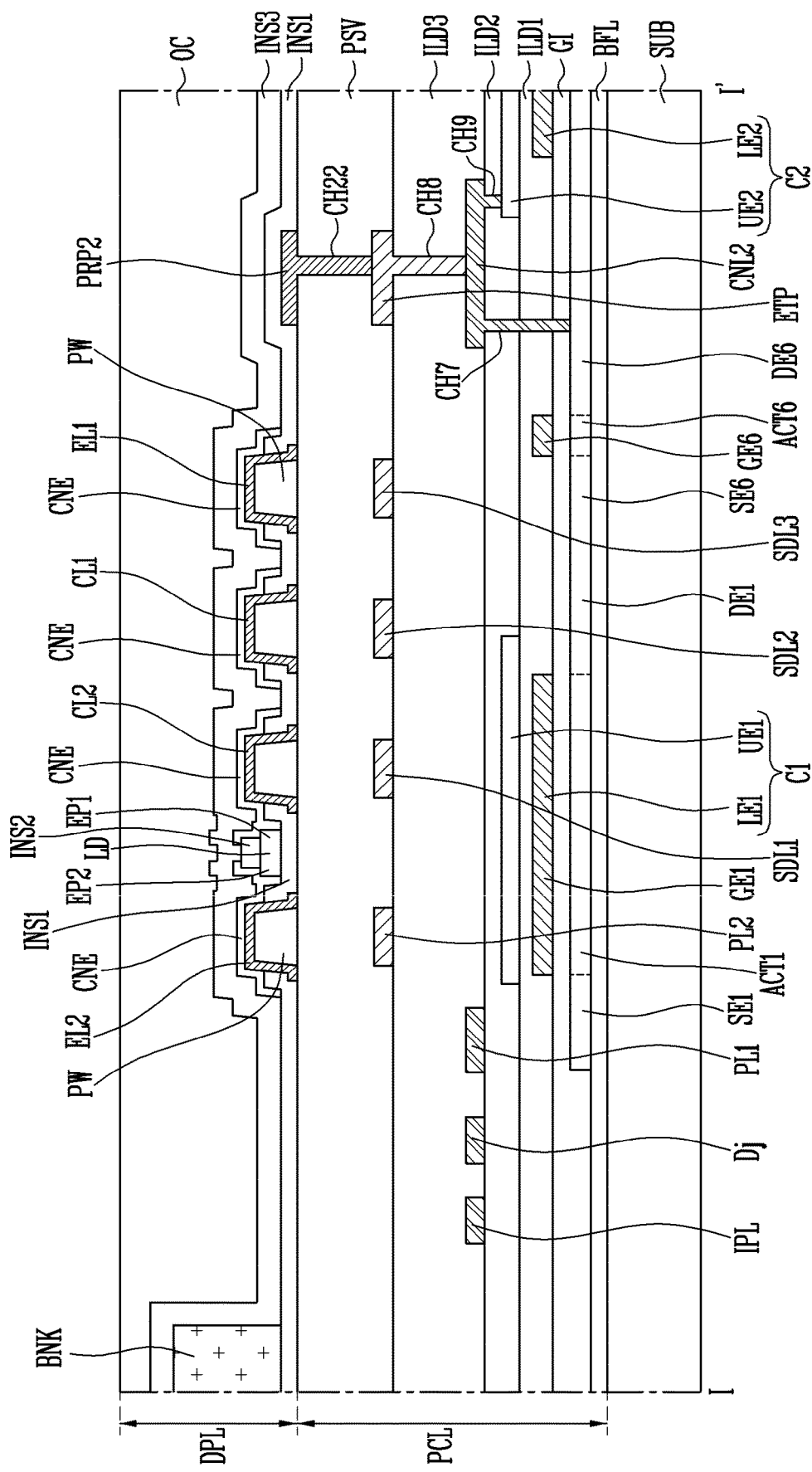

FIG. 10 is a sectional view corresponding to the line I-I' shown in FIG. 4 according to another embodiment of the present disclosure.

The display device shown in FIG. 10 may have a configuration identical or substantially similar to that of the display device shown in FIG. 5, except that a contact electrode on a first electrode and a contact electrode on a second electrode are provided in different layers.

In the following description of the display device shown in FIG. 10, portions different from those of the above-described embodiments will be primarily described. Portions of the display device shown in FIG. 10 but not particularly described in this embodiment are the same or are substantially similar to those of the above-described embodiments and are omitted to avoid redundancy. In addition, identical reference numerals refer to identical components, and similar reference numerals refer to similar components.

In FIG. 10, the structure of the display device is simplified and illustrated as an embodiment in which each electrode is illustrated as a single electrode layer and each insulating layer is illustrated as a single insulating layer. However, the present disclosure is not limited thereto.

Referring to FIGS. 1A, 2, 3D, 4, and 10, the display device may include a substrate SUB, a line unit, and one or more pixel(s) PXL.

The pixel PXL may include a display element layer DPL including one or more light emitting element(s) LD and a pixel circuit layer PCL that drives the light emitting element(s) LD.

The pixel circuit layer PCL may include the alignment unit 145 for aligning light emitting elements LD in a light emitting area EMA of the pixel PXL, a pixel circuit 144 for driving the light emitting elements LD, and a protective layer PSV covering the alignment unit 145 and the pixel circuit 144.

The display element layer DPL may include first banks PW provided on the protective layer PSV, first and second electrodes EL1 and EL2, first and second conductive lines CL1 and CL2, a second bank BNK, a plurality of light emitting elements LD, and first and second contact electrodes CNE1 and CNE2.

In an embodiment of the present disclosure, the first contact electrode CNE1 may include a (1-1)th contact electrode CNE1_1 and a (1-2)th contact electrode CNE1_2.

The (1-1)th contact electrode CNE1_1 may be disposed on the first electrode EL1 to be electrically and/or physically connected to the first electrode EL1. The (1-2)th contact electrode CNE1_2 may be disposed on the second conductive line CL2 to be electrically and/or physically connected to the second conductive line CL2.

A third insulating layer INS3 may be provided over the (1-1)th contact electrode CNE1_1 and the (1-2)th contact electrode CNE1_2. The third insulating layer INS3 may correspond to the third insulating layer INS3 shown in FIG. 5. The third insulating layer INS3 allows the (1-1)th contact electrode CNE1_1 and the (1-2)th contact electrode CNE1_2 to not be exposed to the outside to prevent or reduce corrosion of the (1-1)th contact electrode CNE1_1 and the (1-2)th contact electrode CNE1_2.

In an embodiment of the present disclosure, the second contact electrode CNE2 may include a (2-1)th contact electrode CNE2_1 and a (2-2)th contact electrode CNE2_2.

The (2-1)th contact electrode CNE2_1 may be disposed on the first conductive line CL1 to be electrically and/or physically connected to the first conductive line CL1. The (2-2)th contact electrode CNE2_2 may be disposed on the second electrode EL2 to be electrically and/or physically connected to the second electrode EL2.

A fourth insulating layer INS4 may be provided over the (2-1)th contact electrode CNE2_1 and the (2-2)th contact electrode CNE2_2. The fourth insulating layer INS4 allows the (2-1)th contact electrode CNE2_1 and the (2-2)th contact electrode CNE2_2 to not be exposed to the outside to prevent or reduce corrosion of the (2-1)th contact electrode CNE2_1 and the (2-2)th contact electrode CNE2_2. The fourth insulating layer INS4 may be formed of any suitable one of an inorganic insulating layer and an organic insulating layer.

An overcoat layer OC may be provided on the fourth insulating layer INS4.

As described above, the first contact electrode CNE1 and the second contact electrode CNE2 may be provided and/or formed in different layers.

FIGS. 11A-11M are sectional views sequentially illustrating a manufacturing method of the display device shown in FIG. 5.

In FIGS. 11A-11M, portions different from those of the above-described embodiments will be primarily described to avoid redundancy. Portions not particularly described in this embodiment follow those of the above-described embodiments. In addition, identical reference numerals refer to identical components, and similar reference numerals refer to similar components.

In an embodiment of the present disclosure, "components, etc. are formed and/or provided in the same layer" may mean that the components, etc. are formed in (or during or by using) the same process.

Referring to FIGS. 1A, 2, 3D, 4, 5, and 11A, a buffer layer BFL is formed on a substrate SUB in each pixel PXL. Subsequently, a semiconductor pattern SMP is formed on the buffer layer BFL. The semiconductor pattern SMP may be a semiconductor layer undoped with an impurity (e.g., an undoped semiconductor layer).

Referring to FIGS. 1A, 2, 3D, 4, 5, 11A, and 11B, a gate insulating layer GI is formed over the semiconductor pattern SMP.

Subsequently, an (i−1)th scan line Si−1, an ith scan line Si, an (i+1)th scan line Si+1, an emission control line Ei, a control signal line CSi, and first and second lower electrodes LE1 and LE2 are formed. The (i−1)th scan line Si−1, the ith scan line Si, the (i+1)th scan line Si+1, the emission control line Ei, and the control signal line CSi may be formed of (or may include) the same material and may be formed through the same process.

An impurity is doped (e.g., is continuously doped) into the semiconductor pattern SMP by using, as a mask, the (i−1)th scan line Si−1, the ith scan line Si, the (i+1)th scan line Si+1, the emission control line Ei, the control signal line CSi, and the first and second lower electrodes LE1 and LE2. Therefore, the semiconductor pattern SMP doped with the impurity may be formed as source and drain electrodes of each transistor and first and second terminals of each switch.

Concurrently (or simultaneously), the semiconductor pattern SMP undoped with the impurity due to the (i−1)th scan line Si−1, the ith scan line Si, the (i+1)th scan line Si+1, the emission control line Ei, and the control signal line CSi may be formed as an active pattern of each transistor and an active pattern of each switch.

For example, first and second source electrodes SE1 and SE2, 3ath and 3bth source electrodes SE3a and SE3b, 4ath and 4bth source electrodes SE4a and SE4b, fifth to seventh source electrodes SE5-SE7, and (1-1)th to (3-1)th terminal SW1_1, SW2_1, and SW3_1 may be formed on the buffer layer BFL. Also, first and second drain electrodes DE1 and DE2, 3ath and 3bth drain electrodes DE3a and DE3b, 4ath and 4bth drain electrodes DE4a and DE4b, fifth to seventh drain electrodes DE5-DE7, and (1-2)th to (3-2)th terminals SW1_2, SW2_2, and SW3_2 may be formed on the buffer layer BFL. In addition, first and second active patterns ACT1 and ACT2, 3ath and 3bth active patterns ACT3a and ACT3b, 4ath and 4bth active patterns ACT4a and ACT4b, fifth to seventh active patterns ACT5-ACT7, a first switch active pattern ACT_SW1, a second switch active pattern ACT_SW2, and a third switch active pattern ACT_SW3 may be formed on the buffer layer BFL.

In an embodiment of the present disclosure, one region of the first lower electrode LE1 overlapping the first active pattern ACT1 may become a first gate electrode GE1, one region of the ith scan line Si overlapping the second active pattern ACT2 may become a second gate electrode GE2, one region of the ith scan line Si overlapping the 3ath active pattern ACT3a may become a 3ath gate electrode GE3a, and one region of the ith scan line Si overlapping the 3bth active pattern ACT3b may become a 3bth gate electrode GE3b. Also, one region of the (i−1)th scan line Si−1 overlapping the 4ath active pattern ACT4a may become a 4ath gate electrode GE4a, one region of the (i−1)th scan line Si−1 overlapping the 4bth active pattern ACT4b may become a 4bth gate electrode GE4b, and one region of the emission control line Ei overlapping the fifth active pattern ACT5 may become a fifth gate electrode GE5. In addition, one region of the emission control line Ei overlapping the sixth active pattern ACT6 may become a sixth gate electrode GE6, and one region of the (i+1)th scan line Si+1 overlapping the seventh active pattern ACT may become a seventh gate electrode GE7.

In an embodiment of the present disclosure, one region of the control signal line CSi overlapping the first switch active pattern ACT_SW1 may become a first switch gate electrode GE_SW1, one region of the control signal line CSi overlapping the second switch active pattern ACT_SW2 may become a second switch gate electrode GE_SW2, and one region of the control signal line CSi overlapping the third switch active pattern ACT_SW3 may become a third switch gate electrode GE_SW3.

Next, referring to FIGS. 1A, 2, 3D, 4, 5, and 11A-11C, a first interlayer insulating layer ILD1 is formed on the (i−1)th scan line Si−1, the ith scan line Si, the (i+1)th scan line Si+1, the emission control line Ei, and the control signal line CSi of each pixel PXL.

Subsequently, a first upper electrode UE1 and a second upper electrode UE2 are formed in the first interlayer insulating layer ILD1. The first upper electrode UE1 and the second upper electrode UE2 may be made of (or may include) the same conductive material and may be formed and/or provided in the same layer.

The first upper electrode UE1 may have an opening OPN therein. The first upper electrode UE1 may overlap the first lower electrode LE1 with the first interlayer insulating layer ILD1 interposed therebetween. The first upper electrode UE1 along with the first lower electrode LE1 may constitute a first capacitor C1.

The second upper electrode UE2 may overlap the second lower electrode LE2 with the first interlayer insulating layer ILD1 interposed therebetween. The second upper electrode UE2 along with the second lower electrode LE2 may constitute a second capacitor C2.

Next, referring to FIGS. 1A, 2, 3D, 4, 5, and 11A-11D, a second interlayer insulating layer ILD2 is formed over the first and second upper electrodes UE1 and UE2 of each pixel PXL.

An initialization power line IPL, a data line Dj, a first power line PL1, a third power line PL3, first to third connection electrodes CNL1, CNL2, and CNL3, first to fourth bridge patterns BRP1-BRP4, and a first protrusion electrode PRP1 are formed on the second interlayer insulating layer ILD2. In an embodiment of the present disclosure, the third power line PL3 may include one region protruding along the first direction DR1, and the one region of the third power line PL3 may become the first protrusion electrode PRP1.

The initialization power line IPL, the data line Dj, the first power line PL1, the third power line PL3, the first to third connection electrodes CNL1, CNL2, and CNL3, the first to fourth bridge patterns BRP1-BRP4, and the first protrusion electrode PRP1 may be made of (or may include) the same conductive material and may be formed and/or provided in the same layer.

Next, referring to FIGS. 1A, 2, 3D, 4, 5, and 11A-11E, a third interlayer insulating layer ILD3 is formed on the entire surface of the second interlayer insulating layer ILD2 on which the initialization power line IPL, the data line Dj, the first power line PL1, the third power line PL3, the first to third connection electrodes CNL1, CNL2, and CNL3, the first to fourth bridge patterns BRP1-BRP4, and the first protrusion electrode PRP1 are formed.

Subsequently, a second power line PL2, first to third shielding electrode lines SDL1-SDL3, and an extension electrode ETP are formed on the third interlayer insulating layer ILD3. In an embodiment of the present disclosure, the third shielding electrode line SDL3 may have one region protruding along (or protruding in) the first direction DR1, and the one region becomes (or is) the extension electrode ETP.

The second power line PL2, the first to third shielding electrode lines SDL1-SDL3, and the extension electrode ETP may be made of (or may include) the same conductive material and may be formed and/or provided in the same layer.

Next, referring to FIGS. 1A, 2, 3D, 4, 5, and 11A-11F, a protective layer PSV is formed on the third interlayer insulating layer ILD3 on which the second power line PL2, the first to third shielding electrode lines SDL1-SDL3, and the extension electrode ETP are formed.

The protective layer PSV may include a twenty-second contact opening (e.g., a twenty-second contact hole) CH22 exposing a region of the extension electrode ETP.

Subsequently, first banks PW are formed on the protective layer PSV. One first bank PW may be spaced apart from an adjacent first bank PW at a distance on the protective layer PSV. The first banks PW may include an inorganic insulating layer made of (or including) an inorganic material or an organic insulating layer made of (or including) an organic material. In some embodiments, the first banks PW may include a single organic insulating layer and/or a single inorganic insulating layer, but the present disclosure is not limited thereto. In another example, the first banks PW may have a multi-layer structure in which a plurality of organic insulating layers and a plurality of inorganic insulating layers are stacked.

Next, referring to FIGS. 1A, 2, 3D, 4, 5, and 11A-11G, a first electrode EL1, a first conductive line CL1, a second conductive line CL2, a second electrode EL2, and a second protrusion electrode PRP2, each of which includes a conductive material having high reflexibility, are formed on the protective layer PSV of each pixel PXL. In an embodiment of the present disclosure, the first electrode EL1 may include one region protruding along the first direction DR1, and the one region may become (or may be) the second protrusion electrode PRP2.

Each of the first electrode EL1, the first conductive line CL1, the second conductive line CL2, and the second electrode EL2 may be formed and/or provided on a corresponding first bank PW in a light emitting area EMA of each pixel PXL.

The first electrode EL1, the first conductive line CL1, the second conductive line CL2, and the second electrode EL2 may be made of (or may include) the same conductive material and may be formed and/or provided in the same layer.

Next, referring to FIGS. 1A, 2, 3D, 4, 5, and 11A-11H, a first insulating material layer is formed on the entire surface of the protective layer PSV on which the first electrode EL1, the first conductive line CL1, the second conductive line CL2, and the second electrode EL2 are formed. Subsequently, a first insulating layer INS1 exposing each of one region of the first electrode EL1, one region of the first conductive line CL1, one region of the second conductive line CL2, and one region of the second electrode EL2 is formed by pattering the first insulating material layer through (e.g., by using) a mask.

Next, referring to FIGS. 1A, 2, 3D, 4, 5, and 11A-11I, a bank BNK is formed in a peripheral area (e.g., a non-emission area in which no light is emitted) located at the periphery of the light emitting area EMA of each pixel PXL.

The bank BNK may be a structure defining (or providing) the light emitting area EMA of each pixel PXL.

Next, referring to FIGS. 1A, 2, 3D, 4, 5, and 11A-11J, a plurality of light emitting elements LD are injected into the light emitting area EMA of each pixel PXL by using an inkjet printing technique.

In an example, light emitting elements LD may be injected into the light emitting area EMA of each pixel PXL by disposing (or arranging) a nozzle above the protective layer PSV and dropping (or depositing or printing) a solvent including the light emitting elements LD. The solvent may include one or more of acetone, water, alcohol, and toluene, but the present disclosure is not limited thereto. For example, the solvent may include a material that evaporates at room temperature or which may be evaporated by heat. Also, the solvent may be an ink or paste. The method of injecting the light emitting elements LD is not limited thereto and may be variously, suitably modified as would be understood by one skilled in the art.

The solvent may be removed after the light emitting elements LD are injected into the light emitting area EMA of each pixel PXL.

Before the light emitting elements LD are injected, a control signal having a voltage at which the first to third switches SW1 to SW3 are concurrently (e.g., are simultaneously) turned on is supplied from the control signal line CSi to the first switch gate electrode GE_SW1, the second switch gate electrode GE_SW2, and the third switch gate electrode GE_SW3.

Accordingly, when the first to third switches SW1-SW3 are turned on, a ground voltage GND from the third power line PL3 is applied to each of the first electrode EL1 and the second conductive line CL2, and an alignment voltage (e.g., an AC voltage) from the second power line PL2 is applied to the second electrode EL2 and the first conductive line CL2. Therefore, electric fields may be formed between the first electrode EL1 and the first conductive line CL1, between the first conductive line CL1 and the second conductive line CL2, and between the second conductive line CL2 and the second electrode EL2, respectively.

Thus, when the light emitting elements LD are injected in the light emitting area EMA of each pixel PXL, the light emitting elements LD may be induced to self-align due to the electric fields respectively formed between the first electrode EL1 and the first conductive line CL1, between the first conductive line CL1 and the second conductive line CL2, and between the second conductive line CL2 and the second electrode EL2. Accordingly, the light emitting elements LD may be respectively aligned between the first electrode EL1 and the first conductive line CL1, between the first conductive line CL1 and the second conductive line CL2, and between the second conductive line CL2 and the second electrode EL2. For example, the light emitting elements LD may be intensively aligned in a desired area (e.g., in the light emitting area EMA of each pixel PXL). The light emitting elements LD may be aligned on the first insulating layer INS1 in the light emitting area EMA of each pixel PXL.

After the alignment of the light emitting elements LD in the light emitting area EMA of each pixel PXL is completed, a control signal having a voltage at which the first to third switches SW1-SW3 are concurrently (e.g., simultaneously) turned off is supplied from the control signal line CSi to the first switch gate electrode GE_SW1, the second switch gate electrode GE_SW2, and the third switch gate electrode GE_SW3. Therefore, the first to third switches SW1-SW3 may be concurrently (or simultaneously) turned off. After the first to third switches SW1-SW3 are turned off, a second driving power source VDD may be applied.

Next, referring to FIGS. 1A, 2, 3D, 4, 5, and 11A-11K, a second insulating material layer is formed on the entire surface of the protective layer PSV on which the light emitting elements LD are aligned. Subsequently, a second insulating layer INS2 that is disposed in one region of an upper surface of each of the light emitting elements LD and exposes both end portions EP1 and EP2 of each of the light emitting elements LD is formed by patterning the second insulating material layer by using a mask. The second insulating layer INS may include an inorganic insulating layer made of (or including) an inorganic material or an organic insulating layer made of (or including) an organic material.

Next, referring to FIGS. 1A, 2, 3D, 4, 5, and 11A-11L, contact electrodes CNE are formed on the protective layer PSV including the second insulating layer INS2 by using sputtering.

In an embodiment of the present disclosure, the contact electrodes CNE may be respectively formed and/or provided on the first electrode EL1, the first conductive line CL1, the second conductive line CL2, and the second electrode EL2.

The contact electrode CNE on the first electrode EL1 may be formed directly on the first electrode EL1 to be electrically and/or physically connected to the first electrode EL1. However, in some embodiments, when a capping layer (see, e.g., the capping layer CPL shown in FIG. 7) is disposed between the first electrode EL1 and the contact electrode CNE, the contact electrode CNE may be formed directly on the capping layer CPL to be indirectly connected to the first electrode EL1.

The contact electrode CNE on the first conductive line CL1 may be formed directly on the first conductive line CL1 to be electrically and/or physical connected to the first conductive line CL1. However, in some embodiments, when a capping layer (see, e.g., the capping layer CPL shown in FIG. 7) is disposed between the first conductive line CL1 and the contact electrode CNE, the contact electrode CNE may be formed directly on the capping layer CPL to be indirectly connected to the first conductive line CL1.

The contact electrode CNE on the second conductive line CL2 may be formed directly on the second conductive line CL2 to be electrically and/or physically connected to the second conductive line CL2. However, in some embodiments, when a capping layer (see, e.g., the capping layer CPL shown in FIG. 7) is disposed between the second conductive line CL2 and the contact electrode CNE, the contact electrode CNE may be formed directly on the capping layer CPL to be indirectly connected to the second conductive line CL2.

The contact electrode CNE on the second electrode EL2 may be formed directly on the second electrode EL2 to be electrically and/or physically connected to the second electrode EL2. However, in some embodiments, when a capping layer (see, e.g., the capping layer CPL shown in FIG. 7) is disposed between the second electrode EL2 and the contact electrode CNE, the contact electrode CNE may be formed directly on the capping layer CPL to be indirectly connected to the second electrode EL2.

The contact electrode CNE on the first electrode EL1, the contact electrode CNE on the first conductive layer CL1, the contact electrode CNE on the second conductive layer CL2, and the contact electrode CNE on the second electrode EL2 may be made of (or may include) the same conductive material and may be formed and/or provided in the same layer.

Next, referring to FIGS. 1A, 2, 3D, 4, 5, and 11A-11M, a third insulating layer INS3 is formed on the entire surface of the protective layer PSV including the contact electrodes CNE.

The third insulating layer INS3 may include an inorganic insulating layer made of (or including) an inorganic material or an organic insulating layer made of (or including) an organic material. The third insulating layer INS3 may be a single layer as shown in the drawing. However, the present disclosure is not limited thereto, and the third insulating layer INS3 may have a multi-layer structure.

Subsequently, an overcoat layer OC is formed on the third insulating layer INS3.

Figure 12:
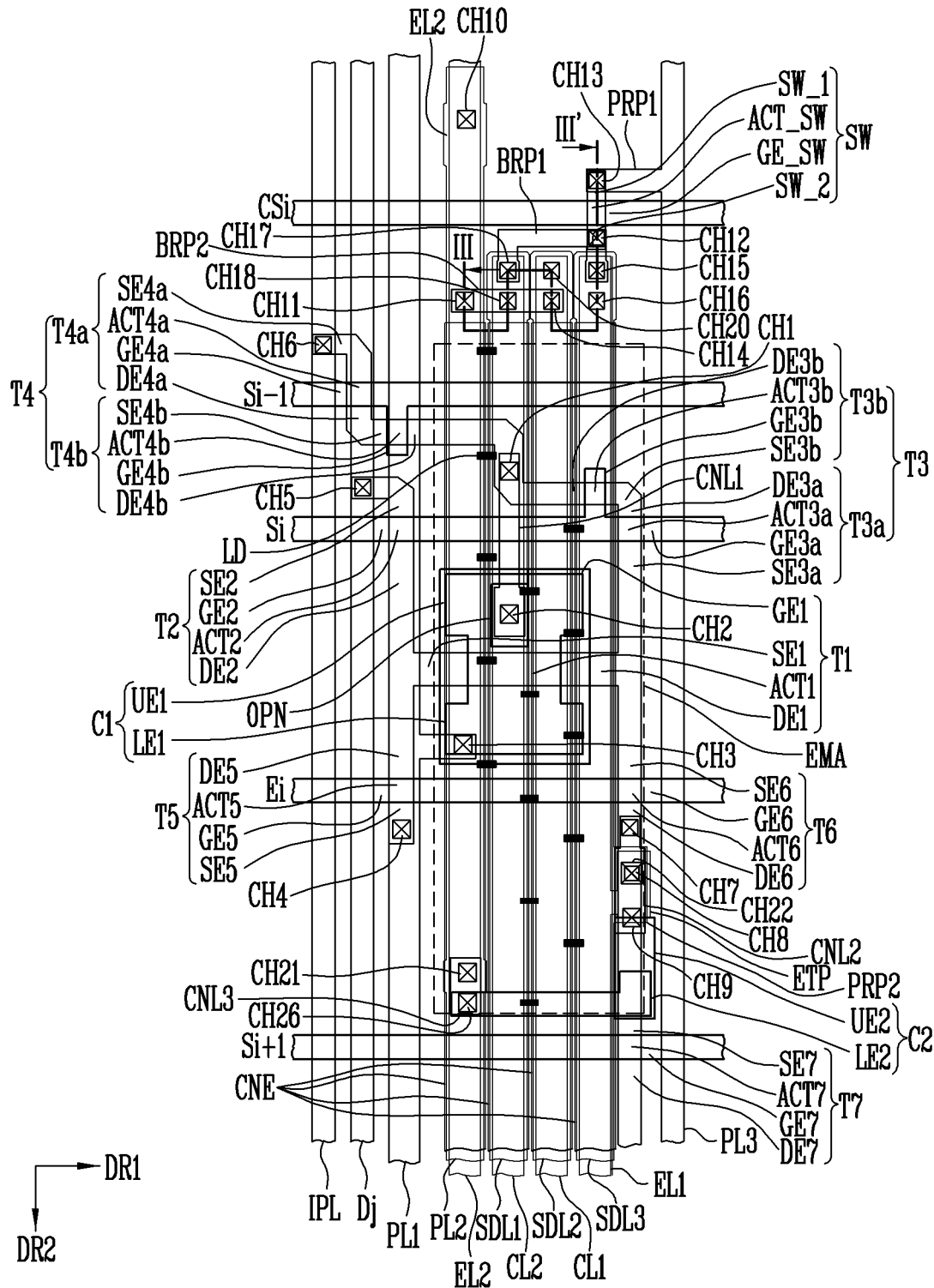
FIG. 12 is a plan view illustrating the pixel shown in FIG. 3C.
Figure 13:
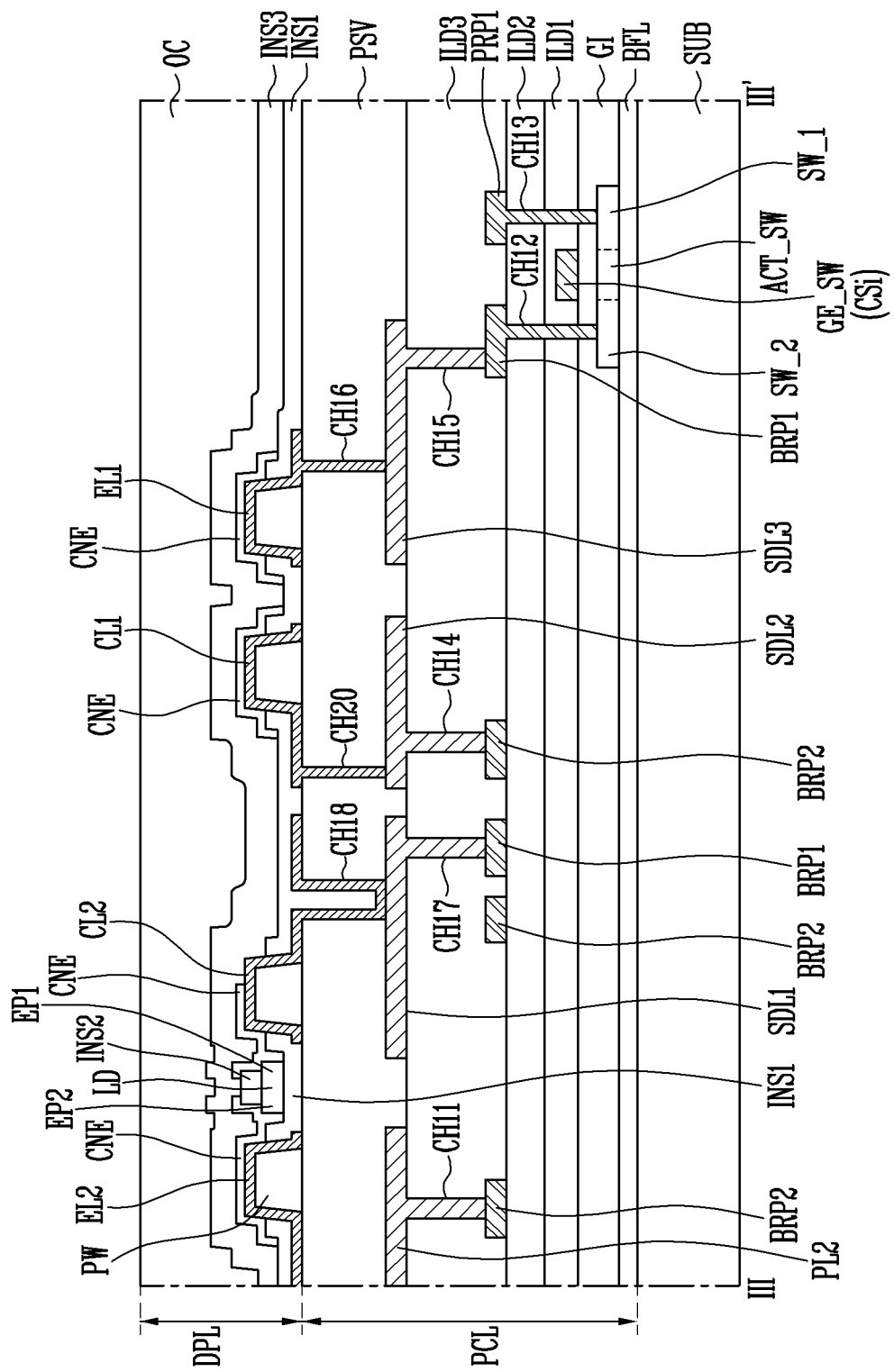
FIG. 13 is a sectional view taken along the line III-III' shown in FIG. 12.

FIG. 12 is a plan view illustrating the pixel shown in FIG. 3C, and FIG. 13 is a sectional view taken along the line III-III' shown in FIG. 12.

The pixel shown in FIGS. 12 and 13 may have a configuration identical or substantially similar to that of the pixel shown in FIGS. 4 and 5, except that an alignment unit includes only one switch.

Accordingly, with respect to the pixel shown in FIGS. 12 and 13, portions different from those of the above-described embodiments will be primarily described to avoid redundancy. Portions not particularly described in this embodiment follow those of the above-described embodiments. In addition, identical reference numerals refer to identical components, and similar reference numerals refer to similar components.

In FIG. 12, based on one pixel PXL disposed on an ith row and a jth column, which are provided in the display area, three scan lines Si−1, Si, and Si+1, an emission control line Ei, first to third power lines PL1-PL3, a control signal line CSi, and a data line Dj, which are connected to the one pixel PXL, are illustrated.

In FIGS. 12 and 13, the structure of the one pixel PXL is simplified and illustrated such that each electrode is illustrated as a single electrode layer and each insulating layer is illustrated as a single insulating layer. However, the present disclosure is not limited thereto.

Referring to FIGS. 1A, 2, 3C, 12, and 13, at least one pixel PXL (hereinafter, referred to as a "pixel") included in the display device according to an embodiment of the present disclosure may include scan lines Si−1, Si, and Si+1, a data line Dj, an emission control line Ei, a control signal line CSi, first to third power lines PL1-PL3, an initialization power line IPL, and first to third shielding electrode lines SDL1-SDL3.

The pixel PX may include a display element layer DPL including light emitting elements LD and a pixel circuit layer PCL that drives the light emitting elements LD.

The pixel circuit layer PCL may include an alignment unit 145 for aligning the light emitting elements LD in a light emitting area EMA of the pixel PXL, a pixel circuit 144 for driving the light emitting elements LD, and a protective layer PSV covering the alignment unit 145 and the pixel circuit 144.

The display element layer DPL may include a plurality of light emitting elements LD, first and second electrodes EL1 and EL2, first and second conductive lines CL1 and CL2, contact electrodes CNE, and the like.

The pixel circuit 144 may include first to seventh transistors T1-T7 and first and second capacitors C1 and C2. In an embodiment of the present disclosure, the alignment unit 145 may include one or more switch(es) SW (hereinafter, referred to as a "switch") that is turned on/off by a control signal supplied from a control signal line CSi.

The switch SW included in the alignment unit 145 may be implemented by a transistor having the same type as the first to seventh transistors T1-T7 of the pixel circuit 144.

The switch SW may include a switch active pattern ACT_SW, a first terminal SW_1, a second terminal SW_2, and a switch gate electrode GE_SW.

The switch active pattern ACT_SW, the first terminal SW_1, and the second terminal SW_2 may be formed of a semiconductor layer undoped or doped with an impurity. For example, the first terminal SW_1 and the second terminal SW_2 may be formed of a semiconductor layer doped with the impurity, and the switch active pattern ACT_SW may be formed of a semiconductor layer undoped with the impurity.

The switch gate electrode GE_SW may be connected to the control signal line CSi. The switch gate electrode GE_SW may be a portion of the control signal line CSi or may have a shape protruding from the control signal line CSi.

The switch active pattern ACT_SW may extend along the second direction DR2 and may overlap the switch gate electrode GE_SW when viewed on a plane.

One end of the first terminal SW_1 may be connected to the switch active pattern ACT_SW, and the other end of the first terminal SW_1 may be connected to a first protrusion electrode PRP1 through a thirteenth contact opening (e.g., a thirteenth contact hole) CH13 penetrating a gate insulating layer GI and first and second interlayer insulating layers ILD1 and ILD2. One end of the second terminal SW_2 may be connected to the switch active pattern ACT_SW, and the other end of the second terminal SW_2 may be connected to a first bridge pattern BRP1 through a twelfth contact opening (e.g., a twelfth contact hole) CH12 penetrating the gate insulating layer GI and the first and second interlayer insulating layers ILD1 and ILD2.

In an embodiment of the present disclosure, when the switch SW is a transistor, any one of the first and second terminals SW_1 and SW2 may be a source electrode, and the other of the first and second terminals SW_1 and SW2 may be a drain electrode.

The first protrusion electrode PRP1 may have a shape protruding along the first direction DR1 from the third power line PL3 and may be one region of the third power line PL3. Because the first protrusion electrode PRP1 corresponds to the one region of the third power line PL3, the first terminal SW_1 may be connected to the third power line PL3 through the thirteenth contact opening CH13 and the first protrusion electrode PRP1.

The first bridge pattern BRP1 may be connected to the second terminal SW_2 through the twelfth contact opening CH12. Also, the first bridge pattern BRP1 may be connected to the third shielding electrode line SDL3 through a fifteenth contact opening (e.g., a fifteenth contact hole) CH15 penetrating a third interlayer insulating layer ILD3. In addition, the first bridge pattern BRP1 may be connected to the first shielding electrode line SDL1 through a seventeenth contact opening (e.g., a seventeenth contact hole) CH17 penetrating the third interlayer insulating layer ILD3. Accordingly, the first shielding electrode line SDL1 and the third shielding electrode line SDL3 may be electrically connected to each other through the first bridge pattern BRP1.

The first shielding electrode line SDL1 may be connected to the second conductive line CL2 of the display element layer DPL through an eighteenth contact opening (e.g., an eighteenth contact hole) CH18 penetrating a protective layer PSV. When viewed on a plane, the second conductive line CL2 may be disposed on the first shielding electrode line SDL1 with the protective layer PSV interposed therebetween to overlap the first shielding electrode line SDL1.

The third shielding electrode line SDL3 may be connected to the first electrode EL1 of the display element layer DPL through a sixteenth contact opening (e.g., a sixteenth contact hole) CH16 penetrating the protective layer PSV. When viewed on a plane, the first electrode EL1 may be disposed on the third shielding electrode line SDL3 with the protective layer PSV interposed therebetween to overlap the third shielding electrode line SDL3.

As described above, when the first shielding electrode line SDL1 and the third shielding electrode line SDL3 are connected to each other by the first bridge pattern BRP1, the first electrode EL1 on the third shielding electrode line SDL3 and the second conductive line CL2 on the first shielding electrode line SDL1 may be electrically connected to each other.

When a control signal having a voltage at which the switch SW can be turned on is transferred from the control signal line CSi to the switch gate electrode GE_SW, the switch SW is turned on and a ground voltage GND of the third power line PL3 may be concurrently (e.g., simultaneously) transferred to the first electrode EL1 and the second conductive line CL2 of the display element layer DPL by the first bridge pattern BRP1.

When a control signal having a voltage at which the switch SW may be turned off is transferred from the control signal line CSi to the switch gate electrode GE_SW, the switch SW is turned off and the third power line PL3 and the first bridge pattern BRP1 may be electrically separated from each other. Although the third power line PL3 and the first bridge pattern BRP1 are electrically separated from each other, the first electrode EL1 and the second conductive line CL2 may be electrically connected to each other by the first bridge pattern BRP1. Accordingly, a first driving power source VDD may be transferred to each of the first electrode EL1 and the second conductive line CL2 via the pixel circuit 144.

When the switch SW is turned on, an alignment voltage (e.g., an AC voltage) may be applied to the second power line PL2. When the switch SW is turned off, a second driving power source VSS may be applied to the second power line PL2.

In an embodiment of the present disclosure, the second power line PL2 may be electrically connected to the second electrode EL2 of the display element layer DPL through a tenth contact opening (e.g., a tenth contact hole) CH10 penetrating the protective layer PSV. Also, the second power line PL2 may be connected to a second bridge pattern BRP2 through an eleventh contact opening (e.g., a eleventh contact hole) CH11 penetrating the third interlayer insulating layer ILD3.

The second bridge pattern BRP2 may be connected to the second power line PL2 through the eleventh contact opening CH11. Also, the second bridge pattern BRP2 may be connected to the second shielding electrode line SDL2 through a fourteenth contact opening (e.g., a fourteenth contact hole) CH14 penetrating the third interlayer insulating layer ILD3. Accordingly, the second power line PL2 and the second shielding electrode line SDL2 may be connected to each other through the second bridge pattern BRP2.

The second shielding electrode line SDL2 may be connected to the first conductive line CL1 through a twentieth contact opening (e.g., a twentieth contact hole) CH20 penetrating the protective layer PSV. When viewed on a plane, the first conductive line CL1 may be disposed on the second shielding electrode line SDL2 with the protective layer PSV interposed therebetween to overlap the second shielding electrode line SDL2.

As described above, when the second shielding electrode line SDL2 and the second power line PL2 are connected to each other by the second bridge pattern BRP2, the first conductive line CL1 on the second shielding electrode line SDL2 and the second electrode EL2 on the second power line PL2 may be electrically connected to each other.

Accordingly, when the switch SW is turned on, the alignment voltage applied to the second power line PL2 may be transferred to each of the second electrode EL2 and the first conductive line CL1. In addition, when the switch SW is turned off, the second driving power source VSS applied to the second power line PL2 may be transferred to each of the second electrode EL2 and the first conductive line CL1.

Figure 14:
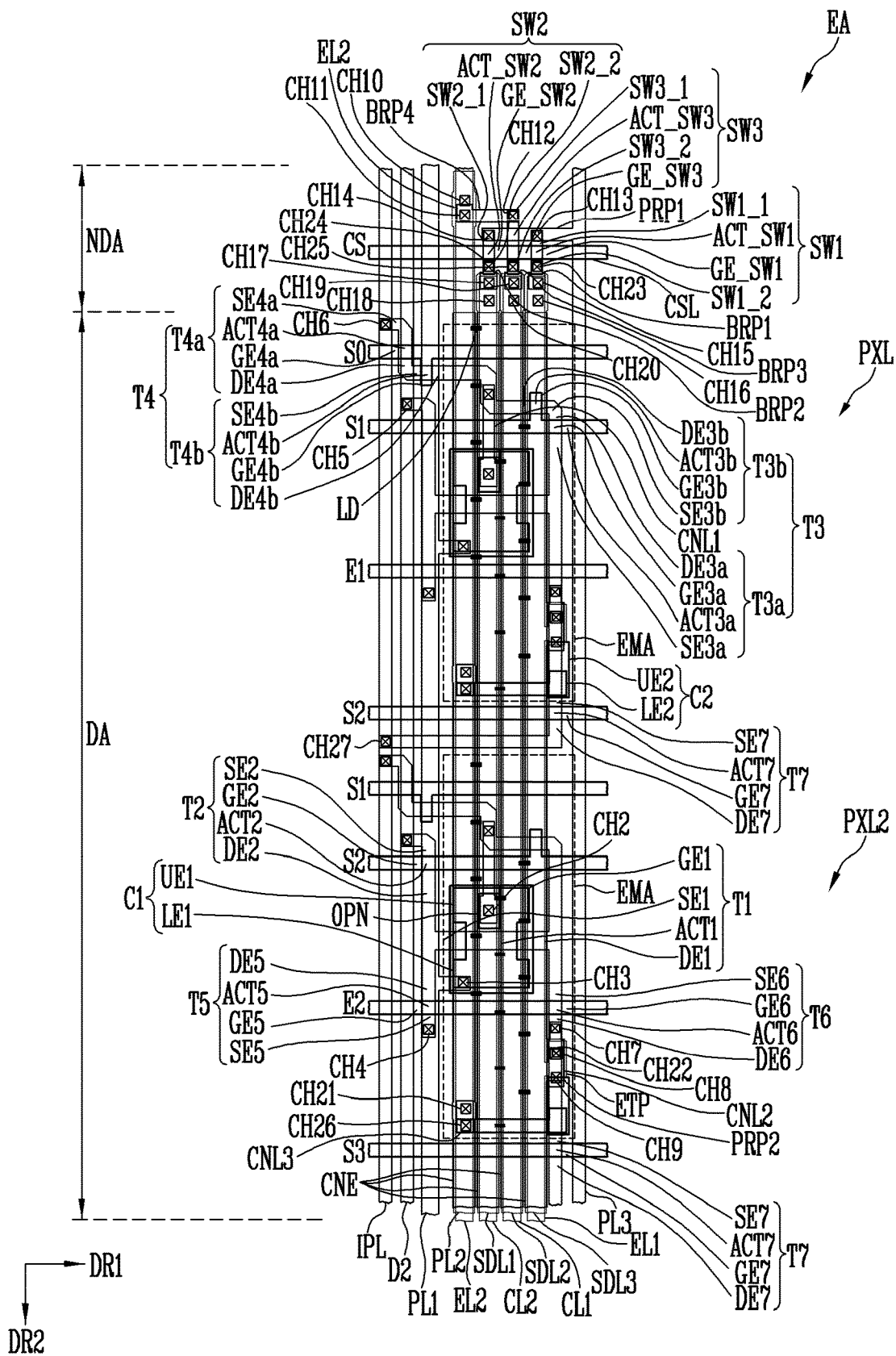
FIG. 14 is an enlarged plan view corresponding to the portion EA shown in FIG. 2, which is a view schematically illustrating an embodiment in which first to third switches are disposed in a non-display area of the display device.

FIG. 14 is an enlarged plan view corresponding to the portion EA shown in FIG. 2 and is a view schematically illustrating an embodiment in which first to third switches are disposed in the non-display area of the display device.

Each of first and second pixels shown in FIG. 14 may have a configuration identical or substantially similar to that of the pixel shown in FIG. 4.

Accordingly, with respect to the pixel shown in FIG. 14, portions different from those of the above-described embodiments will be primarily described to avoid redundancy. Portions not particularly described in this embodiment follow those of the above-described embodiments. In addition, identical reference numerals refer to identical components, and similar reference numerals refer to similar components.

For convenience of description, based on two pixels PXL1 and PXL2, which are disposed most adjacent to (e.g., directly adjacent to) the non-display area NDA in the display area of the substrate and are located on the same pixel column, scan lines S0, S1, S2, and S3, a data line Dj, emission control lines E1 and E2, first to third power lines PL1-PL3, and an initialization power line IPL, which are connected to the two pixels PXL1 and PXL2, are illustrated in FIG. 14.

In addition, in FIG. 14, for convenience of description, in the lines provided to (e.g., connected to) the two pixels PXL1 and PXL2, a scan line on a dummy row from among the scan lines S0, S1, S2, and S3 to which a scan signal is applied is referred to as a "dummy scan line S0," a scan line on a first row is referred to as a "first scan line S1," a scan line on a second row is referred to as a "second scan line S2," and a scan line on a third row is referred to as a "third scan line S3."

Also, in the lines provided to the two pixels PXL1 and PXL2, an emission control line on the first row from among the emission control lines to which an emission control signal is applied is referred to as a "first emission control line E1," and an emission control line on the second row is referred to as a "second emission control line E2."

In FIG. 14, the structure of the one pixel PXL is simplified and illustrated in which each electrode is illustrated as a single electrode layer and each insulating layer is illustrated as a single insulating layer. However, the present disclosure is not limited thereto.

Referring to FIGS. 1A, 2, and 14, the display device according to an embodiment of the present disclosure may include a substrate SUB, a line unit, and first and second pixels PXL1 and PLX2.

The first pixel PXL1 may be a pixel disposed at an intersection area of a first row and a second column in a display area DA, and the second pixel PXL may be a pixel disposed in an intersection area of a second row and the second column in the display area DA.

The line unit may provide signals to each of the first and second pixels PXL1 and PXL2 provided in the display area DA and may include scan lines S0-S3, a data line Dj, emission control lines E1 and E2, first to third power lines PL1-PL3, an initialization power line IPL, and first to third shielding electrode lines SDL1-SDL3.

The data line Dj may extend along the second direction DR2 and may be commonly provided to (e.g., commonly connected to) the first and second pixels PXL1 and PXL2, which are located on the same column. The first to third power lines PL1-PL3 may extend along the second direction DR2 and may be commonly provided to the first and second pixels PXL1 and PXL2. The initialization power line IPL may extend along the second direction DR2 and may be commonly provided to the first and second pixels PXL1 and PXL2. The first to third shielding electrode lines SDL1-SDL3 may extend along the second direction DR2 and may be commonly provided to the first and second pixels PXL1 and PXL2.

The dummy scan line S0, the first and second scan lines S1 and S2, and the first emission control line E1 from among the components included in the line unit may be provided to the first pixel PXL1. In addition, the first to third scan lines S1, S2, and S3 and the second emission control line E2 from among the components included in the line unit may be provided to the second pixel PXL2.

In an embodiment of the present disclosure, each of the first and second pixels PXL1 and PXL2 may include a display element layer DPL including light emitting elements LD and a pixel circuit layer PCL that drives the light emitting elements LD and is connected to the line unit.

The pixel circuit layer PCL may include a pixel circuit 144 for driving the light emitting elements LD aligned in a light emitting area EMA of each of the first and second pixels PXL1 and PXL2 and a protective layer PSV covering the pixel circuit 144.

The pixel circuit 144 of each of the first and second pixels PXL1 and PXL2 may include first to seventh transistors T1-T7 and first and second capacitors C1 and C2. A seventh drain electrode DE7 of the seventh transistor T7 of the first pixel PXL1 may be connected to the initialization power line IPL provided to the second pixel PXL2 through a twenty-seven contact opening (e.g., a twenty-seven contact hole) CH27 penetrating a gate insulating layer GI and first and second interlayer insulating layers ILD1 and ILD2. Accordingly, the seventh transistor T7 of the first pixel PXL1 may be electrically connected to a 4ath transistor T4a of the second pixel PXL2.

The display element layer DPL of each of the first and second pixels PXL1 and PXL2 may include light emitting elements LD, first and second electrodes EL1 and EL2, first and second conductive lines CL1 and CL2, contact electrodes CNE, and the like.

First to third switches SW1-SW3 for aligning light emitting elements LD in the light emitting area EMA of each of the first and second pixels PXL1 and PXL2 may be disposed in the non-display area NDA located at the periphery of the display area DA of the display device.

The first to third switches SW1-SW3 may be disposed in the non-display area NDA to correspond to the same column as the first and second pixels PXL1 and PXL2. The first to third switches SW1-SW3 may be electrically and/or physically connected to some of the lines commonly provided to the first and second pixels PXL1 and PXL2.

A control signal line CS may be disposed in the non-display area NDA. The control signal line CS may include a same conductive material as the scan lines S0-S3 and may be provided and/or formed on the gate insulating layer GI through the same process. Gate electrodes GE_SW1, GE_SW2, and GE_SW3 of the respective first to third switches SW1-SW3 may be connected to the control signal line CS. The first to third switches SW1-SW3 may be concurrently (e.g., simultaneously) turned on when a control signal having a voltage at which the first to third switches SW1-SW3 may be turned on is supplied from the control signal line CS.

When the first and second switches SW1 and SW2 are turned on, the third power line PL3 commonly provided to the first and second pixels PXL1 and PXL2 may be electrically connected to the first electrode EL1 and the second conductive line CL2 of each of the first and second pixels PXL1 and PXL2. Accordingly, a ground voltage GND applied to the third power line PL3 may be transferred to the first electrode EL1 and the second conductive line CL2 of each of the first and second pixels PXL1 and PXL2.

When the third switch SW3 is turned on, the second power line PL2 commonly provided to the first and second pixels PXL1 and PXL2 may be electrically connected to the second electrode EL2 and the first conductive line CL1 of each of the first and second pixels PXL1 and PXL2. Accordingly, an alignment voltage (e.g., an AC voltage) applied to the second power line PL2 may be transferred to the second electrode EL2 and the first conductive line CL1 of each of the first and second pixels PXL1 and PXL2.

As described above, when the first to third switches SW1-SW3 disposed in the non-display area NDA are concurrently (e.g., simultaneously) turned on, the ground voltage GND may be applied to the first electrode EL1, the alignment voltage may be applied to the first conductive line CL1, the ground voltage GND may be applied to the second conductive line CL2, and the alignment voltage may be applied to the second electrode EL2. Therefore, electric fields may be formed by potential differences between the first electrode EL1 and the first conductive line CL1, between the first conductive line CL1 and the second conductive line CL2, and between the second conductive line CL2 and the second electrode EL2.

The light emitting elements LD may be aligned in the light emitting area EMA of each of the first and second pixels PXL1 and PXL2 by the electric fields respectively formed between the first electrode EL1 and the first conductive line CL1, between the first conductive line CL1 and the second conductive line CL2, and between the second conductive line CL2 and the second electrode EL2.

When the alignment of the light emitting elements LD in the light emitting area EMA of each of the first and second pixels PXL1 and PXL2 is completed, a control signal having a voltage at which the first to third switches SW1-SW3 may be turned off is supplied from the control signal line CS to the first to third switches SW1-SW3 so that the first to third switches SW1 to SW3 are turned off.

As described above, in the display device according to an embodiment of the present disclosure, light emitting elements LD are aligned in the light emitting area EMA of each pixel PXL by using one or more switch(es) having the same type as the first to seventh transistors T1-T7 included in the pixel circuit 144, and the switch(es) is/are turned off after the light emitting elements LD are aligned so that each pixel PXL may be driven individually from an adjacent pixel PXL.

Accordingly, in the display device according to an embodiment of the present disclosure, a process of removing a portion of an alignment line so that each pixel PXL may be driven individually from an adjacent pixel PXL and the like is omitted, thereby simplifying the manufacturing process of the display device.

According to embodiments of the present disclosure, light emitting devices are aligned in each pixel by using an alignment unit having one or more switch(es) connected to a pixel circuit so that the manufacturing process of the display device may be simplified by omitting a separation process of a line for aligning the light emitting devices.

Further, according to embodiments of the present disclosure, the risk of a defect that may occur during the separation process of the line for aligning the light emitting devices is reduced or minimized so that the reliability of the display device may be improved.

Example embodiments of the present disclosure have been disclosed herein, and although specific terms are employed, they are used and are to be interpreted in a generic and descriptive sense and not for purpose of limitation. In some instances, as would be apparent to one of ordinary skill in the art at the time of filing of the present application, features, characteristics, and/or elements described in connection with one embodiment may be used singly or in combination with features, characteristics, and/ or elements described in connection with other embodiments unless otherwise specifically indicated. Accordingly, it will be understood by those of skill in the art that various changes in form and details may be made to the described embodiments without departing from the spirit and scope of the present disclosure as set forth in the following claims and their equivalents.

What is claimed is:

1. A display device comprising:
   a substrate comprising a pixel;
   a scan line for supplying a scan signal to the pixel;
   a data line for supplying a data signal to the pixel;
   a first power line for supplying a first driving power source to the pixel;
   a second power line for supplying a second driving power source to the pixel; and
   a third power line for supplying a ground voltage to the pixel,
   wherein the pixel comprises:
      first and second electrodes spaced apart from each other on the substrate;
      a plurality of light emitting elements, each of the light emitting elements having first and second end portions in a length direction thereof and being arranged between the first electrode and the second electrode; and
      a first switch electrically connected between the third power line and the first electrode, the first switch configured to be turned on by a control signal.

2. The display device of claim 1, wherein the pixel further comprises first and second conductive lines on the same plane as the first and second electrodes, the first and second conductive lines being spaced apart from each other, and
   wherein, when viewed on a plane, the first conductive line and the second conductive line are between the first electrode and the second electrode.

3. The display device of claim 2, wherein, when the first switch is turned on, an AC voltage having a level different from that of the second driving power source is applied to the second electrode.

4. The display device of claim 3, wherein the pixel further comprises:
   a control signal line configured to have the control signal applied thereto;
   a second switch connected between the first conductive line and the third power line, the second switch configured to be turned on concurrently with the first switch by the control signal; and
   a third switch connected between the second conductive line and the second power line, the third switch configured to be turned on concurrently with the first switch by the control signal.

5. The display device of claim 4, wherein the first conductive line and the second conductive line are floating electrodes.

6. The display device of claim 5, wherein the control signal line is in the same layer as the scan line.

7. The display device of claim 6, wherein each of the first, second, and third switches comprises a thin film transistor.

8. The display device of claim 7, wherein each of the first, second, and third switches comprises:
   a gate electrode on the substrate, the gate electrode being integral with the control signal line;
   an active pattern overlapping one region of the gate electrode; and first and second terminals contacting both ends of the active pattern.

9. The display device of claim 8, wherein the pixel further comprises a pixel circuit connected between the first power line and the first electrode or between the second power line and the second electrode, and
wherein the pixel circuit comprises a driving transistor for driving the light emitting elements and a switching transistor connected between the data line and the driving transistor.

10. The display device of claim 9, wherein the driving transistor and the switching transistor comprise a transistor having the same type as the first, second, and third switches.

11. The display device of claim 10, wherein, when the first, second, and third switches are concurrently turned on, the ground voltage is supplied to the first electrode and the AC voltage is applied to the second electrode such that an electric field is formed between the first electrode and the second electrode.

12. The display device of claim 10, wherein, when the first, second, and third switches are concurrently turned off, the first driving power source is applied to the first electrode via the pixel circuit and the second driving power source is applied to the second electrode.

13. The display device of claim 10, wherein the pixel circuit further comprises:
a first capacitor connected between a gate electrode of the driving transistor and the first power line; and
a second capacitor connected between the first electrode and the second power line.

14. The display device of claim 13, wherein the first capacitor comprises:
a first lower electrode on the substrate;
a first upper electrode on the first lower electrode; and an interlayer insulating layer interposed between the first lower electrode and the first upper electrode,
wherein the second capacitor comprises:
a second lower electrode in the same layer as the first lower electrode;
a second upper electrode on the second lower electrode; and
the interlayer insulating layer interposed between the second lower electrode and the second upper electrode, and
wherein the first upper electrode and the second upper electrode are in the same layer.

15. The display device of claim 14, wherein the first conductive line is electrically connected to the first electrode through a first bridge pattern, and
wherein the second conductive line is electrically connected to the second electrode through a second bridge pattern spaced apart from the first bridge pattern.

16. The display device of claim 15, wherein the first bridge pattern and the second bridge pattern are in the same layer as the data line.

17. The display device of claim 16, wherein, when the first switch is turned on, the ground voltage is applied to each of the first conductive line and the first electrode and the AC voltage is applied to each of the second conductive line and the second electrode such that an electric field is formed between the first electrode and the second electrode.

18. The display device of claim 17, wherein the pixel further comprises:
a first shielding electrode line between the first electrode and the interlayer insulating layer;
a second shielding electrode line between the first conductive line and the interlayer insulating layer; and
a third shielding electrode line between the second conductive line and the interlayer insulating layer.

19. A display device of claim 1, comprising:
a substrate comprising a pixel;
a scan line for supplying a scan signal to the pixel;
a data line for supplying a data signal to the pixel;
a first power line for supplying a first driving power source to the pixel;
a second power line for supplying a second driving power source to the pixel; and
a third power line for supplying a ground voltage to the pixel,
wherein the pixel comprises:
first and second electrodes spaced apart from each other on the substrate;
a plurality of light emitting elements, each of the light emitting elements having first and second end portions in a length direction thereof and being arranged between the first electrode and the second electrode;
a first switch electrically connected between the third power line and the first electrode, the first switch configured to be turned on by a control signal;
a first contact electrode electrically connecting any one of the first and second end portions of each of the light emitting elements to the first electrode; and
a second contact electrode electrically connecting the other of the first and second end portions of each of the light emitting elements to the second electrode.

* * * * *